United States Patent
Lu et al.

(10) Patent No.: US 11,621,689 B2
(45) Date of Patent: Apr. 4, 2023

(54) LOW-LOSS AND WIDE-BAND ACOUSTIC DELAY LINES USING Z-CUT LITHIUM NIOBATE PIEZOELECTRIC THIN FILMS

(71) Applicant: Board of Trustees of the University of Illinois, Urbana, IL (US)

(72) Inventors: Ruochen Lu, Champaign, IL (US); Tomas Manzaneque Garcia, Voorburg (NL); Yansong Yang, Urbana, IL (US); Songbin Gong, Champaign, IL (US)

(73) Assignee: The Board of Trustees of the University of Illlinois, Urbana, IL (US)

( * ) Notice: Subject to any disclaimer, the term of this patent is extended or adjusted under 35 U.S.C. 154(b) by 224 days.

(21) Appl. No.: 17/073,083

(22) Filed: Oct. 16, 2020

(65) Prior Publication Data
US 2021/0119601 A1    Apr. 22, 2021

Related U.S. Application Data

(60) Provisional application No. 62/923,213, filed on Oct. 18, 2019.

(51) Int. Cl.
*H03H 9/02* (2006.01)
*H03H 9/25* (2006.01)
(Continued)

(52) U.S. Cl.
CPC .... *H03H 9/02228* (2013.01); *H03H 9/02543* (2013.01); *H03H 9/02559* (2013.01);
(Continued)

(58) Field of Classification Search
CPC ........... H03H 9/02228; H03H 9/02543; H03H 9/02559; H03H 9/02574; H03H 9/02637;
(Continued)

(56) References Cited

U.S. PATENT DOCUMENTS 5,532,538 A * 7/1996 Jin ........................... G01H 1/04
                                                          310/313 R
6,924,715 B2   8/2005 Beaudin et al.
(Continued)

FOREIGN PATENT DOCUMENTS

| CN | 101742738 | 6/2010 |
|----|-----------|--------|
| JP | 6193035 B2 | 9/2017 |
| JP | 2017216705 A | 12/2017 |

OTHER PUBLICATIONS

Parkvall, S. et al., "NR: The new 5G Radio Access Technology," IEEE Commun. Stand. Mag., vol. 1, No. 4, pp. 24-30, 2017.
(Continued)

*Primary Examiner* — Rakesh B Patel
*Assistant Examiner* — Jorge L Salazar, Jr.
(74) *Attorney, Agent, or Firm* — Lowenstein Sandler LLP

(57) ABSTRACT

A piezoelectric thin film (PTF) is located above a carrier substrate. The PTF may be Z-cut LiNbO$_3$ thin film adapted to propagate an acoustic wave in at least one of a first mode excited by an electric field oriented in a longitudinal direction along a length of the PTF or a second mode excited by the electric field oriented at least partially in a thickness direction of the PTF. A first interdigitated transducer (IDT) is disposed on a first end of the PTF. The first IDT is to convert a first electromagnetic signal, traveling in the longitudinal direction, into the acoustic wave. A second IDT is disposed on a second end of the PTF with a gap between the second IDT and the first IDT. The second IDT is to convert the acoustic wave into a second electromagnetic signal, and the gap determines a time delay of the acoustic wave.

21 Claims, 42 Drawing Sheets

(51) Int. Cl.
H03H 9/72 (2006.01)
H03H 9/145 (2006.01)
H04L 5/14 (2006.01)

(52) U.S. Cl.
CPC .... H03H 9/02574 (2013.01); H03H 9/02637 (2013.01); H03H 9/02842 (2013.01); H03H 9/145 (2013.01); H03H 9/14505 (2013.01); H03H 9/14511 (2013.01); H03H 9/25 (2013.01); H03H 9/725 (2013.01); H04L 5/1461 (2013.01)

(58) Field of Classification Search
CPC ............... H03H 9/02842; H03H 9/145; H03H 9/14505; H03H 9/14511; H03H 9/25; H03H 9/725; H03H 2003/023; H03H 3/02; H03H 9/02015; H03H 9/175; H03H 9/36; H03H 9/706; H04L 5/1461
USPC .......................................... 333/133, 193–196
See application file for complete search history.

(56) References Cited

U.S. PATENT DOCUMENTS

| | | | |
|---|---|---|---|
| 6,963,257 B2 | 11/2005 | Ella et al. | |
| 2015/0078217 A1* | 3/2015 | Choi | H04B 1/525 370/278 |
| 2020/0106420 A1* | 4/2020 | Kodama | H03H 9/131 |

OTHER PUBLICATIONS

Pijolat, M. et al., "Large Qxf Product for HBAR using Smart Cut™ Transfer of LiNbO 3 Thin Layers onto LiNbO 3 Substrate," Ultrasonics Symposium, 2008, IUS 2008, IEEE, 2008, pp. 201-204.
Plessky, V. et al., "5 GHz Laterally-Excited Bulk-wave Resonators (XBARs) Based on thin Platelets of Lithium Niobate," Electron. Lett. vol. 55, No. 2, pp. 98-100, 2018.
Pohl, A., "A Review of Wireless SAW Sensors," IEEE Trans. Ultrason., Ferroelectr., Freq. Control, vol. 47, No. 2, pp. 317-332, Mar. 2000.
Popovski, P. et al., "5G Wireless Network Slicing eMBB, URLLC, and mMTC: A Communication-Theoretic View," IEEE Access, vo.. 6, pp. 55765-55779, 2018.
Reible, S.A. et al., "Convolvers for DPSK Demodulation of Spread Spectrum Signals," 1976 Ultrasonics Symposium, 1976, pp. 451-455.
Reindl, L, et al., "Design Fabrication, and Application of Precise SAW Delay Lines Used in a FMCW Radar System," IEEE Trans. Microw. Theory Tech., vol. 49, No. 4, pp. 787-794, Apr. 2001.
Rosenfeld, R.C. et al., "Unidirectional Acoustic Surface Wave Filters with 2 dB Insertion Loss," in 1974 Ultrasonics Symposium, 1974, pp. 425-428.
Ruby, R. et al., "Acoustic FBAR for Filters, Duplexers, and Front-End Modules," Microwave Symposium Digest, 2004, IEEE MTT-S International, 2004, vol. 2, pp. 931-934.
Ruby, R., "A Snapshot in Time: The Future in Filters for Cell Phones," IEEE Microw. Mag., vol. 16, No. 7, pp. 46-59, 2015.
Ruby, R.C., et al., "Thin Film Bulk Wave Acoustic Resonators (FBAR) for Wireless Applications," 2001 IEEE Ultrasonic Symposium, Proceedings, An International Symposium (Cat No. 01CH37263), Oct. 2001, vol. 1, pp. 813-821.
Sarabalis, C.J. et al., "The Role of Resonance and Bandgaps in High Keff2 Transducers," arXiv Prepr. arXiv1904.04981, 2019.
Scherr, H. et al., "Quartz Pressure Sensor Based on SAW Reflective Deay Line," IUS 1996, pp. 347-350.
Shreve, W.R., et al., "Reduced Insertion-Loss Broadband SAW Delay Lines," in IEEE 1987 Ultrasonics Symposium, 1987, pp. 155-160.

Siddiqui, A. et al., "Lamb Wave Focusing Transducer for Efficient Coupling ot Wavelength-Scale Structures in Thin Piezoelectric Films," J. Microelectromech. Syst., vol. 27, No. 6, pp. 1054-1070, Dec. 2018.
Smith, W.R. et al., "Analysis and Design of Dispersive Interdigital Surface-Wave Transducers," IEEE Trans. Microw Theory Tech., vol. 20, No. 7, pp. 458-471, 1972.
Song, Y.H. et al., "Analysis and Removal of Spurious Response in SH0 Lithium Niobate MEMS Resonators," IEEE Trans., Electron Devices, vol. 63, No. 5, pp. 2066-2073. May 2016.
Song, Y.H. et al., "Eliminations of Spurious Modes in SH0 Lithium Niobate Laterally Vibrating Resonators," IEEE Electron Devices Lett., vol. 36, No. 11, pp. 1198-1201, 2015.
Sotnikov, A.V. et al., "Elastic and Piezoelectric Properties of AlN and LiAlO2 Signle Cyrstals," IEEE Trans. Ultrason., Ferreolectr. Freq. Control, vol. 57, No. 4, pp. 808-811, Apr. 2010.
Takai, T. et al., "High-Performance SAW Resonator on New Multilayered Substrate Using LiTaO 3 Crystal," IEEE Trans.. Ultrason. Ferroelectr. Freq. Control, vol. 64, No. 9, pp. 1382-1389, Sep. 2017.
Tancrell, R.H. et al., "Acoustic Surface Wave Filters," Proc. IEEE, vol. 59, No. 3, pp. 393-409, Jan. 1971.
Uehara, K. et al., "Fabrication of 5-GHz-Band SAW Filter with Atomically-Flat-Surface AlN on Sapphire," in IEEE Ultrasonics Symposium, 2004, 2004, vol. 1, pp. 203-206.
Vecchi, F. et al., "Deisgn of Low-Loss Transmission Lines in Scaled CMOS by Accurate Electromagnetic Simulations," IEEE J Solid-State Circuits, vol. 44, No. 9, pp. 2605-2615, Sep. 2009.
Ventura et al., "A new concept in SPUDT Design: The RSPUDT (resonant SPUDT)," in Proceeding of IEEE Ultrasonics Symposium ULTSYM-94, 1994, vol. 1, pp. 1-6.
Vidal-Alvarez, G. et al., "Delay Lines Based on a Suspended Thin Film of X-Cut Lithium Niobate," in Ultrasonics Symposium (IUS), 2017 IEEE 2017.
Wang, L. et al., "Group Velocity and Characteristic Wave Curves of Lamb waves in Composites: Modeling and Experiments," Comps. Sci. Technol. vol. 67, No. 7-8, pp. 1370-1384, 2007.
Wang, R. et al., "Design and Fabriction of S0 Lamb-Wave Thin-Film Lithium Niobate Micromechanical Resonators," J. Microelectromech. Syst., vol. 24, No. 2, pp. 300-308, Apr. 2015.
Wang, R. et al., "Multi-Frequency LiNbO3 Lamb Wave Resonators with < 3Ω Impedance," in Proc. IEEE 29th Int. Conf. Micro Eelctro Mech. Syst. (MEMS), Jan. 2016, pp. 679-682.
Wang, R. et al., "Thin-Film Lithium Niobate Contour-Mode Resonators," in Proc. IEEE Int. Ultrason. Symp., Oct. 2012, pp. 303-306.
Warder, P. et al., "Golden Age for Filter Design: Innovative and Proven Approaches for Acoustic Filter, Duplexer, and Multiplexer Design," IEEE Mircow. Mag., vol. 16, No. 7, pp. 60-72, 2015.
Warner, A.W. et al., Determination of Elastic and Piezoeletric Constants for Crystals in Class (3 m), J. Accounts. Soc. Am, vol. 42, No. 6, pp. 1223-1231, 1967.
Weigel, R. et al., "Microwave Acoustic Materials, Devices, and Applications," IEEE Trans Microw. Theory Tech., vol. 50, No. 3, pp. 738-749, Mar. 2002.
Weis, R.S. et al., "Lithium Niobate Summary of Physical Properties and Crystal Structure," Appl. Physs. A, vol. 37, No. 4, pp. 191-203, 1985.
Wright, P.V., "The Natural Single-Phase Unidirectional Transducer: A New Low-Loss WAS Transducer," in IEEE 1985 Ultrasonics Symposium, 1985, pp. 58-63.
Wu, X. et al., "The Power Delay Profile of the Single-Antenna, Full-Duplex Self-Interference Channel in Indoor Environments at 2.6 GHz," IEEE Antennas Wireless Progag. Lett., vol. 13, pp. 1561-1564, 2014.
Yamanouchi, K. et al., "Low-Loss SAW Filter Using Internal Reflection Types of Single-Phase Unidirectional Transducer," Electron, Lett., vol. 20, No. 20, p. 819, 1984.
Yang, Y. et al., "1.7 GHz Y-Cut Lithium Niobate MEMS Resonators with FoM of 336 and fQ of 9. 15x1012," 2018 IEEE/ MTT-S International Microwave Symposium, pp. 563-566 (2018).
Yang, Y. et al., "4.5 GHz Lithium Niobate MEMS filters with 10% Fractional Bandwith for 5G Front-Ends," J. Microelectromechanical Syst., 2019.

(56) References Cited

OTHER PUBLICATIONS

Yang, Y. et al., "5 GHz Lithium Niobate MEMS Resonators with High FoM of 153, in IEEE 30th International Confernce on Micro Electro Mechanical Systems", 2017, 2017, pp. 942-945.
Yang, Y. et al., "Toward Ka Band Acoustics: Lithium Niobate Asymmetrical Mode Piezoelectric MEMS Resonators," in Proc. IEEE Int. Freq. Control Symp. (IFCS), May 2018, pp. 1-5.
York, D., "Least-Squares Fitting of a Straight Line," Can. J. Phys. vol. 44, No. 5, pp. 1079-1086, 1966.
Yu, P.L. et al., "Acoustic Delay Lines to Measure Piezoelectricity in 4H Silicon Carbide," 2017 Joint Conference of the European Frequency and Time Forum and IEEE International Frequency Control Symposium (EFTF/IFCS), 2017, pp. 139-142.
Zhang, Z. et al., "Full Duplex Techniques for 5G Networks: Self-Interference Cancellation, Protocol Deisgn, and Relay Selection," IEEE Commun. Mag., vol. 53, No. 5, pp. 128-137, May 2015.
Zhou, J. et al., "Integrated Full Duplex Radios," IEEE Commun. Mag., vol. 55, No. 4, pp. 142-151, Apr. 2017.
Zhou, J. et al., "Integrated Wideband Self-Interference Cancellation in the RF domain for FDD and Full-Duplex Wireless," IEEE J. Solid State Circuits, vol. 50 No. 12, pp. 3015-3031, Dec. 2015.
Zhu, H. et al., "Switchable Lamb Wave Delay Lines Using AlGaN/ GaN Heterostructure," 2017 19th International Conference on Solid-State Sensors, Actuators, and Microsystems (Transducers), 2017, vol. 2, No. II, pp. 179-182.
Zhu, Y. et al., "A High Coupling Coefficient 2.3-GHz AlN Resonator for High Band LTE Filtering Application," IEEE Electron Device Lett., vol. 37, No. 10, pp. 1344-1346, Oct. 2016.
Akiyama, M.et al., "Enhancement of Piezoelectric Response in Scandium Aluminum Nitride Alloy Thin Films Prepared by Dual Reactive Cosputtering," Adv. Mater., vol. 21, No. 5, pp. 593-596, 2009.
Anand, A. et al., "Joint Scheduling of URLLC and eMBB Traffic in 5G Wireless Networks," IEEE Infocomm 2018-IEEE Conference on Computer Communications, 2018, pp. 1970-1978.
Ansari, A. et al., "Gallium Nitride High-Order Mode Lamb-Wave Resonators and Delay-Lines," Proc. Solid-State Sens. Actuators Microsyst. Workshop, Jun. 2016, pp. 1-2.
Bajak, I.L. et al., "Attenuation of Acoustic Waves in Lithium Niobate," J. Acoust. Soc. AM., vol. 69, No. 3, pp. 689-695, 1981.
Barlow, E. J., "Doppler Radar," Proc. IRE, vol. 37, No. 4, pp. 340-355, Apr. 1949.
Bartasyte, A. et al., "Toward High-Quality Epitaxial LiNbO3 and LiTaO3 Thin Films for Acoustic and Optical Applications," Adv. Mater. Interfaces, vol. 4, No. 8, p. 1600998, 2017.
Benoit, R.R. et al., "Advances in Piezoeletric PZT-based RF MEMS Advances, Piezoelectric PZT-Based RF MEMS Components and Systems," 2017.
Bharadia, D. et al., "Full Duplex Radios," ACM SIGCOMM Computer Communication Review, 2013, vol. 43, No. 4, pp. 375-386, Oct. 2013.
Bi, F.Z. et al., "A Fast Algorithm of Designing Mininmum Phase Transducer and its Application to SPUDT Filter Design," Proc. IEEE Symp. Ultrason., Oct. 2003, pp. 522-525.
Biedka, M.M. et al., "Ultra-Wide Band Non-Reciprocity through Sequentially-Switched Dealy Lines," Sci Rep., vol. 7, No. January, p. 40014, Jan. 2017.
Biot, M.A., "General Theorems on the Equivalence of Group Velocity and Energy Transport," Phys. Rev., vol. 105, No. 4, p. 1129, Feb. 1957.
Blomley P.F. et al., "A S.A.W. Frequency Discriminator," 1973 Ultrasonics Symposium, 1973, pp. 468-471.
Brown, M.A.C.S. et al., "Use of a Surface-Acoustic-Wave Delay Line to provide Pseudocoherence in a Clutter-Reference Pulse Doppler Radar," Electron Lett., vol. 9, No. 2, p. 17, 1973.
Brown, R.B., "Electrical Matching of Unidirectional Surface Wave Devices," MTT-S International Microwave Symposium Digest, vol. 75, No. 0, pp. 359-361.

Cassella, C. et al., "Aluminum Nitride Cross-Sectional Lame Mode Resonators," J. Microelectromechanical Syst. vol. 25, No. 2, pp. 275-285, 2016.
Chen, D-P. et al., "Analysis of Metal-Strip SAW Gratings and Transducers," IEEE Transs. Sonic Ultrason., vol. 32, No. 3, pp. 395-408, May 1985.
Chvets, V.B. et al., "Low-Loss SAW Filters Using new SPUDT Structures," 1997 IEE Ultrasonics Symposium Proceeding, An International Symposium Cat No. 97CH36118), 1997, vol. 1, pp. 69-72.
Ciplys, D. et al., "GaN-Based SAW Delay-line Oscillator," Electron. Lett., vol. 37, No. 8, pp. 546-546, Apr. 2001.
Collins, J.H. et al., "Unidirectional Surface Wave Transducer," Proc. IEEE, vol. 57, No. 5, pp. 833-835, 1969.
Colombo, L. et al., "Investigation of 20% Scandium-Doped Aluminum Nitride Films for MEMS Laterally Vibrating Resonators," in Ultrasonics Symposium (IUS), 2017 IEEE, 2017.
Colombo, L. et al., "X-Cut Lithium Niobate Laterally Vibrating MEMS Resonator With Figure of Merit of 1560," J. Microelectromechanical Syst., vol. 27, No. 4, pp. 602-604, Aug. 2018.
Commission, F.C., "FCC Online Table of Frequency Allocations," Online: [https://transition.fcc.gov/oet/spectrum/table/fcctable.pdf], Revised on Oct. 9, 2020.
Crespin, E.R. et al., "Fully Integrated Swithchable Filter Banks," IEEE/MTT-S Int. Microw. Symp. Dig., Jun. 2012, pp. 1-3.
Datta, S. et al., "An Analytical Theory for the Scattering of Surface Acoustic Waves by a Single Electrode in a Periodic Array on a Piezoelectric Substrate," Journal of Applied Physics, vol. 51, No. 9, 1980.
Demma, A. et al., "Scattering of the Fundamental Shear Horizontal Mode from Steps and Notches in Plates," J. Acoust. Soc. Am., vol. 113, No. 4, pp. 1880-1891, Apr. 2003.
Devkota, J. et al., "SAW Sensors for Chemical Vapors and Gases," Sensors, vol. 17, No. 4, p. 801, 2017.
Didenko, I.S. et al., "The Experimental and Theoretical Characterization of the SAW Propagation Properties for Zinc Oxide Films on Silicon Carbide," IEEE Trans. Ultrason. Ferroelectr., Freq. Control, vol. 47, No. 1, pp. 179-187, Jan. 2000.
Dinc, T. et al., "Synchronized Conductivity Modulation to Realize Broadband Lossless Magnetic-Free Non-Reciprocity," Nat Commun., vol. 8, No. 1, pp. 1-9, 2017.
Fang, G.W. et al., "A VHF Temperature Compensated Lithium Niobate-on-Oxide Resonator with Q> 3900 for Low Phase Noise Oscillators," Micro Electro Mechanical Systems (MEMS), 2018 IEE, 2018, pp. 723-726.
Feigelson, R., "Physicsand Chemistry of Crystalline Lithium Niobate," Science, vol. 251, No. 5000, pp. 1510-1511, 1991.
Ghosh, S. et al., "SAW Correlators in LiNbO 3 and GaN on Sapphire," 2018 IEEE International Frequency Control Symposium (IFCS), 2018, pp. 1-4.
Ghosh, S., "Nonreciprocal Accoustoelectric Interaction of Surface Waves and Fluorine Plasma-Treated AlGan/GaN2DEG," 2017 19th International Conference on Solid-State Sensors, Actuators and Microsystems (Transducers), 2017, pp. 1939-1942.
Gong, S. et al., "Design and Analysis of Lithium-Niobate-Based High Electromechanical Coupling RF-MEMS Resonators for Wideband Filtering," IEEE Trans. Microw. Theory Tech., vol. 61, No. 1, pp. 403-414, Jan. 2013.
Gong, S. et al., "High Electromechanical Coupling MEMS Resonators at 530 MHz using Ion Sliced X-Cut LiNbO3 Thin Film," IEEE MTT-S Int. Microw. Sump. Dig. No. August, pp. 29-32. 2012.
Gong, S. et al., "Monolithic Multi-Frequency Wideband RF Filters Using Two-Port Laterally Vibrating Lithium Niobate MEMS Resonators," J. Microelectromechanical Syst., vol. 23, No. 5, pp. 1188-1197, Oct. 2014.
Goto, M. et al., "Power Flow Angles for Slanted Finger Surface Acoustic Wave Filters on Langasite Substrate," Jpn. J. Appl. Phys., vol. 46, No. 7, p. 4744, 2007.
Grasse, C.L. et al., "Acoustic Surface Wave Dispersive Delay Lines as High-Resoultion Frequency Discriminator," 1972 Ultrasonics Symposium, 1972, vol. 24, pp. 233-236.

(56) References Cited

OTHER PUBLICATIONS

Gubbi, J. et al., "Internet of Things (IoT): A Vision, Architectural Elements, and Future Directions," Futtur. Gener. Comput. Syst., vol. 2, No. 7, pp. 1645-1660, 2013.
Guo, X. et al., "A Miniaturized Reconfigurable Broadband Attenuator Based on RF MEMS Switches," J. Micromech. Microeng., vol. 26, No. 7, p. 74002, May 2016.
Hackett, L. et al., "High-Gain Leaky Surface Acoustic Wave Amplifier in Epitaxial InGaAs on Lithium Niobate Heterostructure," Appl. Phys. Lett., vol. 114, No. 25, p. 253503, Jun. 2019.
Hartmann, C.S. et al., "An Analysis of SAW Interdigital Transducers with Internal Reflections and the Application to the Design of Single-Phase Uniderctional Transducers," 1982 Proc. Ultrasonic Symposium, Oct. 1982, pp. 40-45.
Hartmann, C.S. et al., "Improved Accuracy for Determining SAW Transducer Capacitance and K2," Proc. IEEE Ultrason. Symp., Oct. 1987, pp. 161-167.
Hartmann, C.S. et al., "Overview of Design Challenges for Single Phase Unidirectional SAW Filters," Proceeding, IEEE Ultrasonic Symposium, 1989, Date of Conference Oct. 3-6, 1989, pp. 79-89.
Hartmann, C.S. et al., "Wideband Unidirectional Interdigtial Surface Wave Transducers," IEEE Trans. Sonic Ultrason, vol. 19, No. 3, pp. 378-381, Jul. 1972.
Hickernell, F.S., "Thin-Films for SAW Devices," Int. J. High Speed Electron. Syst., vol. 10, No. 03, pp. 603-652, Sep. 2000.
Hode, J.M., et al., "SPUDT-Based Filters: Design Principles and Optimization," Proc. IEEE Int. Symp. Ultrason, vol. 1, Nov. 1995, pp. 39-50.
Hong, S. et al., "Application of Self-Interference Canellation in 5G and Beyond," IEEE Commun. Mag., vol. 52, No. 2, pp. 114-121, Feb. 2014.
Hossain, E. et al., "Evolution Toward 5G Multi-Tier Cellular Wireless Networks: An Interference Management Perspective," IEEE Wirel. Commu., vol. 21, No. 3, pp. 118-127, 2014.
IEEE Standard on Piezoelectricity, IEEE Standard 176-1987, New York, NY, USA, 1987.
Joshi, S.G. et al., "Propagation of Ultrasonic Lamb Waves in Piezoelectric Plates," J. Appl. Phys., vol. 70, No. 8, pp. 4113-4120, 1991.
Jyoumura, S. et al., "SAW Propagation Loss Mechanism in Piezoelectric Ceramics," J. Appl. Phys., vol. 52, No. 7, pp. 4472-4478, 1981.
Kadota, M. et al., "High-Frequency Lamb Wave Device Composed of MEMS Structure Using LiNbO3 Thin Film and Air Gap," IEEE Trans. Ultrason. Ferroelectr. Freq. Control, vol. 57, No. 11, pp. 2564-2571, Nov. 2010.
Kadota, M. et al., "Suprious-Free, Near-Zero-TCF Hetero Acoustic Layer (HAL) SAW Resonators Using LiTaO 3 Thin Plate on Quartz," 2018 IEEE Inernational Ultrasonics Symposium (IUS), 2018, pp. 1-4.
Kadota, M. et al., "Wideband Acoustic Wave Resonators Composed of Hetero Acoustic Layer Structure," Jpn. J. Appl. Phys., vol. 57, No. 7S1, p. 07LD12, 2018.
Kallmann, H.E., "Transversal Filters," Proc. IRE, vol. 28, No. 7, pp. 302-310, Jul. 1940.
Kao, H-S. et al., "A Delay-Line-Based GFSK Demodulator for Low-IF Receivers," 2007 IEEE International Solid-State Circiuts Conference Digest of Technical Papers, 2007, pp. 88-589.
Kodama, T. et al., "Design of Low-Loss Saw Filters Employing Distributed Acoustic Reflection Transducers," Electron. Commun. Japan (Part II Electron., vol. 70, No. 9, pp. 32-44, 1987.
Koshiba, M. et al., "Finite-Element Solutions of Horizontally Polarized Shear Wave Scattering in an Elastic Plate," IEEE Trans. Ultrason. Ferroelectr. Freq. Control, vol. 34, No. pp. 461-466, 1987.
Kosinski, J.A., "Effects fo Non-Uniform Distribution of Motion on Determinations of Piezoelectric Coupling and Constants Using IEEE 176-1987," IEEE Ultrasonics Symposium pp. 537-540, 1993.
Kuo, N. et al., "Ultra High Frequency Phononic Crystal in Silicon Carbide," Proc. 16th Int. Solid-State Sens., Actuators Microsyst. Conf., Jun. 2011, pp. 2486-2489.

Kuo, N-K. et al., "Microscale Inverse Acoustic Band Gap Structure in Aluminum Nitride," Appl. Phys. Letter., vol. 95, 9, 2009, Art. No. 093501.
Kuo, N-K. et al., "X-Shaped Phononic Crystals for Side Lobe Reducation in Ultra High-Frequency Slanted Finger Inter-Digitated Aluminum Nitride Lamb Wave Transducers," 2012 IEEE International Ultrasonics Sympoium, 2012, pp. 1145-1148.
Kuznetova, I.E. et al., "The Power Flow Angle of Acoustic Waves in Thin Piezoelectric Plates," IEEE Trans. Ultrason., Ferroelectr Freq. Control, vol. 55, No. 9, pp. 1984-1991, Sep. 2008.
Kuznetsova, I.E. et al., "Investigation of Acoustic Waves in Thin Plates of Lithium Niobate and Lithium Tantalate," IEEE Trans. Ultrason. Ferroelectr. Freq. Control, vol. 48, No. 1, pp. 322-328, Jan. 2001.
Lakin, K.M., "Electrode Resistance Effects in Interdigital Transducers," IEEE Trans. Microw. Theory Tech., vol. 22, No. 4, pp. 418-424, 1974.
Lam, C.S. et al., "A Low-Loss SAW Filter Using Two-Finger per Wavelength Electrodes on the NSPUDT Orientation of Quartz," Proc. IEEE Ultrason. Symp., Oct./Nov. 1993, pp. 185-188.
Lee, B. et al. "Relected Self-Interference Channel Measurement for mmWave Beamformed Full-Duplex System," in Proc IEEE Globecom Workshop (GC Wkshps), Dec. 2015, pp. 1-6.
Lee, M.T.C et al., Power Analysis and Minimization Techniques for Embedded DSP Software, IEEE Trans. Very Large Scale Integr. Syst., vol. 5, No. 1, pp. 123-135, 1997.
Lehtonen, S. et al., "SPUDT Filters for the 2.45 GHz ISM Band," IEEE Trans. Ultrason, Ferroelectr. Freq. Control, vol. 51, No. 12, pp. 1697-1703, Dec. 2004.
Levy, M. et al., "Fabrication of Single-Crystal Lithium Niobate Films by Crystal Ion Slicing," Appl. Phys. Lett., vol. 73, No. 16, pp. 2293-2295. 1998.
Lien, S.Y. et al., "5G New Radio: Waveform, Frame Structure, Multiple Access, and Initial Access," IEEE Commun. Mag., vol. 55, No. 6, pp. 64-71, 2017.
Liu, D. et al., "On the Analog Self-Interference Cancellation for Full-Duplex Communications with Imperfect Channel State Information," IEEE Access, vol. 5, pp. 99277-99290, 2017.
Liu, Q. et al., "Electromechanical Brillouin Scattering in Integrated Optomechanical Waveguides," Optica, vol. 6, No. 6, pp. 778-785, 2019.
Lu, R. et al., "A Frequency Independent Framework for Synthesis of Programmable Non-Reciprocal Networks," Sci. Rep., vol. 8, Oct. 2018, Art. No. 14655, 8:14655, DOI:10.1038/s441598-0318-32898-x.
Lu, R. et al., "A Radio Frequency Non-Reciprocal Network Based on Switched Low-Loss Acoustic Delay Lines," arXiv Prepr. Arxiv1801.03814, 2018.
Lu, R. et al., "A Radio Frequency Nonreciprocal Network based on Swithched Acoustic Delay Lines," IEEE Trans. Microw., Theory Tehcn., vol. 67, No. 4, pp. 1516-1530, Apr. 2019.
Lu, R. et al., "Aluminum Nitride Lamb Wave Delay Lines with Sub-6 dB Insertion Loss," J. Microelectromechanical Syst., No. 99, pp. 569-571, 2019.
Lu, R. et al., "Exploiting Parallelism in Resonators for Large Voltage Gain in Low Power Wake up Radio Front Ends," Proceedings of the IEEE International Conference on Micro Electro Mechanical Systems (MEMS), Jan. 2018 pp. 747-750.
Lu, R. et al., "GHz Broadband SH0 Mode Lithium Niobate Acoustic Delay Lines," IEEE Trans. Ultrason. Ferroelectr. Freq. Control, vol. submitted.
Lu, R. et al., "Gigahertz Low-Loss and Wide-Band S0 Mode Lithuim Niobate Acoustic Delay Lines," IEEE Trans. Ultrason. Ferroelectr. Freq. Control, vol. 66, No. 8, pp. 1373-1386, Aug. 2019.
Lu, R. et al., "Lithium Niobate Phononic Crystals for Tailoring Performance of RF Latterally Vibrating Devices," IEEE Trans. Ultrason. Ferroelectr. Freq. Control, vol. 65, No. 6, pp. 934-944, Jan. 2018.
Lu, R. et al., "RF Filters with Periodic Passbands for Sparse Fourier Transformbased Spectrum Sensing," J. Microelectromech. Syst., vol. 27, No. 5, pp. 931-944, Oct. 2018.

(56) References Cited

OTHER PUBLICATIONS

Lu, R. et al., "S0-Mode Lithium Niobate Acoustic Delay Lines with 1 dB Inseration Loss," IEEE International Ultrasonic Symposium, (IUS), Kobe, Japan, Oct. 2018, pp. 1-4.

Lu, R. et al., "Study of Thermal Nonlinearity in Lithium Niobate-Based MEMS Resonators," Proc. 18th Int. Conf. Solid-State Sens., Actuators Microsyst., Jun. 2015, pp. 1993-1996.

Lu, R. et al., "Towards Digitally Addressable Delay Synthesis: GHz Low-Loss Acoustic Delay Elements from 20 ns to 900 ns," 2019 IEEE Micro Electro Mechanical Sylstems (MEMS), 2019.

Lu, R., et al., "Accurate Extraction of Large Electromechanical Coupling in Piezoelectric MEMS Resonators," J. MicroElectromech. Syst., vol. 28, No. 2, pp. 209-218, Apr. 2019.

Makkonen, T. et al., "Surface-Acoustic-Wave Devices for the 2.5-5 GHz Frequency Range Based on Longitudinal Leaky Waves," Appl. Phys. Lett., vol. 82, No. 19, pp. 3351-3353, 2003.

Malocha, D.C. et al., "Orthogonal Frequency Coding for SAW Device Applications," 2004 IEEE International Ultrasonics, Ferroelectrics, and Frequency Control Joint 50th Anniversary Conference pp. 1082-1085, 2004.

Manzaneque, R. et al., "Lithium Niobate MEMS Chirp Compressors for Near Zero Power Wake-Up Radios," Journal of Microelectromechanical Systems, vol. 26, No. 6, pp. 1204-1215, Dec. 2017.

Manzaneque, T. et al., "An SH0 Lithium Niobate Correlator for Orthogonal Frequency Coded Spread Spectrum Communications," Proc. Joint Conference of the European Frequency and Time Forum and IEEE International Frequency Control Symposium (EFTF/IFC), Jul. 2017, pp. 143-147.

Manzaneque, T. et al., "An SH0 Lithium Niobate Dispersive Delay Line for Chirp Compression-Eneable Low Power Radios," Proc. IEEE 30th Int. Conf. Micro Electro Mech. Syst. (MEMS), Jan. 2017, pp. 155-158.

Manzaneque, T. et al., "An SH0 Lithium Niobate Trans-Impedance Chirp Compressor with High Voltage Gain," Micro Electro Mechanical Systems (MEMS), IEEE 31 rd International Conference on, 2018, pp. 783-786.

Manzaneque, T., et al., Low-Loss and Wide-Band Acoustic Delay Lines, IEEE Trans. Microw. Theory Tech., vol. 67, No. 4, pp. 1379-1391, Apr. 2019.

Martin, G. et al., "Synthesizing and Optimizing SPUDT SAW Filters," 1998 IEEE Ulgtrasonics Symposium, Proceeding (Cat No. 98Ch36102), 1998, vol. 1, pp. 165-168.

Mizutaui, K. et al., "Analysis of Lamb Wave Propagation Characteristics in Rotated Y-Cut X-Propagation LiNbO3 plates," Electron. Commun. Japan (Part 1 Commun., vol. 69, No. 4, pp. 47-55, 1986.

Odagawa, H. et al., "10 GHz Range Extremely Low-Loss Ladder Type Surface Acoustic Wave Filter," 1998 IEEE Ultrasonic Symposium, Proceedings, 1998, vol. 1, pp. 103-106.

Okano, H. et al., "GHz-Band Surface Acoustic Wave Devices Using Aluminum Nitride Thin Films Deposited by Electron Cyclotron Resonance Dual Ion-Beam Sputtering," Jpn. J. Appl. Phys., vol. 32, No. 9B, p. 4052, 1993.

Olsson, R.H, et al., "Post-CMOS Compatible Aluminum Nitride MEMS Filters and Resonant Sensors," Proc. IEEE Int. Freq. Control Symp. Joint 21st Eur. Freq. Time Forum, May/Ju. 2007, pp. 412-419.

Olsson, R.H. et al., "A High Electromechanical Coupling Coefficient SH0 Lamb Wave Lithium Niobate Micromechanical Resonator and a Method for Fabrication," Sensors Actuators A Phys., vol. 209, pp. 183-190, Mar. 2014.

Olsson, R.H. et al., "Event-Driven Persistent Sensing, Overcoming the Energy and Lifetime limitations in unattended Wireless Sensors", Proc. IEEE Sensors, pp. 3-5, 2017.

\* cited by examiner

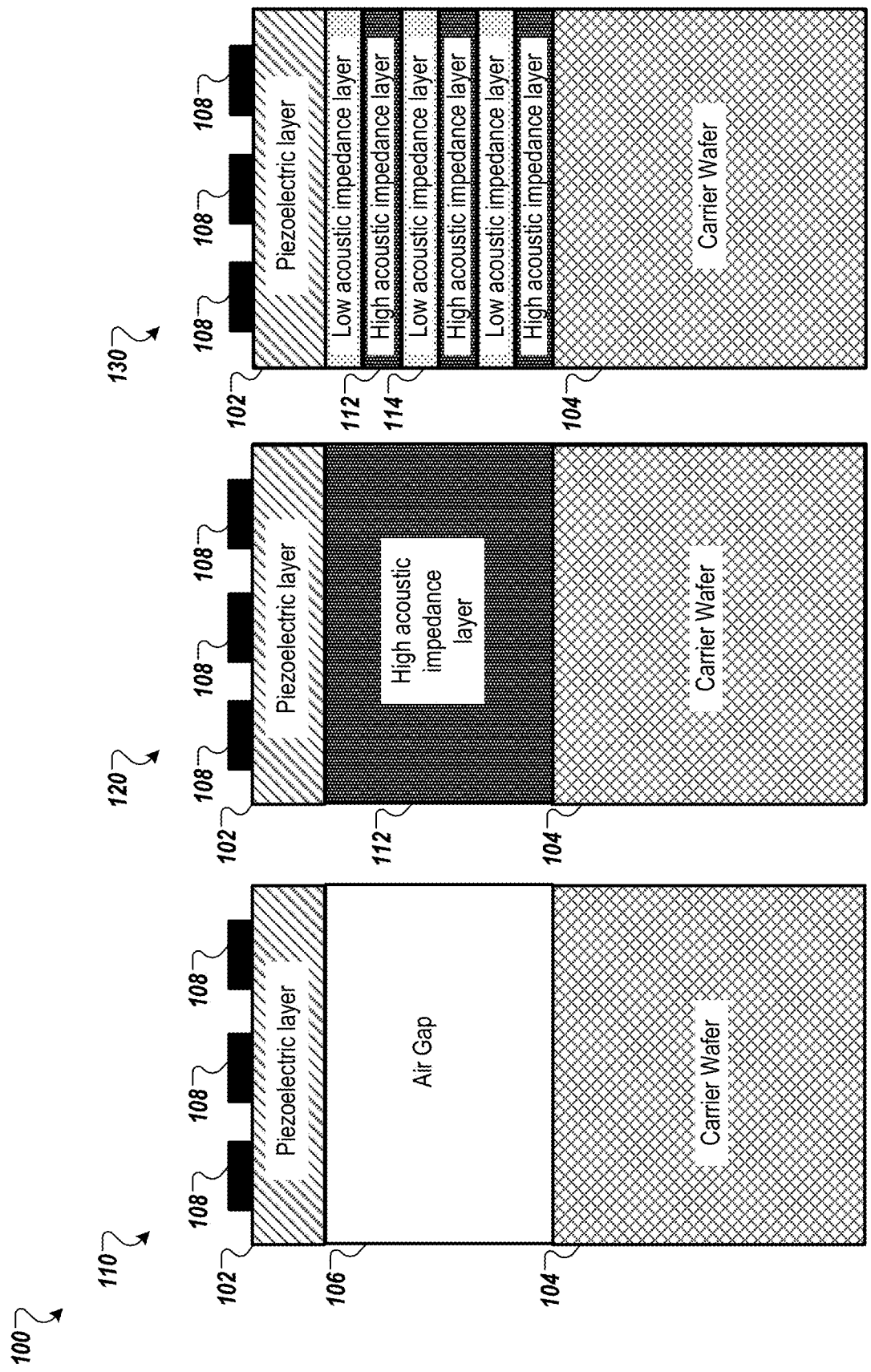

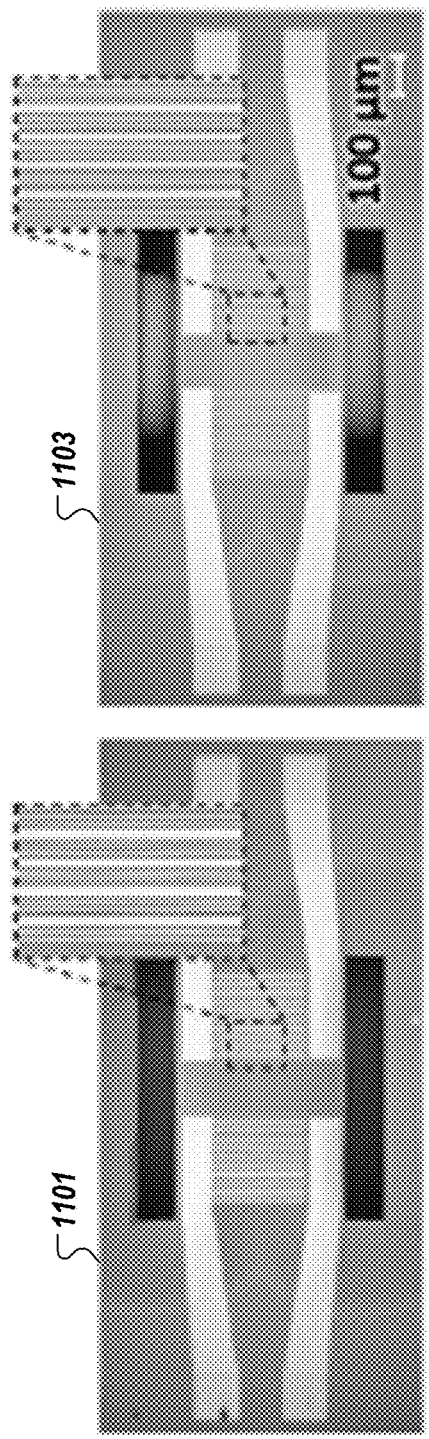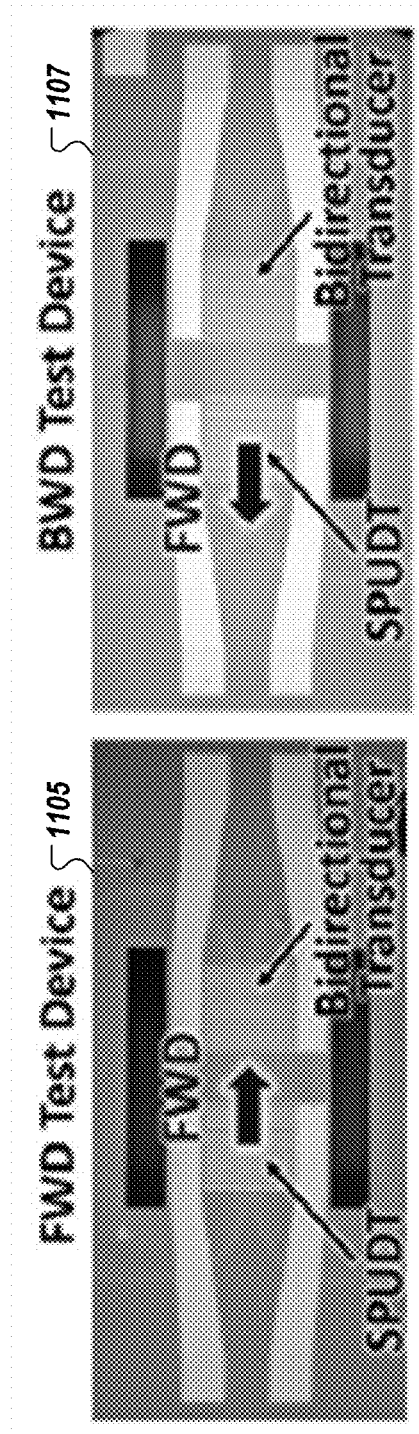
FIG. 11A
FIG. 11B

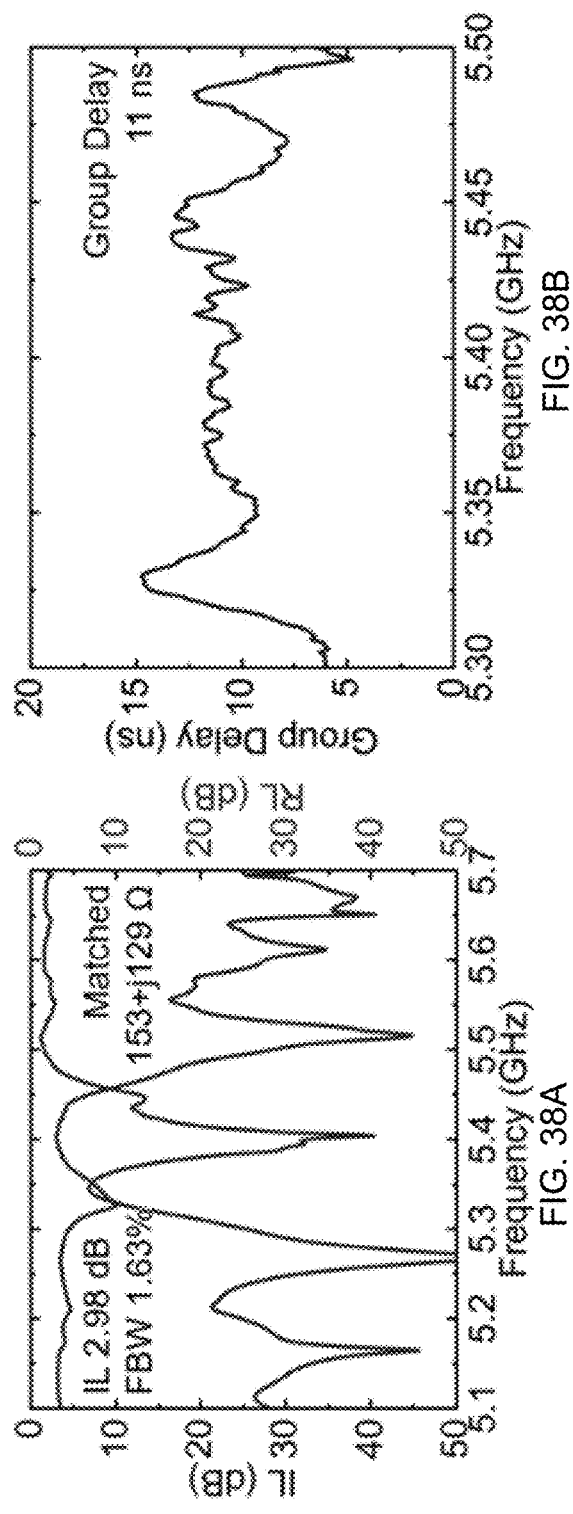
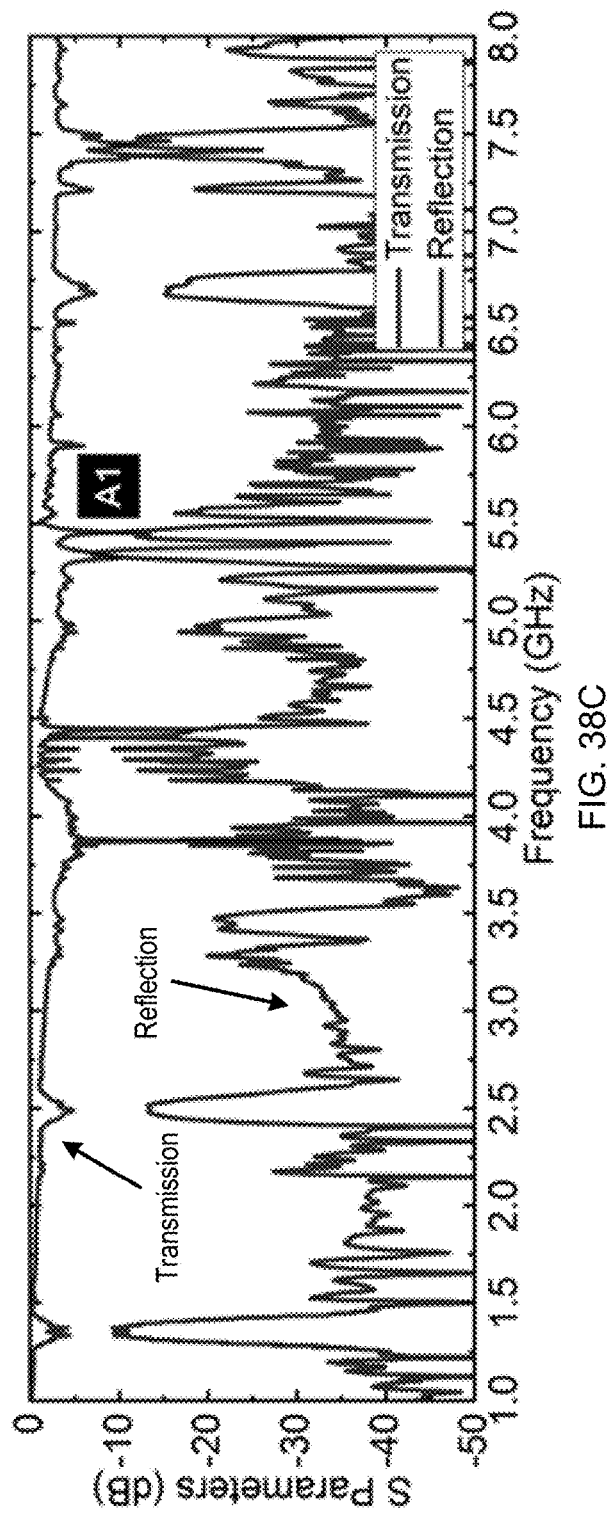
FIG. 38A
FIG. 38B
FIG. 38C

LOW-LOSS AND WIDE-BAND ACOUSTIC DELAY LINES USING Z-CUT LITHIUM NIOBATE PIEZOELECTRIC THIN FILMS

RELATED APPLICATIONS

This application claims the benefit under 35 U.S.C. § 119(e) of U.S. Provisional Patent Application No. 62/923,213, filed Oct. 18, 2019, which is incorporated herein by this reference in its entirety.

FEDERALLY SPONSORED RESEARCH OR DEVELOPMENT

This disclosure was made with government support under Grant No. HR0011-15-C-0139 awarded by the Department of Defense (DOD). The government has certain rights in the invention.

TECHNICAL FIELD

Embodiments of the disclosure relate generally to acoustic delay lines, and more specifically, relate to interdigital transducers on a suspended piezoelectric thin-film for radio frequency acoustic signal processing.

BACKGROUND

Full-duplex radios, where the transmitters and receivers operate simultaneously in the same frequency the transmitters and band, have sparked great research interest due to their great potential to enhance spectrum utilization efficiency and reduce networking complexity.

BRIEF DESCRIPTION OF THE DRAWINGS

A more particular description of the disclosure briefly described above will be rendered by reference to the appended drawings. Understanding that these drawings only provide information concerning typical embodiments and are not therefore to be considered limiting of its scope, the disclosure will be described and explained with additional specificity and detail through the use of the accompanying drawings.

FIG. 1A is a schematic illustration of an acoustic delay line (ADL) with an air gap according to one embodiment.

FIG. 1B is a schematic illustration of an ADL device with a high-acoustic impedance layer according to one embodiment.

FIG. 1C is a schematic illustration of an ADL device with a set of high-acoustic impedance layers and a set of low-acoustic impedance layers according to one embodiment.

FIG. 11A are optical top-view images of ADLs 1 and 8 of Table 1 according to one embodiment.

FIG. 11B are optical images of SPUDT ADLs 13 and 14 of Table 1 according to one embodiment.

FIGS. 38A-38C are a set of graphs illustrating extracted parameters of an A1 ADL with SPUDTs according to one embodiment.

DETAILED DESCRIPTION

Figure 2A:
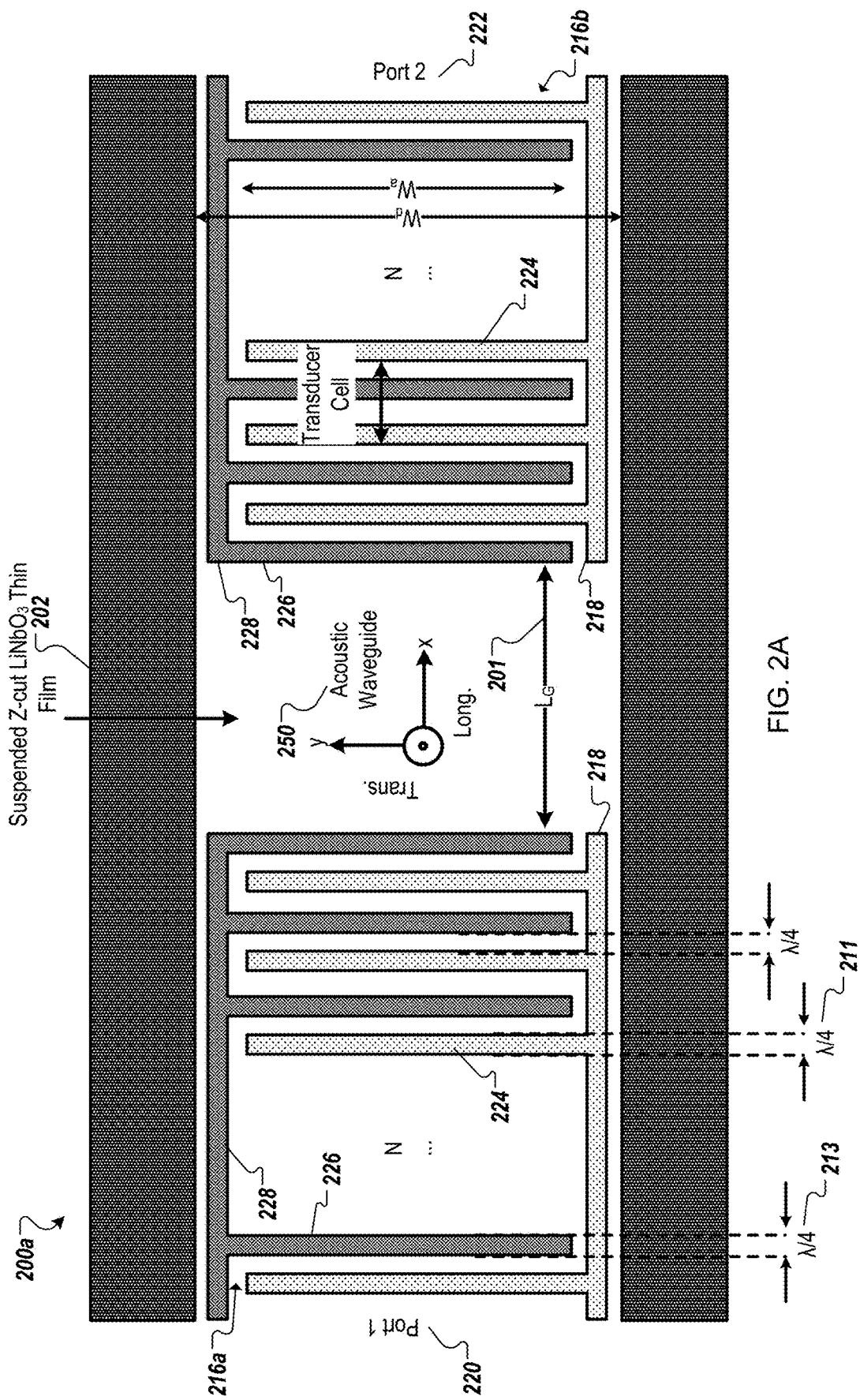
FIG. 2A is a top view of an ADL with bi-directional interdigitated transducers (IDTs) according to one embodiment.

By way of introduction, the present disclosure relates to acoustic delay lines (ADLs) with interdigital transducers (IDTs) on a piezoelectric thin film, an apparatus, and a full-duplex radio that include disclosed ADLs. Lithium niobate ($LiNbO_3$) thin films, such as Z-cut $LiNbO_3$, can be excellent platforms for implementing low-loss ADLs based on unidirectional transducers. The reason lies in the high acoustic reflections caused by a mechanical loading of electrodes on the $LiNbO_3$ thin film. Low-loss ADLs can be based on shear-horizontal waves in thin-film $LiNbO_3$. These propagation modes are known for their high electromechanical coupling, thus producing devices (e.g., ADLs) with large bandwidths. Such ADLs can be based on their acoustic vibration modes. Lamb modes (S0, A0, S1, A1, ...) and shear modes (SH0, SH1, SH2 ...) can both be used.

The expansion of wireless interconnectivity among autonomous sensors or mobile devices seeks analog signal processing functions with low loss, small form factors, and low or zero power consumption at radio frequencies (RF). In this context, acoustic devices may constitute an excellent chip-scale and low-loss platform, in which electromagnetic (EM) waves can be converted into the acoustic domain for processing, and can subsequently be converted back to the EM domain for interfacing with the rest of the system. In the RF domain, the propagation of acoustic waves in some piezoelectric thin films can exhibit much lower loss than the propagation of EM waves in planar waveguide structures (e.g., microstrips). Moreover, given the low phase velocities, typically below 10,000 m/s, and the low propagation loss of acoustic waves, high-performance waveguide structures can be designed with sizes comparable to the acoustic wavelengths (e.g., on the order of tens of micrometers) for RF applications. As a result of the above-mentioned benefits in the acoustic domain, wave phenomena can be exploited for signal processing functions (e.g., time delay or transversal filtering) in a very small form factor that otherwise may not be accessible in the EM domain at RF.

The study of signal processing functions in the acoustic domain could be motivated by radar system implementations. Surface acoustic waveguide structures, namely ADLs can be built on piezoelectric bulk substrates, with which the electromechanical transduction from the electrical domain to the acoustic domain is provided by piezoelectricity of the material. By storing a received pulse in an ADL for comparison with a subsequent pulse, the scattering from static objects can be canceled, thus diminishing clutter in the radar displays. Following the advances made for radars, other applications for ADL, such as frequency discriminators and modulators/demodulators for frequency shift keying (FSK), also emerged. These applications can leverage the large time-delay structure accessible only in ADLs to introduce delays over a broad bandwidth for signal processing. For instance, an FSK-based spread spectrum communication scheme can represent each data symbol with a code formed by a sequence of frequencies at RF. An ADL can then be used to impose delays to the incoming signal as a function of its frequency to perform matched filtering for demodulation of the signal. Similarly, such a function of ADLs can also be dual-purposed as a modulator on the transmitter side.

In addition to various flavors of matched filtering, perhaps the most pervasive application of ADLs is transversal filtering. Transversal filters based on ADLs can offer flexibility in designing both the amplitude and phase responses while achieving high out-of-band (OOB) rejection. The operating principle of transversal filtering relies on tapping a delay line at different points. By connecting these taps situated at different sections of the ADL, the output signals can be combined in the electrical domain to form a finite Fourier series. With properly designed electrode pitch, polarity, and electrode sections in the ADL, the frequencies, phases, and relative amplitudes of the terms in the Fourier series can be varied to obtain a quasi-arbitrarily configurable filter response. Because of such addressability in their response, transversal filters understandably may be favored over filters based on coupled resonators, such as those based on surface acoustic waves (SAW), lamb waves, or thickness modes, for certain applications.

Some ADLs have applications in enabling compact and low-power non-reciprocal networks using time-varying circuit structures. In these approaches, a pair of arrays of ADLs can be controlled and accessed by switches on both ends so that signals can be routed between ports on opposite sides of delay lines only in certain allowed paths. Such an ability to engineer chip-scale non-reciprocal response without resorting to magnetic materials can provide for implementing front-ends with the simultaneous transmit and receive capability.

The ADLs formed by piezoelectric interdigital transducers of the simplest type may suffer from high bi-directionality losses and may entail a minimum insertion loss (IL) of 6 dB. Transducers with a predominant radiation direction, known as unidirectional transducers (UDTs), can enable lower IL ADLs. Single-phase unidirectional transducers (SPUDTs) can be used to overcome the complexity in impedance matching. These designs can be based on embedding acoustic reflectors formed by grounded or floating electrodes in an asymmetrical arrangement with respect to the signal electrodes. The performance of ADLs formed by SPUDTs may be limited by the imperfect unidirectionality of the transducers that is caused by the finite reflectivity achievable with the electrodes.

Some ADLs are based on SAWs excited on a piezoelectric substrate, which may be made of lithium niobate ($LiNbO_3$), lithium tantalate ($LiTaO_3$), or quartz. $LiNbO_3$ devices can additionally or alternatively be based on plate modes, like Lamb and shear-horizontal waves. Because of the high electro-mechanical coupling ($k_t^2$) of these vibrational modes, resonators can be demonstrated with fractional bandwidths (FBWs) that can outperform SAW ADLs. The advantage of this high coupling can also be demonstrated in dispersive delay lines. A mechanical loading produced by the metal electrodes on the thin-film structure can be expected to be more pronounced than in SAW devices, in which the wave propagates on the surface of a thick substrate. The higher reflectivity of the electrodes provided by the mechanical loading can be exploited to reduce the bi-directionality losses of SPUDTs.

In some embodiments, ADLs based on the fundamental shear-horizontal mode waves (SH0) in Z-cut $LiNbO_3$ can be used to implement delays with low loss and large bandwidth. For example, in some embodiments, an ADL can produce a delay of 75 ns with an IL below 2 dB over a 3 dB bandwidth of 16 MHz, centered at 160 MHz.

Aspects of the present disclosure address the above challenges among others by using low-loss and wide-band acoustic delay lines (ADLs). The ADLs include a piezoelectric thin film located above a carrier substrate. A first interdigitated transducer (IDT) may be disposed at a first end of the thin film and a second IDT may be disposed at a second end of the piezoelectric thin film. The first IDT is to convert an input electromagnetic signal (e.g., an RF signal traveling along a longitudinal direction along a length of the piezoelectric thin film) into an acoustic wave. The second IDT is to convert the acoustic wave into an output electromagnetic signal, which can be delayed in time compared to the first electromagnetic signal. In some embodiments, the IDTs are unidirectional. In other embodiments, the IDTs are bi-directional.

In some embodiments, the piezoelectric thin film is suspended above the carrier substrate. In other embodiments, the piezoelectric thin film is disposed on a high acoustic impedance layer interposed between the piezoelectric thin film and the carrier substrate. In still further embodiments, the high acoustic impedance layer includes at least one of silicon (Si), sapphire, fused silica, quartz, silicon carbide (SiC), diamond, aluminum nitride (AlN), aluminum oxide ($Al_2O_3$), tungsten, molybdenum, platinum, or combinations thereof. In some embodiments, the piezoelectric thin film is disposed on a Bragg reflector interposed between the piezoelectric thin film and the carrier substrate. In some embodiments the Bragg reflector includes a set of alternating high acoustic impedance layers and low acoustic impedance layers. The low acoustic impedance carrier may be at least one of silicon nitride ($Si_3N_4$) or silicon dioxide ($SiO_2$). In some embodiments, interfaces between the high acoustic impedance layers and low acoustic impedance layers can reflect the acoustic waves, and can lead to multiple reflections from the alternating layers. In further embodiments, acoustic energy can be confined in a layer (e.g., the piezoelectric thin film) above the Bragg reflector, which may prevent or minimize energy leakage into the carrier substrate via the multiple reflections.

In various embodiments, the acoustic wave travels within the piezoelectric thin film in at least one of a fundamental symmetrical (S0) mode, a first-order symmetrical (S1) mode, a second-order symmetrical (S2) mode, a fundamental shear-horizontal (SH0) mode, a first-order shear horizontal (SH1) mode, a first-order antisymmetric (A1), or a third-order antisymmetric (A3) mode. In some embodiments, the modes are excited by at least one of a longitudinal-direction (e.g., along a length of the piezoelectric thin film) component of an electric field or a thickness-direction component of the electric field. In some embodiments, the electric fields are induced by incoming electromagnetic signal(s), e.g., RF signal(s). In some embodiments, the orientation of the induced electric field is determined by the configuration of electrodes of the IDTs in relation to a particular cut of the piezoelectric thin film. In some embodiments, the electric field is generated by a voltage potential that is applied between a signal bus line and a ground bus line (also referred to as a signal line and a ground line respectively).

In various embodiments, the piezoelectric thin film includes one of an X-cut, Y-cut, Z-cut, 128Y, 54Y, or 36Y cut lithium niobate ($LiNbO_3$) thin film. In some embodiments, the piezoelectric thin film includes one of a reactively sputtered c-axis aluminum nitride (AlN) or scandium aluminum nitride (ScAlN). In some embodiments, the piezoelectric thin film includes one of an Z-cut $LiNbO_3$ thin film that is rotated with respect to the longitudinal direction by an angle. In other words, the Z-cut $LiNbO_3$ thin film can be rotated by the angle, either in a clockwise or counterclockwise direction, with respect to the longitudinal direction. In some embodiments, the longitudinal direction can be oriented between 10 degrees clockwise and 30 degrees counterclockwise to a Y-direction of the Z-cut $LiNbO_3$ thin film. In other embodiments, the longitudinal direction can be oriented between 10 degrees counterclockwise and 30 degrees clockwise to a Y-direction of the Z-cut $LiNbO_3$ thin film.

FIGS. 1A-1C are schematic illustrations of a cross-sectional view of an ADL device 100, according to one embodiment. FIG. 1A is a schematic illustration of an ADL 110 with an air gap 106 according to one embodiment. The ADL device 110 includes a piezoelectric thin film 102 suspended above a carrier substrate 104. An air gap 106 is located between the carrier substrate 104 (e.g., carrier wafer) and the piezoelectric thin film 102 (e.g., piezoelectric layer). Electrodes and/or reflectors are located above the piezoelectric thin film 102, and are represented generally by 108. The electrodes and/or reflectors 108 can be physically and electrically coupled to the piezoelectric thin film 102.

FIG. 1B is a schematic illustration of an ADL device 120 with a high-acoustic impedance layer 112 according to one embodiment. The ADL device 120 is similar to the ADL device 110 except that the air gap is replaced by a high-acoustic impedance layer 112. In other words, the piezoelectric thin film 102 is located on the high-acoustic impedance layer 112. Illustrated is an ADL mock-up including single-phased unidirectional transducers (SPUDTs) disposed on top of a suspended $LiNbO_3$ thin film. The high-acoustic impedance layer is located between the piezoelectric thin film 102 and the carrier substrate 104. In various embodiments, the high-acoustic impedance layer can be composed of one of silicon (Si), sapphire, fused silica, quartz, silicon carbide (SiC), diamond, aluminum nitride (AlN), aluminum oxide ($Al_2O_3$), tungsten, molybdenum, platinum, or the like. Electrodes and/or reflectors 108 are located on top of the piezoelectric thin film 102. Electrodes and/or reflectors are located above the piezoelectric thin film 102, and are represented generally by 108. The electrodes and/or reflectors 108 can be physically and electrically coupled to the piezoelectric thin film 102.

FIG. 1C is a schematic illustration of an ADL device 130 with a set of high-acoustic impedance layers 112 and a set of low-acoustic impedance layers 114 according to one embodiment. The ADL device 130 is similar to the ADL device 110 except that the air gap is replaced by the set of high-acoustic impedance layers 112 and set of low-acoustic impedance layers 114. The piezoelectric thin film 102 is located on a combination of high acoustic impedance layers 112 and a combination of low acoustic impedance layers 114. In some embodiments, the high acoustic impedance layers 112 and the low acoustic impedance layers 114 form a stack in an alternating pattern and that stack is interposed between the piezoelectric thin film 102 and the carrier substrate 104. For example, respective ones of the low acoustic impedance layers 114 can be alternately disposed on respective ones of the high acoustic impedance layers 112.

The ADL device 130 illustrates a further embodiment in which the piezoelectric thin film 102 is disposed on a Bragg reflector which is composed of multiple alternating layers of high acoustic impedance layers 112 and low acoustic impedance layers 114. In some embodiments, each of the high acoustic impedance layers 112 and the low acoustic impedance layers 114 have the same thickness. In other embodiments, the high acoustic impedance layers 112 can have a different thickness than the low acoustic impedance layers 114. The low acoustic impedance carrier of the low acoustic impedance layers can be at least one of silicon nitride ($Si_3N_4$), silicon dioxide ($SiO_2$), benzocyclobutene (BCB), or other suitable polymers. The Bragg reflector can be disposed between the carrier substrate 104 (e.g., carrier wafer) and the piezoelectric thin film 102 (e.g., piezoelectric layer). Electrodes and/or reflectors 108 can be located on top of or above the piezoelectric layer. In some embodiments, interfaces between the high acoustic impedance layers 112 and the low acoustic impedance layers 114 can reflect the acoustic waves, and can lead to multiple reflections from the alternating layers. In further embodiments, acoustic energy can be confined in a layer above the Bragg reflector, and can prevent energy leakage into the carrier substrate. In some embodiments, high impedance devices, such as ADL 120) can provide better power handling. Further, air gap devices, such as the ADL 110, can provide higher quadrature (Q) values compared to devices that have no air gap.

FIG. 2A is a top view of an ADL 200a with bi-directional IDTs according to one embodiment. Illustrated is a mock-up of an ADL 200 including SPUDTs disposed on top of a suspended $LiNbO_3$ thin film. In one embodiment, the ADL 200 includes a suspended thin film 202 made of $LiNbO_3$. The suspended thin film 202 may constitute a propagation medium for the SH0 acoustic waves. In other embodiments, the suspended thin film can be another suitable piezoelectric thin film. For the following discussion, Z-cut $LiNbO_3$ is used as an illustrative example. The choice of cuts may affect the propagation of acoustic wave modes. These modes may be excited by electric fields oriented in a longitudinal direction, e.g., along a direction of propagation of the acoustic wave, or in other words along the x-axis in FIG. 2, or in the thickness direction, e.g., normal to a direction of propagation of the acoustic wave, or in other words along the y-axis in FIG. 2.

In some embodiments the Z-cut $LiNbO_3$ thin film can be adapted to propagate an acoustic wave in at least one of a first mode excited by an electric field oriented in the longitudinal direction along a length of the piezoelectric thin film or in a second mode excited by the electric field oriented at least partially in the thickness direction of the piezoelectric thin film. The first mode can include at least one of a first-order antisymmetric (A1) mode, a fundamental shear-horizontal (SH0) mode, a third-order antisymmetric (A3) mode, or a second-order symmetric (S2) mode. The second mode can include one of a fundamental symmetric (S0) mode, a first-order symmetric (S1) mode, or a higher-order Lamb-wave mode. A thickness of the $LiNbO_3$ thin film can be taken to be between 30 nm and 100 µm. For illustrative purposes herein, the thickness of the LiNbO$_3$ thin film can be chosen to be 800 nm. As such, by way of example, the thickness of the LiNbO$_3$ thin film will be understood to be approximately 800 nm unless otherwise mentioned herein.

With continued reference to FIG. 2A, two sets of interdigital transducers (IDTs) 216a and 216b may include metal electrodes interconnected by bus lines 218 and may be disposed on top of the LiNbO$_3$ thin film 202. The IDTs 216a and 216b may be composed of at least one of gold (Au), aluminum (Al), molybdenum (Mo), platinum (Pt), or any other suitable conductive material. In one embodiment, the IDTs 216a and 216b may be unidirectional. In other embodiments, the IDTs 216a and 216b may be bi-directional as depicted. Either set of IDTs 216a and 216b can serve as the transmitting transducer (input port), while the other IDT serves as the receiving transducer (output port). In the depicted embodiment, the IDTs 216a and 216b are separated by a gap length 201 L$_G$ that may set the time delay experienced by an electrical signal traversing from an input port 220 to an output port 222. In some cases, the gap length 201 can be between 0 µm and several centimeters. In some cases, the gap length 201 may be larger. Each IDT 216a and 216b can be formed by cascading N identical transducer unit cells. In some embodiments, the number N of transducer unit cells may range from 1 to 20. The number N of identical transducer cells may be as large as required for a given application. In some embodiments, the transducer unit cell may be a distributed acoustic reflector transducer (DART) unit cell. In other embodiments, the transducer unit cell may be an electrode width controlled (EWC) unit cell.

An acoustic waveguide 250 can include the first IDT 216a, the second IDT 216b, and the Z-cut LiNbO$_3$ piezoelectric thin film 202. The acoustic waveguide 250 can have a first port 220 coupled to the first IDT 216a to receive a first electromagnetic signal. The acoustic waveguide 250 can also have a second port 222 coupled to the second IDT 216b to output a second electromagnetic signal that is delayed from the first electromagnetic signal. In some cases, the second electromagnetic signal can be based on or representative of the first electromagnetic signal. The acoustic waveguide 250 has an aperture with a first transverse width (W$_a$). The acoustic waveguide can have a second transverse width (W$_d$) that is wider than the first width.

A transduction center (TC) is a reference plane at which the acoustic waves launched towards both longitudinal directions (e.g., the +x and −x directions) have the same amplitude and phase. Similarly, a reflection center (RC) is a reference plane at which the wave reflections from both longitudinal directions (e.g., the +x and −x directions) are equal.

In some IDTs, such as bi-directional IDTs, the TCs and RCs can be evenly distributed along the transducer. Alternatively, in SPUDTs, TC can be arranged asymmetrically with respect to the RCs, in a way such that the launched acoustic waves, through both transduction and reflection, interfere constructively towards one of the acoustic ports, while the waves launched towards the opposite acoustic port interfere destructively, thus leading to the unidirectionality.

With reference to FIG. 2A, each transducer unit cell can contain two types of electrodes: ground electrodes 224 that are connected to a lower bus line 218 and signal electrodes 226 that are connected to an upper bus line 228. In some cases, the thickness of the electrodes (including the ground electrodes 224 as well as the signal electrodes 226) may be between 5 nm and 10 µm. In some cases, the thickness of the electrodes may be larger. In the case of a bi-directional transducer, a width 211 (e.g., a longitudinal width) of the ground electrodes 224 can be the same as a width 213 (e.g., a longitudinal width) of the signal electrodes 226. When a voltage is applied between the lower bus line 218 and the upper bus line 228 (e.g., from an electromagnetic signal, for example, an RF signal), electric fields (e.g., E-fields) may be generated between the signal electrodes 226 and the ground electrodes 224 along the propagation direction (e.g., the x-axis). In some embodiments, the electric fields may be induced by one or more incoming electromagnetic signals. Further, the orientation of the induced electric fields may be determined by the configuration of the electrodes 224 and 226. Through the inverse piezoelectric effect, the E-fields can subsequently launch fundamental shear horizontal strain and stress waves (SH0) in the xy-plane towards both the +x and −x directions. By reciprocity, the shear stress and/or strain in the xy-plane associated with an acoustic wave propagating through the receiving IDT 216 can generate a voltage difference across the corresponding input electrical port 220. The efficiency of the conversion between electrical and acoustic energy can be maximum at a center frequency, f$_0$, at which an acoustic wave is phase-delayed by 360° after traveling through a transducer unit cell. The value of f$_0$ can be determined by the length of the unit cells $\lambda_0$ as $$f_0 = \frac{v_t}{\lambda_0}, \quad (1)$$

where v$_t$ is the average phase velocity of the acoustic wave in the transducer unit cell. In some cases, the length of the transducer unit cell can range between 0.1 µm to 100 µm. An average phase velocity of the acoustic wave can be calculated as a weighted average between a phase velocity v$_\infty$ of the un-metallized LiNbO$_3$ film and a phase velocity v$_m$ of the metallized film which can be expressed as $$v_t = \eta v_m + (1-\eta) v_\infty, \quad (2)$$

where η is the metallization ratio of the transducer unit cell. The dependence of f$_0$ on the thickness of the piezoelectric thin film can be neglected, due to the weak dispersive nature of SH0 waves.

Figure 2B:
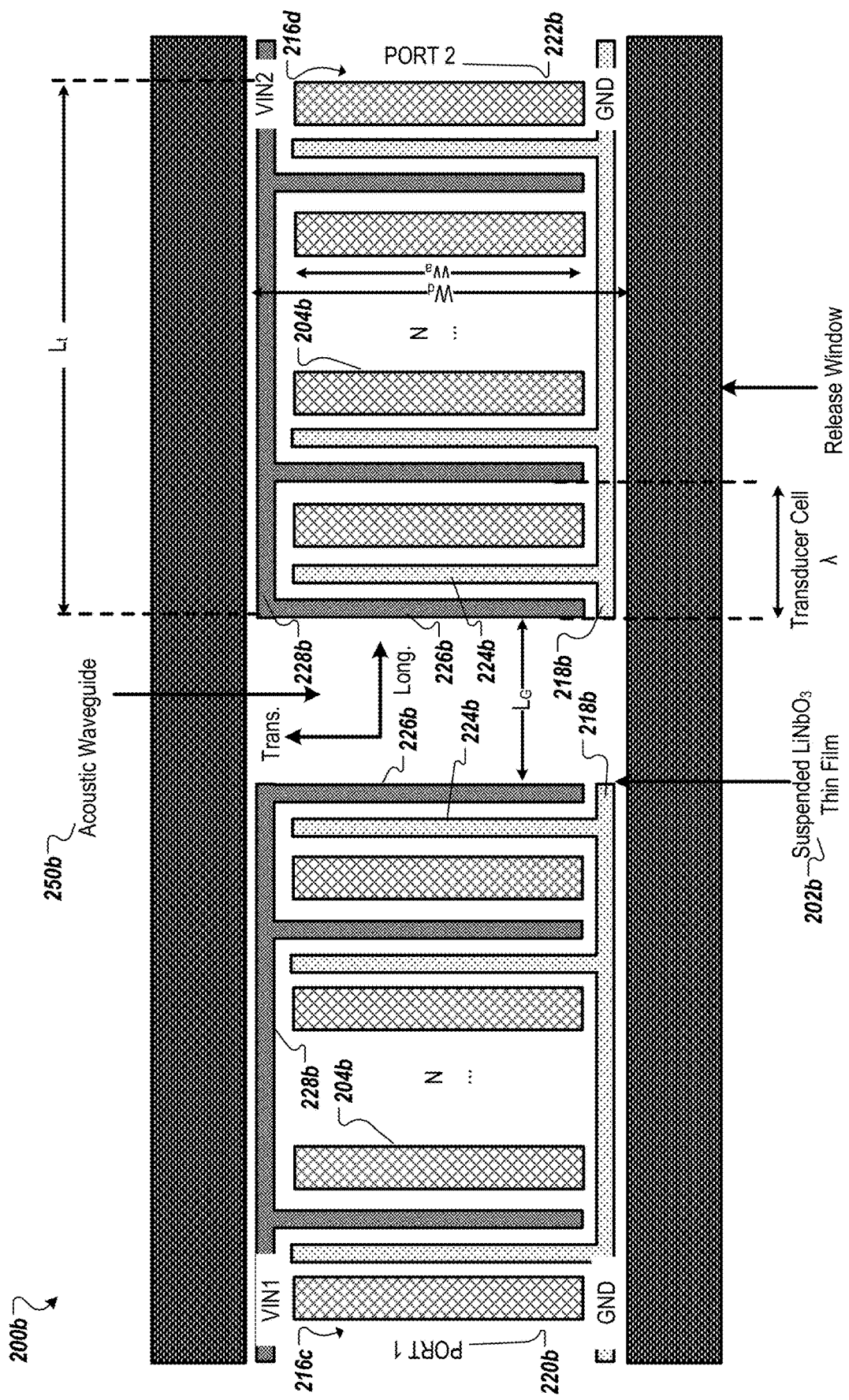
FIG. 2B is a schematic diagram of an ADL with a pair of single-phase unidirectional transducers (SPUDTs) on a suspended LiNbO$_3$ thin film according to one embodiment.

FIG. 2B is a schematic diagram of an ADL 200b with a pair of single-phase unidirectional transducers (SPUDTs) 216c and 216d on a suspended LiNbO$_3$ thin film 202b according to one embodiment. The schematic diagram is an example of a Z-cut LiNbO$_3$ thin film ADL with unidirectional transducers. In the depicted embodiment, the ADL 200b includes a suspended Z-cut LiNbO$_3$ thin film 202b sandwiched by IDTs 216c and 216d. Each of the IDTs 216c and 216d include a number N of cascaded transducer unit cells (as described in further detail with regards to FIGS. 2C-2D). Each IDT 216c and 216d includes a floating top electrode 204b that is to function as an embedded acoustic reflector. The floating top electrode 204b can have a first transversal width (W$_a$) and an acoustic waveguide 250b of the ADL 200b can have a second transversal width (W$_d$) that is wider than the first width. Each IDT 216c and 216d further includes ground electrodes 224b coupled to ground lines 218b and signal electrodes 226b coupled to Vbus lines 228b (VIN1 and VIN2). The ground electrodes 224b and the signal electrodes 226b can have a first longitudinal width. The floating top electrode 204b can have a second longitudinal width that is greater (e.g., wider) than the first longitudinal width. In some embodiments, the second longitudinal width can be approximately 65% to 100% greater than the first longitudinal width. The longitudinal widths are described in further detail with respect to FIGS. 2C-2D.

The Z-cut LiNbO$_3$ thin film can propagate an acoustic wave in a first mode excited by an electric field oriented in a longitudinal direction along a length of the piezoelectric thin film or in a second mode excited by the electric field oriented at least partially in a thickness direction of the piezoelectric thin film. The first mode is one of a first-order antisymmetric (A1) mode, a fundamental shear-horizontal (SH0) mode, a third-order antisymmetric (A3) mode, or a second-order symmetric (S2) mode. The second mode is one of a fundamental symmetric (S0) mode, a first-order symmetric (S1) mode, or a higher-order Lamb-wave mode.

In some embodiments, the Z-cut LiNbO$_3$ thin film 202b can be suspended above a carrier substrate. In other embodiments, the Z-cut LiNbO$_3$ thin film 202b can be disposed on a high-acoustic impedance layer interposed between the piezoelectric thin film and the carrier substrate and the high-acoustic impedance layer may composed of at least one of silicon (Si), sapphire, fused silica, quartz, silicon carbide (SiC), diamond, aluminum nitride (AlN), or aluminum oxide (Al$_2$O$_3$). In other embodiments, the Z-cut LiNbO$_3$ thin film 202b can be disposed on a Bragg reflector interposed between the piezoelectric thin film (e.g., the Z-cut LiNbO$_3$ thin film 202b) and the carrier substrate. The Bragg reflector can be composed of a set of alternating layers including a first layer with a first acoustic impedance (e.g., a high-acoustic impedance layer) and a second layer with a second acoustic impedance (e.g., a low-acoustic impedance layer). The second acoustic impedance may be lower than the first acoustic impedance. The pair of SPUDTs can be located on the two longitudinal ends of the acoustic waveguide, and may serve as the input port 220b and output port 222b. Each port is coupled to a ground line 218b and a signal line 228b. It should be noted that in other embodiments the input port and the output port may be reversed. In some embodiments, the pair of SPUDTs 216c and 216d can be thickness-field-exited SPUDTs (TFE-SPUDTs) that may be composed of cascaded transducer unit cells. The piezoelectric thin film as well as the SPUDTs 216c and 216d can be located inside of the acoustic waveguide and are designed as unidirectional IDTs. A gap between the first SPUDT 216c and the second SPUDT 216d determines a time delay of the acoustic wave prior to converting the acoustic wave back into an electromagnetic signal and outputting the electromagnetic signal (e.g., by the second SPUDT 216d at the output port 222b).

Figure 2C:
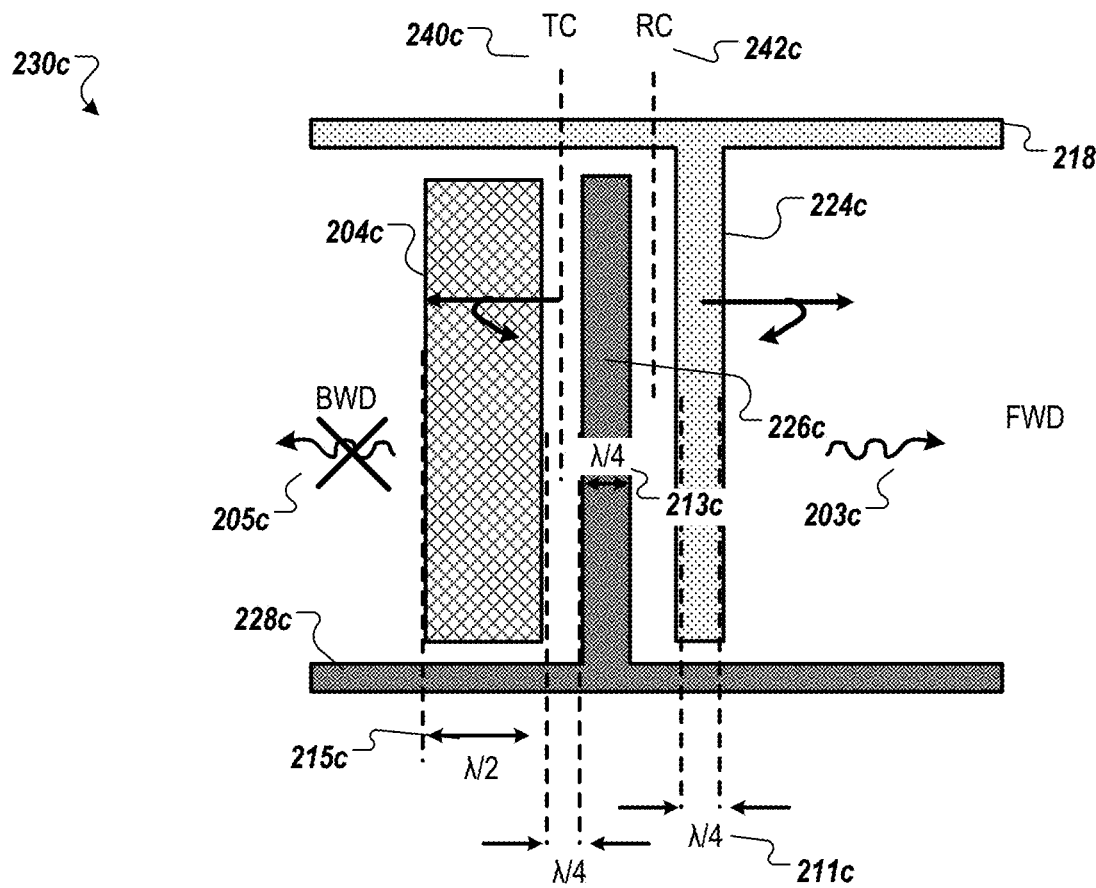
FIGS. 2C-2D are a top view and a side view, respectively, of a SPUDT unit cell of one of the SPUDTs as described in FIG. 2B according to some embodiments.
Figure 2D:
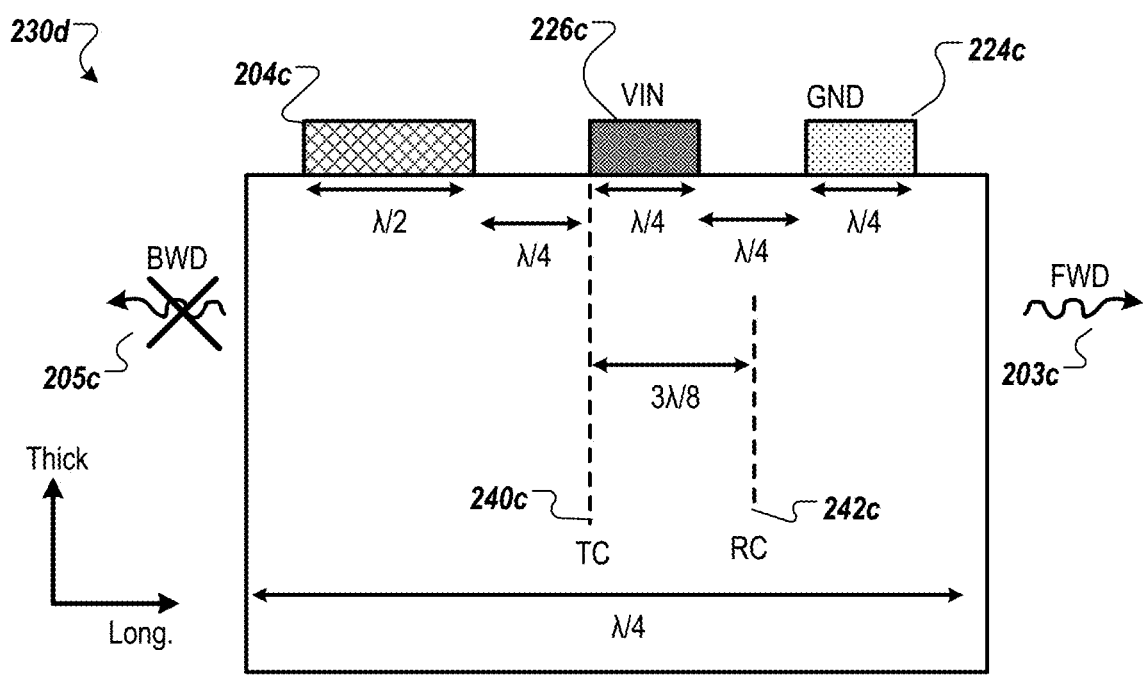

FIGS. 2C-2D are a top view of a SPUT unit cell 230c and a side view of a SPUT unit cell 230d, respectively, of one of the SPUDTs as described in FIG. 2B according to some embodiments. In FIG. 2C, the relevant dimensions, the reflection center (RC) 242c, and the transduction center (TC) 240c are labeled. The SPUDT unit cell 230c includes a floating top electrode 204c a ground electrode 224c coupled to a ground line 218c, and a signal electrode 226c coupled to a signal line 228c. The smallest distance between the back part of the floating top electrode 204c and the signal electrode 226c can be λ/4 and the smallest distance between the signal electrode 226c and the ground electrode 224c can be λ/4.

As described with respect to FIG. 2B, the ground electrodes 224b and the signal electrodes 226b can have a first longitudinal width and the floating top electrode 204b can have a second longitudinal width that is greater than the first longitudinal width. As depicted in FIG. 2C, the ground electrode 224c has a longitudinal width 211c (e.g., the first longitudinal width) and the signal electrode 226c has a longitudinal width 213c (e.g., the first longitudinal width) that is equal to the longitudinal width 211c. The floating top electrode 204c can have a longitudinal width 215c (e.g., the second longitudinal width) that is greater (e.g., wider) than the longitudinal widths 211c and 213c. In one embodiment, the longitudinal width of the floating top electrode 204c is λ/2, and the longitudinal widths of the signal electrode 226c and the ground electrode 224c are λ/4. In other embodiments, the widths of the floating top electrode 204c, the signal electrode 226c, and the ground electrode 224c, as well as their mutual distances (e.g., separations), can be different that depicted herein. For example, in some embodiments, the width of the floating top electrode 204c is between 65% (percent) and 120% greater than the width of the signal electrode and the ground electrode.

Such a design for a SPUDT unit cell allows an acoustic wave 203c propagating towards an output direction (e.g., the forward direction (FWD)) to be effectively amplified due to constructive interference, while an acoustic wave 205c propagating towards an input direction (e.g., the backwards direction (BWD)) is approximately canceled due to destructive interference. In FIG. 2D, the same elements of the SPUDT unit cell 230d are shown as in FIG. 2C. The distance between the TC 240c and the RC 242c can be 3λ/8, for example.

In each SPUDT unit cell, the TC 240c may be arranged non-symmetrically with the RC 242c and an additional adjacent RC (now shown), which can lead to the unidirectionality of 216c and 216d. The RC 242c can be located between the signal electrode 226c and the ground electrode 224c. The TC 240c can be located at an edge of the signal electrode 226c that is closest to the floating top electrode 204c. Given an adequate number of SPUDT unit cells in an IDT (such as IDTs 216c and 216d) and a reflectivity per unit cell, the energy would be mostly launched towards FWD. Thus, unidirectional transducers designed for low-loss ADLs can be achieved.

Figure 3A:
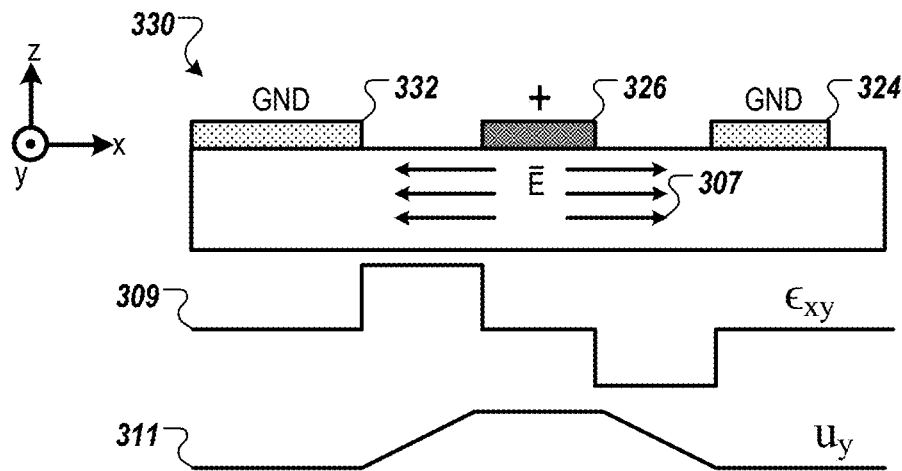
FIG. 3A is a side-view of a single-phase unidirectional transducer (SPUDT) with an effective electric field and a corresponding strain curve and displacement curve according to one embodiment.

FIG. 3A is a side-view of a SPUDT 330 with an effective electric field 307 and a corresponding strain 309 curve and displacement 311 curve according to one embodiment. Although not all components of the SPUDT 330 are shown, the SPUDT 330 is similar to the DART unit cell and/or the EWC unit cells.

To locate the TCs of the transduction unit cell it should first be noted that shear-horizontal waves can be generated through piezoelectricity in the areas with x-polarized electric fields, such as the electric field 307. These areas may be the gaps between the signal electrode 326 and the adjacent ground electrodes 324 and 332 on either side. In adjacent gap areas, the x-polarized electric fields induced by the electrodes may have opposite signs, as seen in FIG. 3A. Therefore, in a transduction unit cell (such as the DART unit cell 230b), a center of the signal electrode 326 may be approximately an axis of anti-symmetry for a generated xy-plane strain $\epsilon_{xy}$ 309. Since $\epsilon_{xy}$ 309 is the derivative of a y-axis displacement $u_y$ 311 with respect to x, $u_y$ 311 is symmetric with respect to the center of the signal electrode 326. Thus, this point can be considered the TC for the displacement wave $u_y(x, t)$ 311. The same approximation can be adopted for EWC unit cells. FIG. 3A shows that the induced strain 309 and displacement 311 may be respectively antisymmetric and symmetric with respect to the center of the signal electrode 326.

Figure 3B:
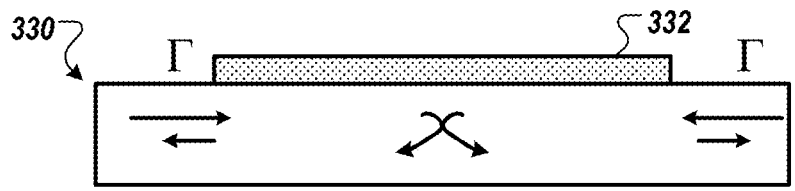
FIG. 3B is a side-view of the SPUDT to illustrate a reflection center (RC) according to one embodiment.

FIG. 3B is a side-view of the SPUDT 330 to illustrate an RC according to one embodiment. Following the same symmetry rationale as for the TC, the center of a reflection electrode 332 can be regarded as a reflection center. Due to the symmetry of the electrodes and the law of conservation of power, the reflection coefficients of metal electrodes referred to their centers may be purely imaginary. FIG. 3B shows equal reflection coefficients with respect to the center of the electrode for incidences from both sides.

Figure 3C:
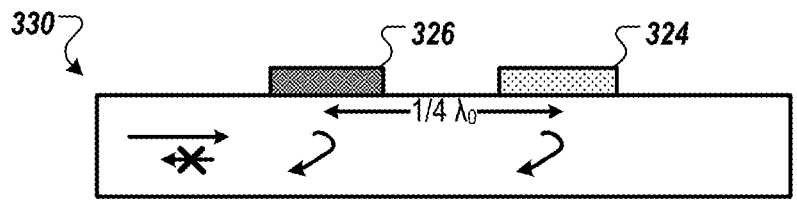
FIG. 3C is a side-view of the SPUDT to illustrate unidirectionality according to one embodiment.

FIG. 3C is a side-view of the SPUDT 330 to illustrate unidirectionality according to one embodiment. As seen in FIG. 3C, in either a DART unit cell or an EWC unit cell, there can be a pair of electrodes 324 and 325 which have a width of $\lambda_0/8$ and are connected to ground and signal, respectively, with a center-to-center distance of $\lambda_0/4$. In some embodiments, a distance between a center of the electrode 324 and a center of the electrode 325 is greater than a width of each of the electrodes 324 and 325 and also less than twice the width. The acoustic waves respectively reflected by these electrodes can have a phase difference of 180° at the center frequency $f_0$ and interfere destructively. Assuming small reflections, their amplitudes can be considered equal, resulting in a perfect theoretical cancellation. In other words, acoustic waves reflected by the two adjacent $\lambda_0/8$ electrodes 324 and 326 can produce an overall substantially zero reflection coefficient. As a result, the $\lambda_0/8$-wide electrodes 324 and 326 with a center-to-center distance of $\lambda_0/8$ can be omitted from the analysis for reflections within the SPUDTs. Different from $\lambda_0/8$-wide electrodes, the wider electrodes (such as the acoustic reflectors, or the wider electrodes 332) may be intended to produce pronounced reflections. In other words, FIG. 3C shows a reflection-less nature of two identical electrodes 324 and 326 separated by a distance of $\lambda_0/4$ at $f_0$.

Figure 3D:
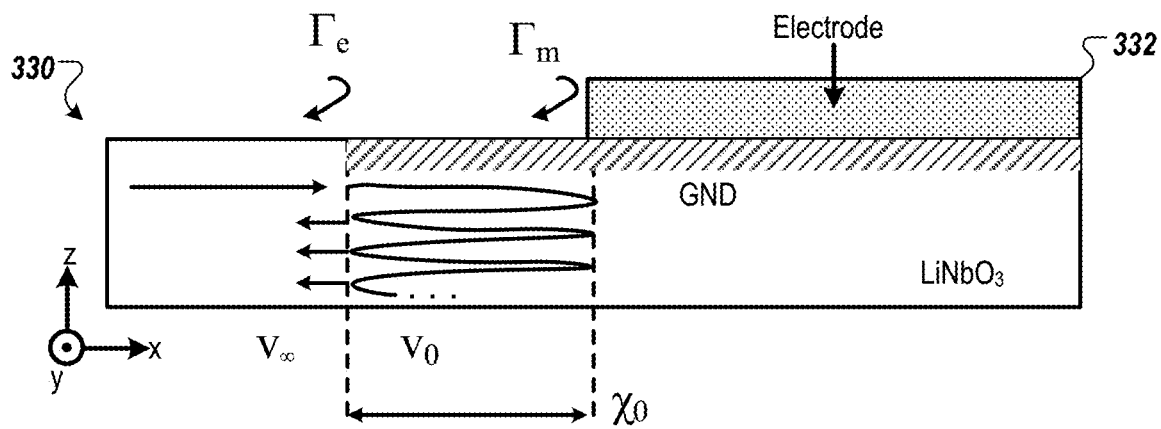
FIG. 3D is a side-view of the SPUDT to illustrate multiple reflections of acoustic waves according to one embodiment.

FIG. 3D is a side-view of the SPUDT 330 to illustrate multiple reflections of acoustic waves according to one embodiment. The acoustic emission towards the forward (FWD) acoustic port (e.g., port 2) can be a combination of the waves generated at the TC towards the FWD acoustic port and the acoustic waves towards the backwards (BWD) acoustic port that are reflected from the closest RC on the left. For both DART and EWC designs, the RCs and can be separated from TCs, respectively, by a distance of $3\lambda_0/8$. Assuming a negative imaginary reflection coefficient $\Gamma$ (with a phase angle of 90 degrees), the reflected acoustic waves can be in phase with the acoustic waves generated at the TC towards the FWD acoustic port at $f_0$. Note that the acoustic waves sent by the further transduction unit cells on the left may also interfere constructively given the $\lambda_0$ periodicity. The acoustic emission towards BWD acoustic port may be the result of the interference of the waves generated at the TC and their reflection from the closest RC on the right. Due to the $5\lambda_0/8$ separation between the TCs and RCs respectively, on the right, the directly transduced waves towards the BWD acoustic port and their reflection from RCs may be out of phase. Hence, the BWD acoustic port may receive less acoustic power than the FWD acoustic port due to the partial cancellation of the directly transduced acoustic waves by the reflection. In some cases, a single reflection may not be sufficient to achieve the elimination of transduction towards the BWD acoustic port 238 and unidirectionality towards the FWD acoustic port. More transduction unit cells may be required for this purpose. In a multi-cell ∞configuration (e.g., with N transduction unit cells), the RC in each cell can all serve to produce reflection for every TC. Therefore, the interference in both directions combines all the directly transduced waves from all TCs and all the reflections generated by all the RCs. The dynamics in a multi-cell configuration can be analyzed, and it can be shown that a near-perfect unidirectionality is thus possible with multiple cells and multi-reflections.

The total reflection illustrated by FIG. 3D is induced by a metal electrode as a combination of two contributions, one electrical ($\Gamma_e$) and one mechanical ($\Gamma_m$). As discussed above, the directionality of the SPUDT 330 may be based on the reflectivity of the wide electrodes 332 in each unit cell. The reflectivity of each reflector can be quantitatively modeled. The reflection coefficient $\Gamma$ of an electrode can be considered as the result of two phenomena. First, it can have a mechanical component, $\Gamma_m$, caused by the edges of the electrode on the film, along with the change in the acoustic impedance in sections with metal coverage. The change in acoustic impedance can arise from unequal mass density and stiffness of the electrode metal and LiNbO$_3$. Second, $\Gamma$ can have an electrical contribution, $\Gamma_e$, caused by a constant potential boundary condition created on the top surface of the LiNbO$_3$ film by the metallization. In other words, $\Gamma_e$ is the reflection coefficient created by a strip of perfect electric conductor (PEC) of zero thickness. To calculate the total reflection coefficient, the mechanical and electrical reflections can be treated as if they were produced at different locations separated by a distance $\chi_0$, as seen in FIG. 3D. By solving the multiple reflections between these two locations and taking a limit $\chi_0 \to 0$, the total reflection coefficient can be obtained as $$\Gamma = \frac{\Gamma_e + \Gamma_m}{1 + \Gamma_e \Gamma_m} \quad (3)$$

for small reflections, e.g., $\Gamma_e\Gamma_m \ll 1$, $\Gamma \approx \Gamma_e + \Gamma_m$.

For the reflections that are mechanically-induced by metal electrodes, analytical expressions can be found for SAW devices. For wave propagation in plates, the methods to predict the reflections from mechanical discontinuities can rely on finite element method (FEM) simulations. For an electrode on a thin film, acoustic waves can be reflected as they travel from an un-metalized section to a metalized portion of the LiNbO$_3$ film (e.g., step-up). Further, acoustic waves can be reflected as they travel from a metalized portion to an un-metalized section (e.g., step-down). As a result of both reflections, an equivalent overall mechanical reflection coefficient $\Gamma_m$ can be defined for a single electrode.

Figure 4A:
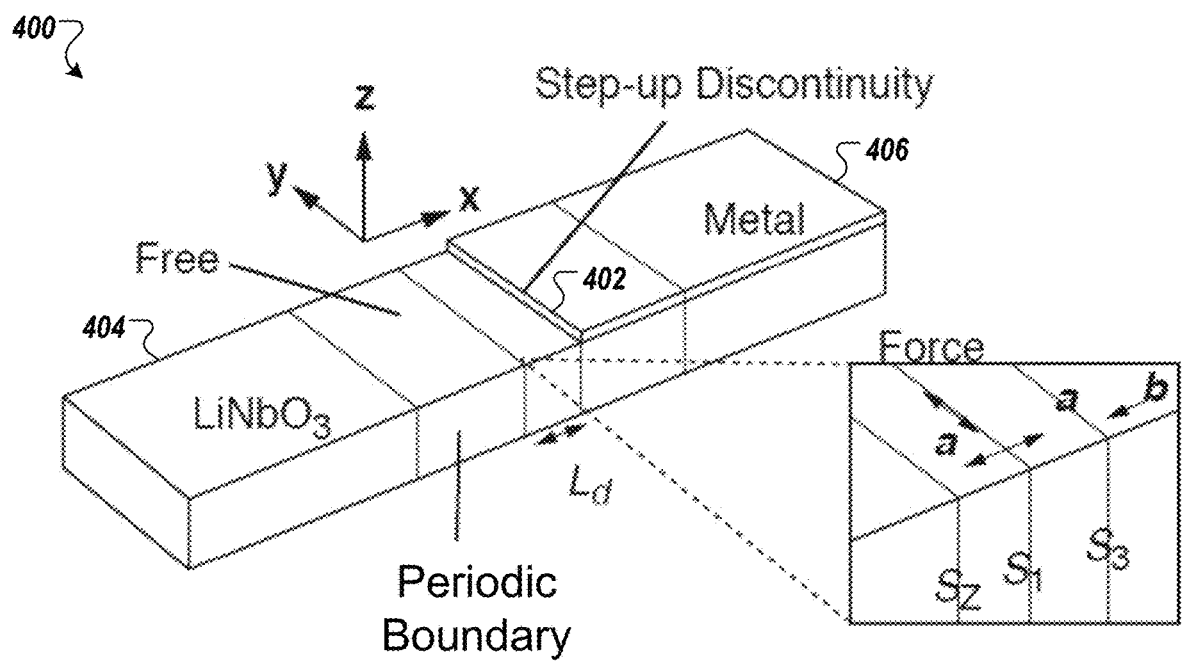
FIG. 4A is a schematic diagram illustrating a COMSOL model for calculating the mechanical reflection coefficient from a step-up discontinuity caused by metallization, according to one embodiment.

FIG. 4A is a schematic diagram illustrating a COMSOL model 400 for calculating the mechanical reflection coefficient from a step-up discontinuity 402 caused by metallization, according to one embodiment. The model 400 shown in FIG. 4A can be built in COMSOL to evaluate the mechanical reflection from the step-up discontinuity 402 created by an electrode. The model may be composed of sections of the delay medium including a non-metallized region 404 in one end and metallized region 406 in the other. Perfectly matched layer (PML) conditions can be set at both ends of the model to emulate an infinitely long mechanical medium along $-x$ and $+x$. The faces (e.g., surfaces) at $-y$ and $+y$ can be modeled as periodic boundaries. Acoustic waves can be excited by a harmonic force applied at the cross-section at $x=0$ and $s_1$ in FIG. 4A, separated from the discontinuity by a distance $L_d$. With an excitation force along the y-axis, a first SH0 wave can be propagated in a first direction (e.g., along $-x$) and a second SH0 wave with the same amplitude as the first SH0 wave can be propagated in a second direction opposite to the first direction (e.g., along $+x$). The first SH0 wave and the second SH0 wave can have opposite phases if the strain $\epsilon_{xy}$ is considered as the wave variable. Alternatively, the first SH0 wave and the second SH0 wave can have the same phase if the displacement, $u_y$, is considered as the wave variable.

Figure 4B:
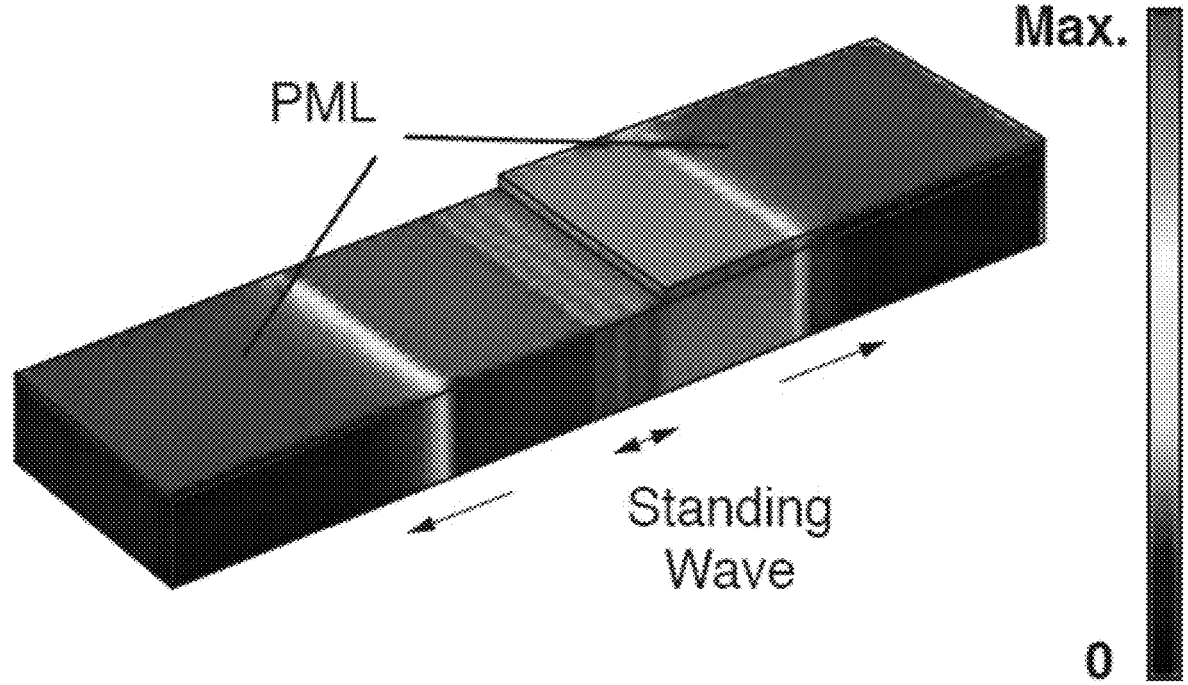
FIG. 4B is a schematic diagram illustrating a magnitude of y-axis displacement $u_y$ at 160 MHz, according to one embodiment.

FIG. 4B is a schematic diagram illustrating a magnitude of y-axis displacement $u_y$ at 160 MHz, according to one embodiment. In particular, FIG. 4B shows the solution for the magnitude of $u_y$. A standing wave can be created between $s_1$ and the metallization edge as a result of the interference of $a(x, t)$ with the reflected wave $b(x, t)$. A constant amplitude can be observed between $s_1$ and the PML in the −x region, and between the discontinuity and the PML in the +x region. This can indicate a perfect absorption of the acoustic power by the PMLs. The strain field $\epsilon_{xy}$ associated with the wave a can be written as $$\epsilon_{xy}^a(x,t) = A e^{-j\beta_\infty x} e^{j\omega t} \text{ for } x>0$$

$$\epsilon_{xy}^a(x,t) = -A e^{-j\beta_\infty x} e^{j\omega t} \text{ for } x>0, \quad (4)$$

where $\omega$ is the angular frequency and $\beta_\infty = \omega/v_\infty$ is the wave-number in the un-metallized LiNbO$_3$ film. The strain field associated with the reflected wave b can then be obtained as $$\epsilon_{xy}^b(x,t) = A e^{-j\beta_\infty x} e^{-j\beta_\infty \cdot 2L_d} \Gamma_{su} e^{j\omega t} \text{ for } x<L_d, \quad (5)$$

where the subscript su denotes the mechanical reflection coefficient associated with the step-up discontinuity. The stress at the cross-sections $s_2$ and $s_3$, separated from $s_1$ by a distance $\Delta x$ (e.g., see FIG. 4A), can be obtained as the superposition of a and b waves at $x=-\Delta x$ and $x=\Delta x$, respectively:

$$\epsilon_{xy}^{s2}(t) = A(-e^{j\beta_\infty \Delta x} + e^{j\beta_\infty \Delta x} e^{-j\beta_\infty \cdot 2L_d} \Gamma_{su}) e^{j\omega t} \quad (6)$$

$$\epsilon_{xy}^{s3}(t) = A(e^{j\beta_\infty \Delta x} + e^{j\beta_\infty \Delta x} e^{-j\beta_\infty \cdot 2L_d} \Gamma_{su}) e^{j\omega t} \quad (7)$$

By taking a limit $\Delta x \to 0$, the expression below can be obtained:

$$\Gamma_{su} = \frac{u_y^b(x,t)}{u_y^a(x,t)} = -\frac{\epsilon_{xy}^b(x,t)}{\epsilon_{xy}^a(x,t)} = e^{-j\beta_\infty 2L_d} \frac{\epsilon_{xy}^{s3} + \epsilon_{xy}^{s2}}{\epsilon_{xy}^{s3} - \epsilon_{xy}^{s2}} \quad (8)$$

where $u_y^a$ and $u_y^b$ are the displacements associated with the incident and reflected waves, respectively. Using this expression, the reflection coefficient $\Gamma_{su}$ can then be obtained by evaluating $\epsilon_x^{s2}$ and $\epsilon_x^{s3}$ in the COMSOL simulation. As an illustrative example, the procedure described above can be performed for an 800 nm-thick LiNbO$_3$ film and four metals that are commonly used as electrodes in microsystems: gold (Au), aluminum (Al), molybdenum (Mo) and platinum (Pt). In all cases, it can be found that $\Gamma_{su}$ is substantially constant as a function of frequency up to 500 MHz.

Figure 4C:
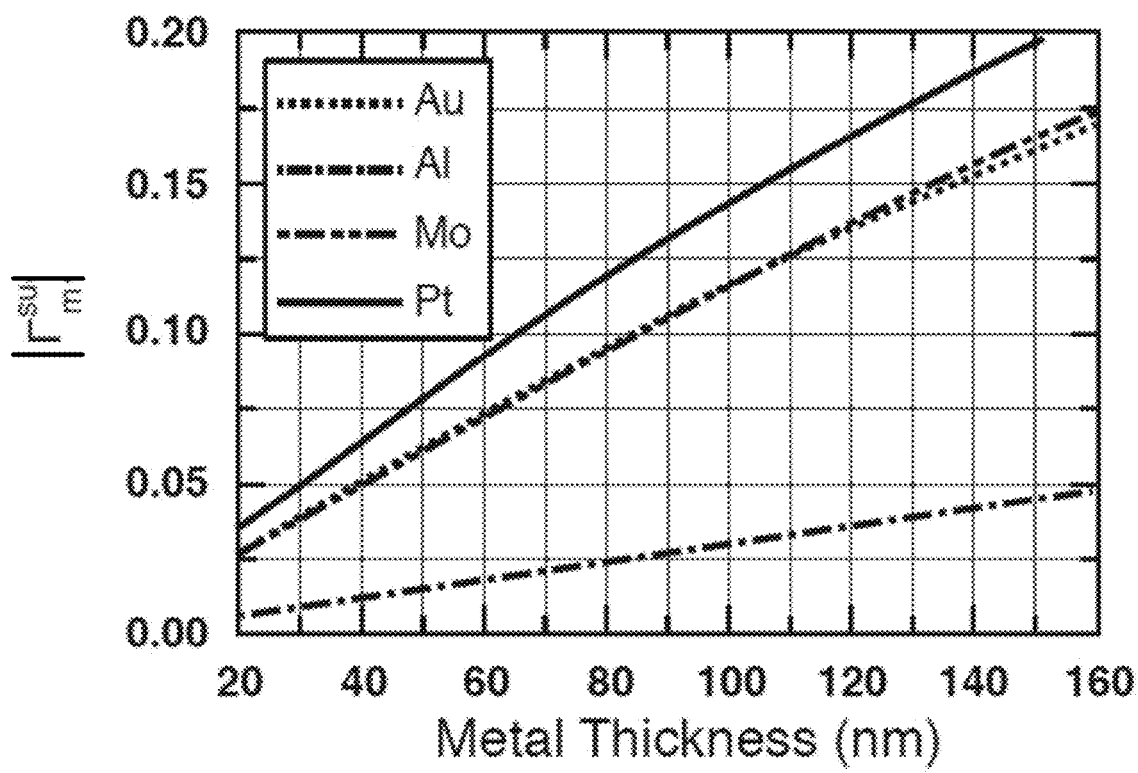
FIG. 4C is a graph illustrating an amplitude of the mechanical reflection coefficient $\Gamma_m^{su}$ as a function of metal thickness for different metals at 160 MHz, according to one embodiment.

FIG. 4C is a graph illustrating an amplitude of the mechanical reflection coefficient $\Gamma_m^{su}$ as a function of metal thickness for different metals at 160 MHz, according to one embodiment. The magnitude of $\Gamma_{su}$ can be found to be nearly linearly dependent on the metal thickness.

Figure 4D:
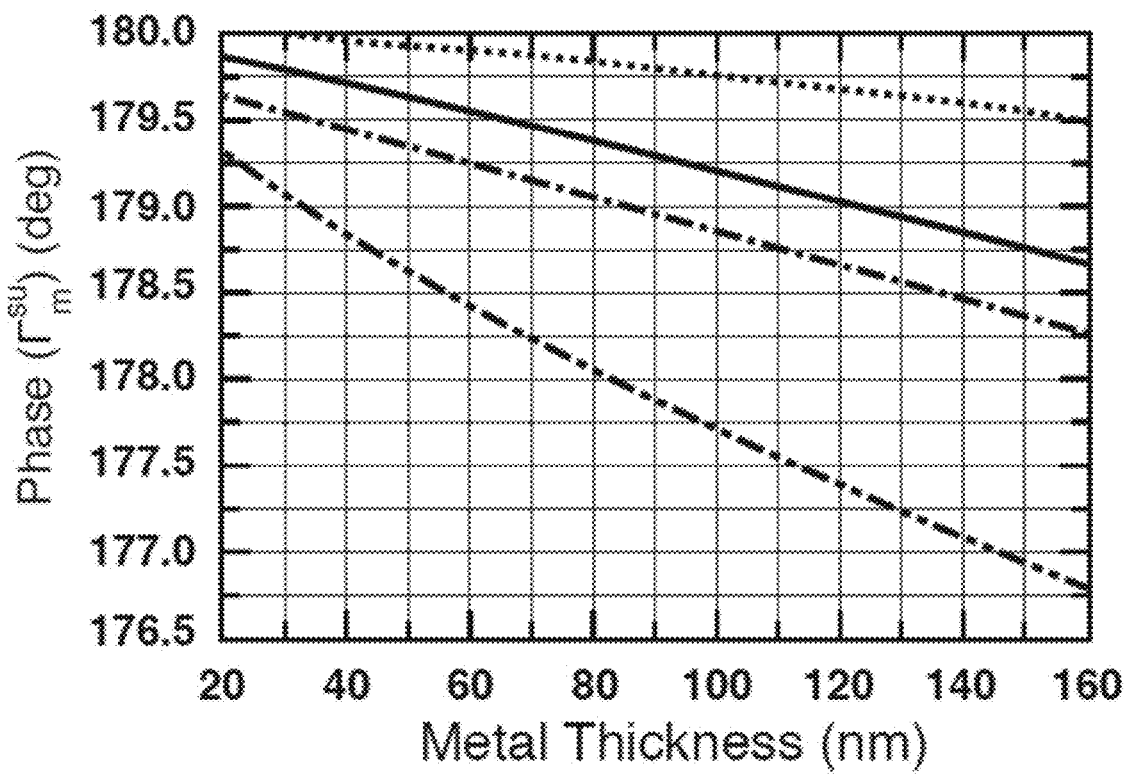
FIG. 4D is a graph illustrating a phase of the mechanical reflection coefficient $\Gamma_m^{su}$ as a function of metal thickness for different metals at 160 MHz, according to one embodiment.

FIG. 4D is a graph illustrating a phase of the mechanical reflection coefficient $\Gamma_m^{su}$ as a function of metal thickness for different metals at 160 MHz, according to one embodiment. The phase of $\Gamma_{su}$ is close to 180° for the simulated thickness range. The reflection coefficient of the electrode step-down, $\Gamma_{sd}$, can be found to have the same magnitude but opposite phase as the reflection coefficient of the electrode step-up, (e.g., $\Gamma_{sd} = -\Gamma_{su}$). The overall mechanical reflection coefficient of an electrode can be found by summing the multiple reflections produced by the step-up and step-down discontinuities. Referencing the reflections to the center of the electrode, the following expression can be obtained $$\Gamma_m = \Gamma_{su} e^{j\alpha} \left( 1 - e^{-j2\alpha} T_{su} \sum_{n=0}^{\infty} (\Gamma_{su} e^{-j\alpha})^{2n} \right) \quad (9)$$

where $\alpha$ is the phase retardation for traversing half of the width of a reflector. $\alpha$ is be $3\pi/4$ for DART and $\pi/2$ for EWC reflectors. $T_{su}$ is the transmission coefficient of the step-up discontinuity, given by $$T_{su} + \Gamma_{su}. \quad (10)$$

Introducing $T_{su}$ to Eq. (9) and simplifying the geometric series, the following result can be obtained $$\Gamma_m = \Gamma_{su} e^{j\alpha} \frac{1 - e^{-j2\alpha}(1 - \Gamma_{su}^2)}{1 - \Gamma_{su}^2 e^{-j2\alpha}}. \quad (11)$$

The electrical reflection can be calculated in a similar way by considering the change in phase velocity produced by the ground condition set by the reflector electrodes on top of the piezoelectric film. Similar to the approach with the mechanical reflection, a reflection coefficient can be defined as the wave passes from an un-metalized to a metalized section, $$\Gamma_{\infty 0} = \frac{v_0 - v_\infty}{v_0 + v_\infty}, \quad (12)$$

where $v_0$ and $v_\infty$ are the phase velocities for a piezoelectric medium with the free and electrically shorted top surfaces, respectively. The reflection coefficient as the wave passes from a metallized to an un-metallized section is $\Gamma_{0\infty} = -\Gamma_{\infty 0}$. The phase velocities of the SH0 mode can be determined using the finite element method (FEM) in COMSOL. For an 800 nm-thick LiNbO$_3$ film, the phase velocity $v_\infty$ for a piezoelectric medium with an electrically shorted top surface can be calculated to be 4507 m/s. For the same film with the ground as the electrical boundary condition on the top surface, a phase velocity $v_0$ for a piezoelectric medium with a free top surface can be found to be 3550 m/s. The overall electrical reflection coefficient of an electrode can be obtained following the same procedure as for Eq. (11), as follows:

$$\Gamma_e = \Gamma_{0\infty} e^{j\alpha} \frac{1 - e^{-j2\alpha}(1 - \Gamma_{0\infty}^2)}{1 - \Gamma_{0\infty}^2 e^{-j2\alpha}}. \quad (13)$$

It should be noted that Eq. (13) may not account for non-uniform electric fields created by the uneven charge distribution in an electrode when surrounded by other electrodes in an array or multi-cell configuration. An analytical method to calculate the electrical reflection accounting for this phenomenon can be used. Such a method can assume an array of electrodes with constant width and separation. Since this condition may not be met by the reflectors in SPUDTs, the method may have to be revised before being applied.

Based on FIGS. 4A-4D, as an illustrative example, 100 nm-thick Au can be chosen to implement the electrodes for simultaneously enabling sufficient reflections and avoiding fabrication complications. In other embodiments, electrodes can be composed of at least one of gold (Au), aluminum (Al), molybdenum (Mo), platinum (Pt), or other suitable conductive material. In some embodiments, the thickness of the electrode can be between 5 nm and 10 µm. For such a configuration, $\Gamma_{su}$=−0.116 can be obtained in the case where the imaginary part is neglected. Using Eq. (11), the mechanical reflection coefficients can be obtained for the wide electrodes in DART unit cells (such as the DART unit cell 230b of FIG. 2B) and EWC unit cells (such as the EWC unit cell 230c of FIG. 2C): $\Gamma_m^{DART}$=−0.164 j, $\Gamma_m^{EWC}$=−0.229 j. For the electrical reflection, Eq. (12) can result in $\Gamma_{\infty 0}$=−0.119, which, from Eq. (3), yields: $\Gamma_e^{DART}$=−0.168 j, $\Gamma_e^{EWC}$=−0.235 j. The total reflection coefficients, arising from both mechanical and electrical reflection phenomena, can be obtained through Eq. (3) as $\Gamma^{DART}$=−0.323 j, $\Gamma^{EWC}$=−0.440 j. These values can be negative and imaginary as assumed in the analysis for RCs with respect to FIGS. 3A-3D.

In various embodiments, with electrodes of the same material and thickness, the reflection coefficients of reflectors in a SAW device on a YZ—LiNbO$_3$ substrate may be at least one order of magnitude smaller. As shown in the following description, a higher reflectivity per reflector can permit a higher unidirectionality in a multi-cell configuration (e.g., in a multi-cell ADL). Considering that the bandwidth (BW) of unidirectionality scales down as the number of unit cells increases, a higher reflectivity can also imply a better tradeoff between delay line insertion loss (IL) and BW.

As previously described, multiple unit cells that are spaced by $\lambda_0$ disposed in a cascaded configuration may be required to attain highly unidirectional transduction. In order to be consistent with the framework used for analyzing a single cell, a multi-cell transducer can also be considered with three ports: one electric port that is connected to all the cells for excitation, and two acoustic ports that can be situated at the opposite ends of the multi-cell transducer. To quantitatively measure the directionality of multiple cells, a figure of merit (FoM) dubbed as directionality of transduction can be defined as $$D = \frac{P_{FWD}}{P_{BWD}}, \tag{14}$$

where $P_{FWD}$ is the power emitted towards the FWD acoustic port and $P_{BWD}$ is the power emitted towards the BWD acoustic port. When a time-harmonic voltage is applied at the electrical port, a transducer (e.g., with N transducer unit cells) can emit acoustic power towards both acoustic ports. The total emission to each port can be calculated as the superposition of the waves emitted by each TC in the transducer. To determine the power emitted by a single TC in a multi-cell configuration, a voltage source can connected to one TC at a time, while all other TCs are grounded.

Figure 5:
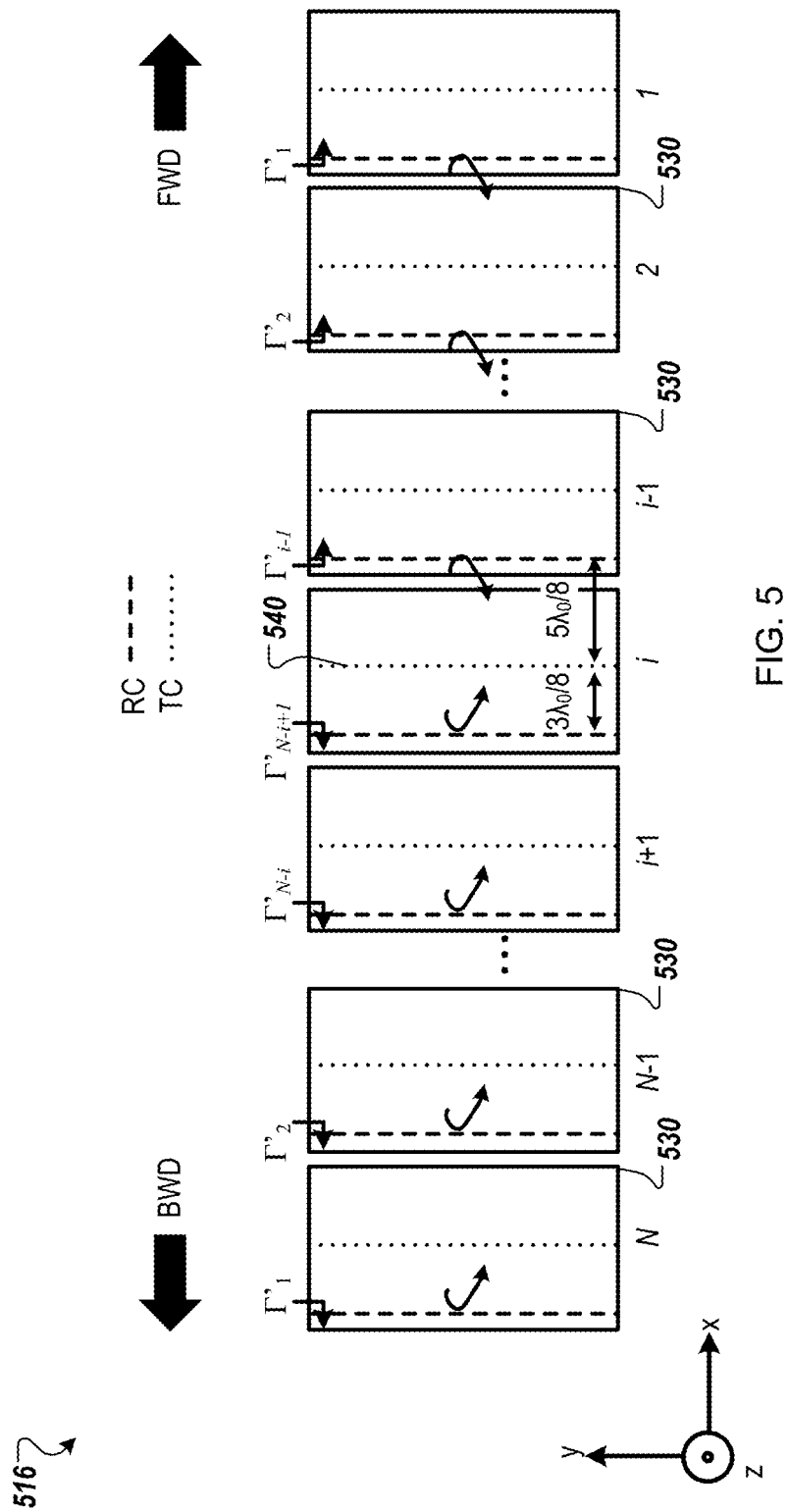
FIG. 5 is a schematic diagram of a SPUDT formed by N transducer unit cells, according to one embodiment.

FIG. 5 is a schematic diagram of a SPUDT 516 formed by N transducer unit cells 530, according to one embodiment. Although not all components of the SPUDT 516 are shown, the SPUDT 516 is similar to the IDT 216 of FIG. 2. The number of transducer unit cells N is an integer number that can range from 1 to as many as is necessary for a given application. Increasing the number of transducer unit cells (also referred to simply as "unit cells" herein) can increase the unidirectionality of the SPUDT and can result in a narrower bandwidth. In some embodiments, increasing the unidirectionality can be preferable. In FIG. 5, each rectangle corresponds to a unit cell with marked RC and TC. For the $i^{th}$ unit cell, the directionality can be calculated by considering its TC and all the RCs at both sides.

As seen, the transduction center 540 at the unit cell i can have i−1 reflectors on its right (FWD) and (N−i+1) reflectors on its left (BWD), with all reflectors being characterized by the same reflection coefficient, F. Each RC in the transducer can be denoted by an index k. At the $(i-1)^{th}$ RC which is on the immediate right of the $i^{th}$ TC (i.e., k=i−1), an equivalent reflection coefficient $\Gamma_k'$ can be defined, that accounts for all the reflections produced by the unit cells from 1 to k. For k=1, this may simply be $\Gamma_1'$=$\Gamma$. For k=2, the equivalent reflection coefficient must account for the multiple reflections between the RCs of unit cells 1 and 2. At $f_0$, there may be a $2\pi$ phase separation between the RCs, giving:

$$\Gamma_2' = \Gamma + T^2 \Gamma_1 \sum_{n=0}^{\infty} (\Gamma_1' \Gamma)^n \tag{15}$$

where T is the transmission coefficient of the RCs, and can be obtained as:

$$T = \frac{1 - \Gamma_{\infty m}^2}{1 - \Gamma_{\infty m}^2 e^{-j2\alpha}}, \tag{16}$$

where $\Gamma_{\infty m}$=$(\Gamma_{su}+\Gamma_{\infty 0})/(1+\Gamma_{su}\,\Gamma_{\infty 0})$ is the total reflection experienced by a wave traveling from a non-metallized to a metallized section. By substituting Eq. (16) into Eq. (15) and simplifying the geometric series, Eq. (15) can be reduced to $$\Gamma_2' = \Gamma + \frac{T\,\Gamma}{1 - \Gamma^2}. \tag{17}$$

This method can be applied to the successive RCs, leading to the recursive definition of $\Gamma_k'$:

$$\Gamma_k' = \Gamma + \frac{T\Gamma_{k-1}'}{1 - \Gamma\Gamma_{k-1}'}. \tag{18}$$

The equivalent reflection coefficients of the RCs on the left of the $i^{th}$ TC 540 can be obtained in the same way from the right to the left as $\Gamma_{N-k+1}'$ (see FIG. 5). Associated to the $\Gamma_k'$, the equivalent transmission coefficients to each RC can be defined as:

$$T_k' = e^{j\phi k}\sqrt{1 - |\Gamma_k'|^2}, \tag{19}$$

where $\phi_k$ is the phase of the transmission coefficient. Then, the calculation of the directionality of unit cell i can be reduced to attending the $i^{th}$ TC 540 with two overall reflections at the locations of the two most adjacent RCs on the left and right, with reflection coefficients $\Gamma_{N-i+1}'$ and $\Gamma_{i-1}'$ respectively. By solving the multiple reflections for the two waves generated at the TC in the opposite directions, the wave amplitude emitted to the FWD port can be found to be:

$$\alpha_i^{FWD} = \psi \frac{e^{-j(3\pi/4 - \phi_{i-1})}\sqrt{1 - |\Gamma_{i-1}'|^2}\,(e^{-j\pi/2} + \Gamma_{N-i+1}')}{1 - \Gamma_{i-1}'\Gamma_{N-i-1}'}, \tag{20}$$

where ψ is the transduction coefficient. For the wave radiated to the BWD port, the wave amplitude emitted to the BWD port can be found to be:

$$\alpha_i^{BWD} = \psi \frac{e^{-j(3\pi/4-\phi_{N-i+1})}\sqrt{1-|\Gamma'_{N-i+1}|^2}\,(1+e^{-j\pi/2}+\Gamma'_{i-1})}{1-\Gamma'_{i-1}\Gamma'_{N-i+1}} \quad (21)$$

Imposing that, from Eq. (18), all the $\Gamma_k'$ may be negative and imaginary, the directionality of the unit cell i can be obtained as $$D_i = \frac{|a_i^{FWD}|^2}{|a_i^{BWD}|^2} = \frac{(1+|\Gamma'_{i-1}|)(1+|\Gamma'_{N-i+1}|)}{(1-|\Gamma'_{i-1}|)(1-|\Gamma'_{N-i+1}|)}. \quad (22)$$

By evaluating Eq. (18) into Eq. (22), it can be shown that the directionality of each unit cell in a multi-cell configuration has the same value $$D_i = \left(\frac{1+|\Gamma|}{1-|\Gamma|}\right)^N \quad (23)$$

which, by linear superposition, may also be the overall directionality of the whole transducer, D. The transducer directionality calculated in this way is plotted in FIG. 6 as a function of the number of cells, for different values of the reflection coefficient. The specific values calculated above for the DART and EWC, $F^{DART}=-0.204$ j and $\Gamma^{EWC}=-0.359$ j, are represented by solid lines. If (3) is introduced in (23), the directionality is obtained as a composition of two factors, the directionality due to the electrical reflection, $D_e$, and the directionality due to the mechanical reflection, $D_m$:

$$D = D_e D_m = \left(\frac{1+|\Gamma_e|}{1-|\Gamma_e|}\right)^N \left(\frac{1+|\Gamma_m|}{1-|\Gamma_m|}\right)^N \quad (24)$$

Figure 6:
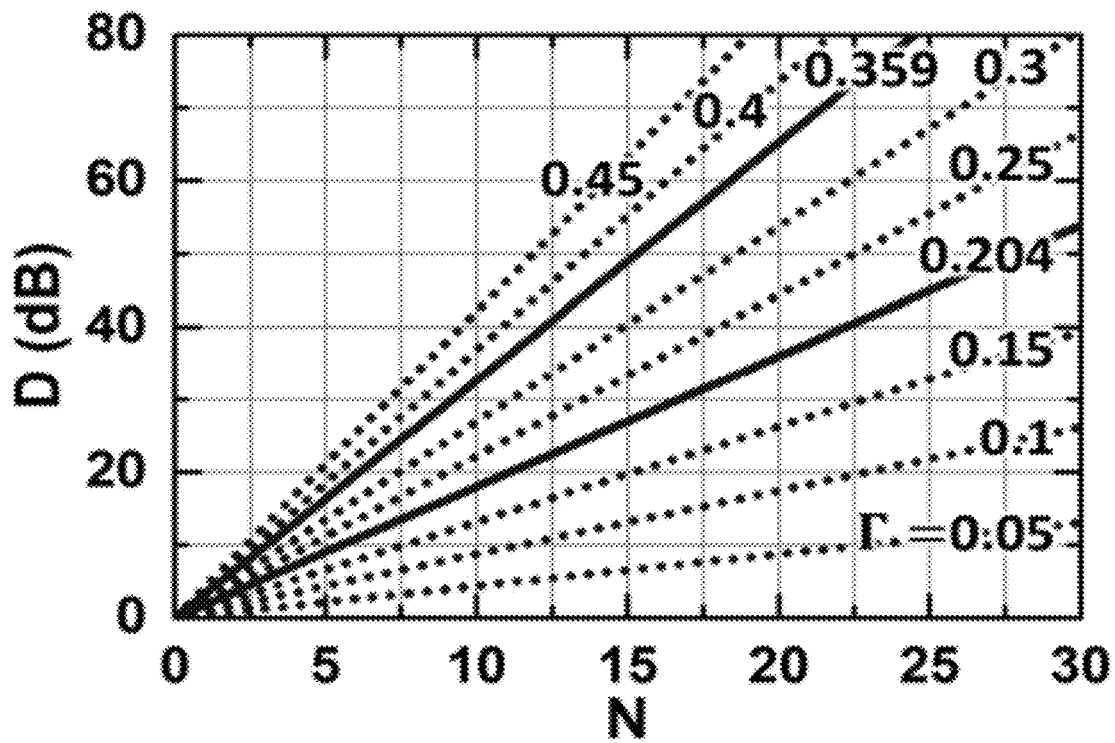
FIG. 6 are graphs illustrating the transducer directionality as a function of the number unit cells (N) for different values of the overall reflection coefficient ($\Gamma$), according to one embodiment.

FIG. 6 are graphs illustrating the transducer directionality as a function of the number unit cells (N) for different values of the overall reflection coefficient (F), according to one embodiment. The solid lines correspond to the reflection coefficients derived for DART and EWC reflectors with 100 nm thick Au.

The group delay of an ADL (also referred to simply as a delay line herein) employing the abovementioned transducers can be challenging to precisely predict with a closed-form expression. This can be due to the complexity introduced by the multiple reflections between the different cells in each transducer. A simplified analysis can be done by disregarding these internal reflections. This can be achieved by considering the transfer function F(ω) from the input port to the center of the ADL. It can be expressed as the superposition of N phase-retarded acoustic waves generated by the transducer unit cells. Assuming lossless propagation, each term in F(ω) can have three phase delays: the one due to the propagation over a distance $d_c$ from the TC to the right edge of each unit cell, the phase delay from the right edge of each unit cell to the right edge of the entire input transducer, and the phase delay from the right edge of the input transducer to the center of the delay line, over a distance $L_G/2$. This can be expressed as:

$$F(\omega) = \sum_{n=1}^{N} e^{-j(\beta_t d_c + \beta_t \lambda_0 (n-1) + \beta_\infty L_G/2)} \quad (25)$$

where $\beta_t = \omega/v_t$ is the average wave number within the unit cell. The phase of F(ω) can be calculated at least by using Euler's identity as $$\angle F(\omega) = -\frac{\omega L_G}{2 v_\infty} - \frac{\omega d_c}{v_t} - \arctan\left(\frac{\sin(N\lambda_0\omega/v_t)}{\cos(N\lambda_0\omega/v_t)-1}\right) + \arctan\left(\frac{\sin(\lambda_0\omega/v_t)}{\cos(\lambda_0\omega/v_t)-1}\right). \quad (26)$$

By reciprocity and symmetry of the transducers, this can also be equal to the phase shift experienced by a signal from the center of the ADL to the output port. Thus, the total group delay at $f_0$ can be obtained as $$\tau_g(f_0) = -2\frac{d\angle F(\omega)}{d\omega}\bigg|_{\omega=\omega_0} = \frac{L_G}{v_\infty} + \frac{2d_c}{f_0\lambda_0} + \frac{N-1}{f_0}. \quad (27)$$

The first term is the delay introduced by the gap $L_G$ between transducers. The second and third terms correspond to the wave propagation within the transducers.

Figure 7:
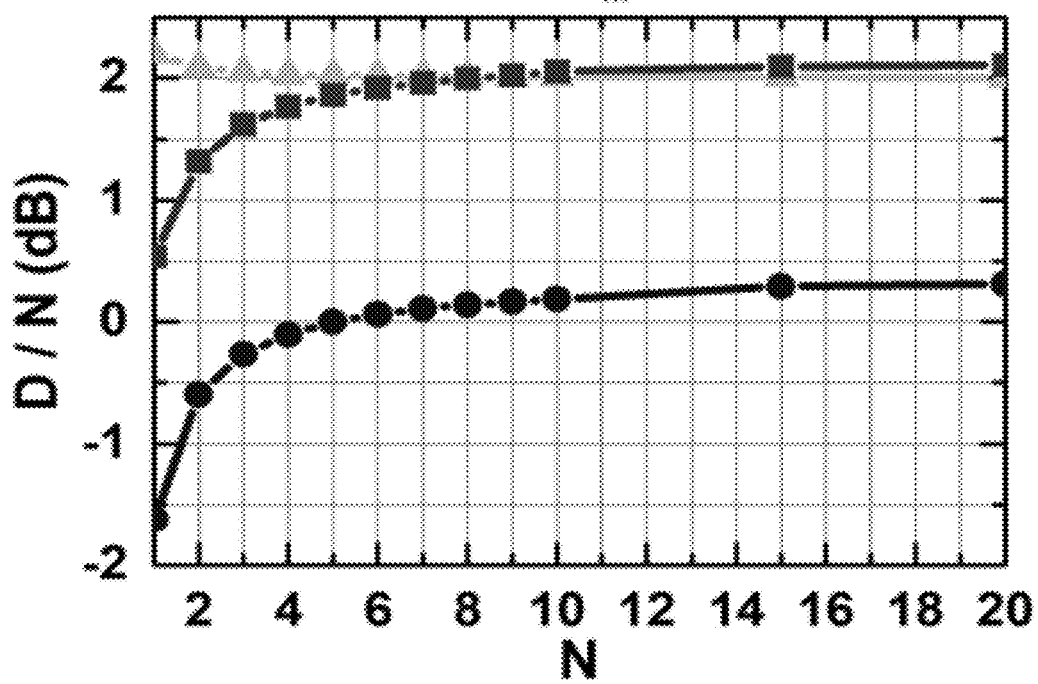
FIG. 7 is a graph illustrating FEM simulated overall directionality per unit cell (D/N), and calculated directionality per unit cell due to electrical ($D_e$/N) and mechanical ($D_m$/N) reflections, according to one embodiment.

FIG. 7 is a graph illustrating FEM simulated overall directionality per unit cell (D/N), and calculated directionality per unit cell due to electrical ($D_e$/N) and mechanical ($D_m$/N) reflections, according to one embodiment. A COMSOL-based FEM model of a unidirectional transducer can be built to more precisely predict the directionality as a function of the number of transducer unit cells. The directionality per transducer unit cell can be simulated for an EWC transducer formed by 100 nm of Au for different values of N. The results are shown in FIG. 7. Theoretically, this value can be predicted from Eq. (23) as $$D/N \text{ (dB)} = \left(\frac{1+|\Gamma|}{1-|\Gamma|}\right). \quad (28)$$

It should be noted that, contrary to Eq. (28), the simulated D/N can show a dependence on N for low values of N. This can be explained by fringe effects in the transducer, which can make the transducer unit cells close to the edges present a smaller directionality than those cells located in the middle of the transducer. To gain insight into this phenomenon, additional simulations can be performed. In the first simulation, zero thickness electrodes can be used to obtain the directionality, $D_e$ due to electrical reflections. In the other embodiments, in FIG. 7, a pure solid mechanical simulation can be performed, disregarding the piezoelectricity, in order to obtain the directionality, $D_m$ due to the mechanical reflections. In such an embodiment, the excitation can be performed by harmonic y-axis forces on the signal electrodes. From these results, it can be seen that, first, the mechanical reflections can be dominant for high values of N. Second, the fringe effects can primarily pertain to the electrical part of the reflections due to the distorted electric field distribution near the transducer edges. Third, the electrical reflection coefficient approximated by Eq. (13) may be overestimated. A directionality of 2.1 dB per transducer unit cell can be deduced for EWC transducers with many cells. The total reflection coefficient can be indirectly obtained from Eq. (28) as $|\Gamma^{EWC}|=0.24$. With the same method, the reflectors in DART transducers show $|\Gamma^{DART}|=0.17.$ j $Z_\infty$ $\tan(\theta_m/2)$.

Figure 8:
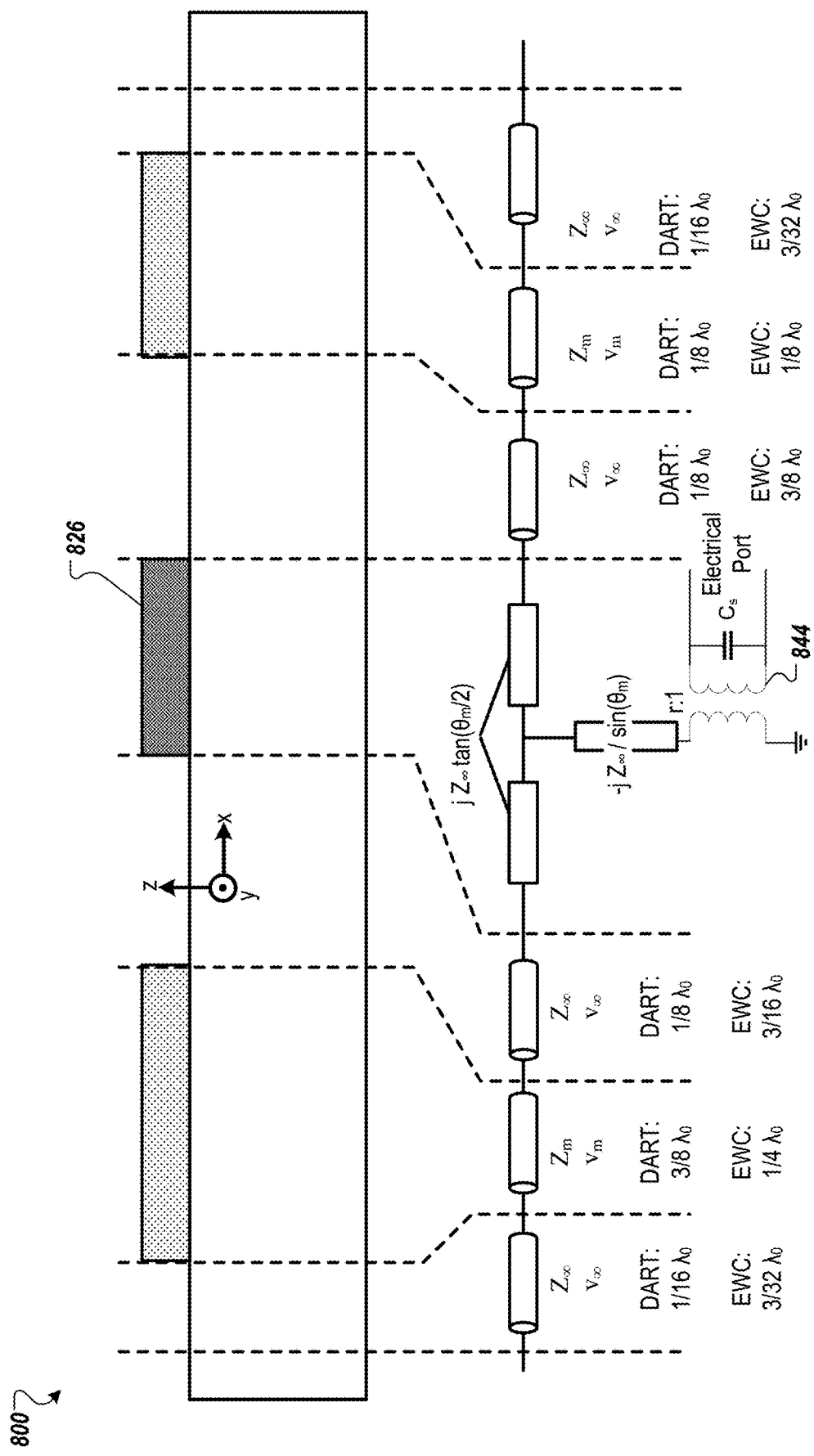
FIG. 8 is a schematic diagram illustrating a sectional Mason's model for a single unit cell, according to one embodiment.

FIG. 8 is a schematic diagram illustrating a sectional Mason's model 800 for a single unit cell, according to one embodiment. Each uniform portion of the unit cell is represented by an acoustic transmission-line section. The acoustic impedance, phase velocity, and length of each section are labeled with symbols. To predict the response of the described ADLs with intricacies that may have been omitted in the closed-form analysis, an equivalent circuit model can be used. This method, based on Mason's model, can employ a 1D discretization of the ADL by representing each transducer unit cell of the transducers with a sectional equivalent circuit. The schematic of the implemented model for a single transducer unit cell can be found in FIG. 8. Each section with uniform properties can be modeled by a transmission line. The phase velocities for the un-metalized and metalized sections can be calculated in COMSOL as $v_\infty=4507$ m/s and $v_m=2958$ m/s. The reflections due to the discontinuities can be modeled by the different characteristic impedances of the sections representing metallized and un-metallized LiNbO$_3$, respectively $Z_m$ and $Z_\infty$. The ratio can be calculated as $$\frac{Z_m}{Z_\infty} = \frac{1+\Gamma_{\infty m}}{1-\Gamma_{\infty m}}, \quad (29)$$

where $\Gamma_{\infty m}$ is the reflection coefficient for an acoustic wave passing from un-metallized to metallized LiNbO$_3$. The reflection coefficient of an electrode can be approximated as a sum of two reflections at the step-up and step-down discontinuities, assuming small reflections. Given the width of the reflectors, these reflections may be in quadrature for DART and in-phase for EWC. Thus, it can be deduced that $$\Gamma^{DART}_{\infty m} = \frac{1}{\sqrt{2}} |\Gamma^{DART}|, \quad (30)$$

$$\Gamma^{EWC}_{\infty m} = \frac{1}{2} |\Gamma^{EWC}|, \quad (31)$$

The lengths of the transmission line sections are labeled in FIG. 8 for both the DART and EWC designs. The transduction section, which may include the signal electrode 826, can be modeled as a T-shaped network with an ideal transformer 844 connecting to the electrical port. The transformation ratio can be determined by the electromechanical coupling and is given by $$r = \sqrt{2\pi f_0 C_s k^2 Z_m}, \quad (32)$$

where $C_s$ represents the static capacitance per transduction unit cell. From an electrostatic simulation in COMSOL, $C_S/W_A=250$ aF/μm can be calculated for an 800 nm-thick LiNbO$_3$ film, where $W_A$ is the acoustic aperture (e.g., see FIG. 2A). The value for the electromechanical coupling $k^2$ can be assumed to be 40%. Note the ratio $Z_m/Z_\infty$ defines the reflections, but the value of $Z_\infty$ (or $Z_m$) may be irrelevant for the electric response. Hence, $Z_\infty=1$ can be taken. The angle $\theta_m$ can be obtained as $$\theta_m = \frac{\pi}{4} \frac{f \lambda_0}{v_m} \quad (33)$$

for both DART and EWC transducers.

Figure 9A:
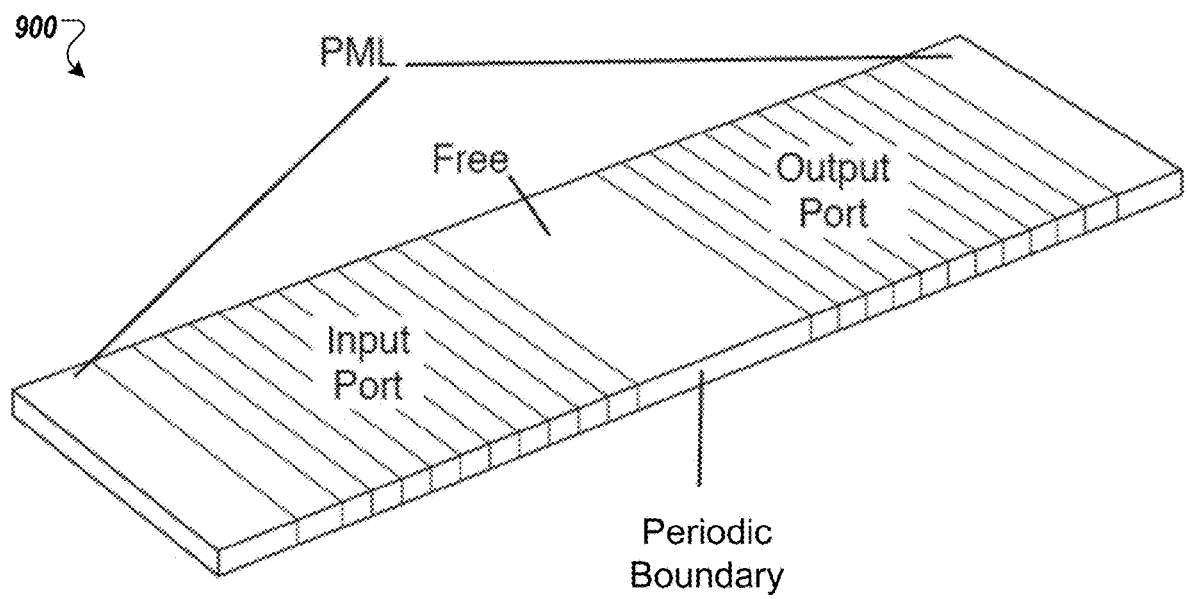
FIG. 9A is a schematic diagram illustrating a finite element method (FEM) model built in COMSOL to simulate the response of the ADLs to validate the circuit model of FIG. 8 according to one embodiment.

FIG. 9A is a schematic diagram illustrating an FEM model 900 built in COMSOL to simulate the response of the ADLs to validate the circuit model 800 of FIG. 8 according to one embodiment. A 3D model 900 for an ADL with EWC transducers that has N=10, $\lambda_0=20$ μm, $W_A=200$ μm, and $L_G=120$ μm is shown in FIG. 9A.

Figure 9B:
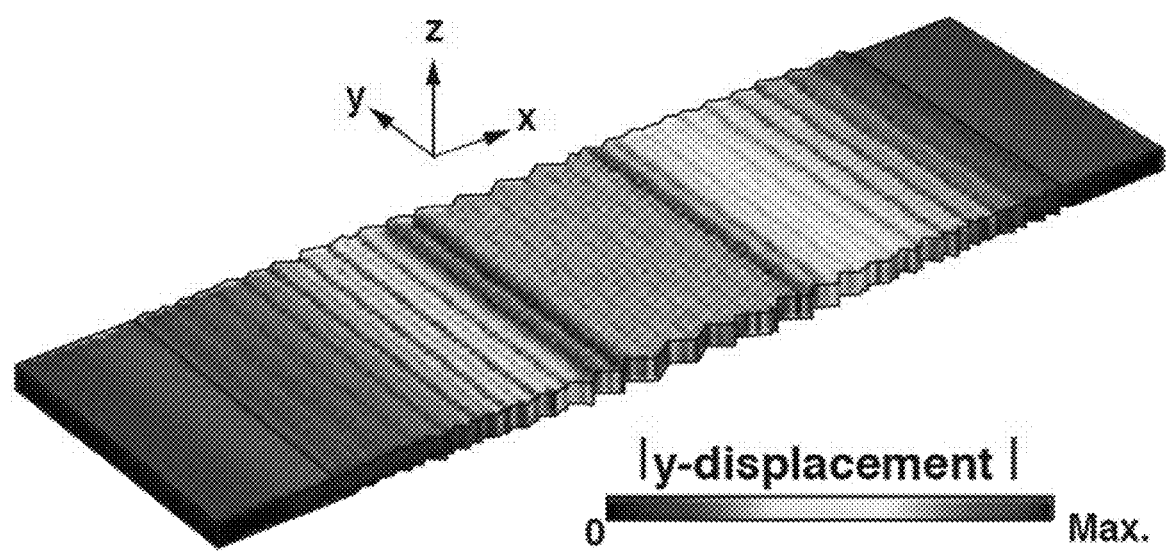
FIG. 9B is a schematic diagram illustrating a magnitude of a displacement along the y-axis at the center frequency according to one embodiment.

FIG. 9B is a schematic diagram illustrating a magnitude of a displacement along the y-axis at the center frequency according to one embodiment. With all the parameters defined, a model for a complete transducer can be built by concatenating the models of its unit cells. The unit cells can be connected in series in the acoustic domain, and in parallel in the electrical domain to form the electrical port of the transducer. A complete ADL can be simulated by connecting the models of two transducers in the acoustic domain with their FWD ports facing each other. The gap between the transducers can be modeled by an acoustic transmission line with characteristic impedance $Z_\infty$, phase velocity $v_\infty$ and length $L_G$. To ensure no reflection at the BWD acoustic ports of both transducers, these can be terminated by an impedance $Z_\infty$.

Figure 10:
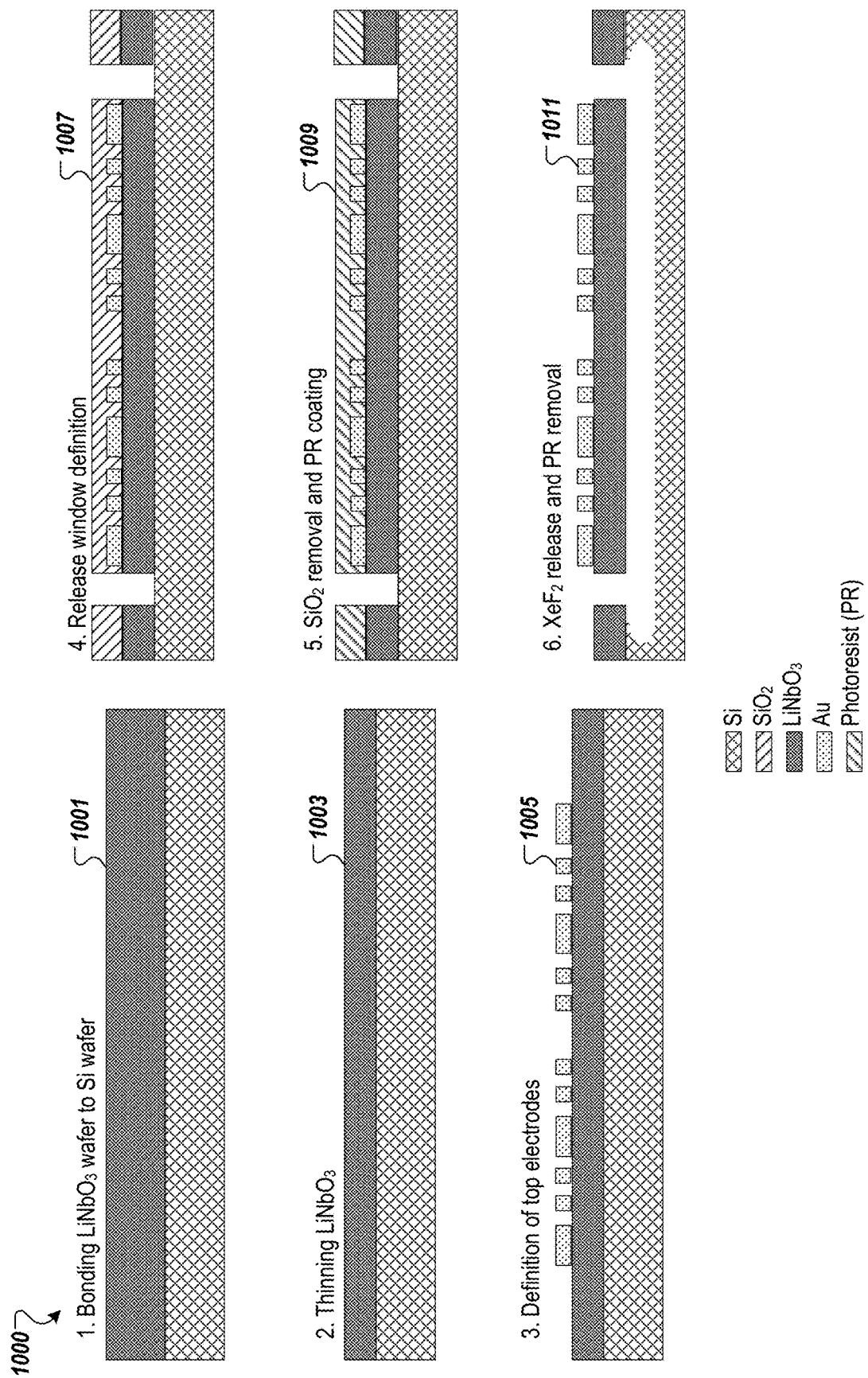
FIG. 10 is a flow chart of a fabrication process of the ADL according to one embodiment.

FIG. 10 is a flow chart of a fabrication process 1000 of the ADL according to one embodiment. Guided by the reflectivity analysis presented previously, as an illustrative example, Au can be chosen as the material for the electrodes, with a thickness of 100 nm. Further, a Z-cut LiNbO$_3$ thin film can be chosen as the propagation medium since this platform can demonstrate high coupling and low loss for SH0 waves. Table 1 below lists possible parameters of the implemented ADL designs.

TABLE 1

DESIGN PARAMETERS OF THE FABRICATED ACOUSTIC DELAY LINES

| ID | Type of Transducers | N | $L_G$ (μm) | $\lambda_0$ (μm) | $W_A$ (μm) | $\tau_g$ (μs) |
|---|---|---|---|---|---|---|
| 1 | DART | 10 | 120 | 20 | 200 | 79 |
| 7 | DART | 10 | 500 | 20 | 200 | 164 |
| 3 | DART | 10 | 1000 | 20 | 200 | 274 |
| 4 | DART | 15 | 120 | 20 | 200 | 106 |
| 5 | DART | 15 | 500 | 20 | 200 | 190 |
| 6 | DART | 20 | 120 | 20 | 200 | 132 |
| 7 | DART | 20 | 500 | 20 | 200 | 217 |
| 8 | EWC | 10 | 120 | 20 | 200 | 79 |
| 9 | EWC | 10 | 1000 | 20 | 200 | 274 |
| 10 | EWC | 15 | 120 | 20 | 200 | 106 |
| 11 | EWC | 20 | 120 | 20 | 200 | 132 |
| 12 | EWC | 20 | 1500 | 20 | 200 | 439 |
| 13 | DART/Bid (FWD) | 10 | 120 | 20 | 200 | |
| 14 | DART/Bid (BWD) | 10 | 120 | 20 | 200 | |
| 15 | EWC/Bid (FWD) | 10 | 120 | 20 | 200 | |
| 16 | EWC/Bid (BWD) | 10 | 120 | 20 | 200 | |

ADLs 1-12 can be designed to sweep the main design parameters as a way to characterize the propagation loss in the LiNbO$_3$ film, as well as the loss associated with the transducers, for a constant center frequency, $f_0$, and acoustic aperture, $W_A$. The expected group delays according to Eq. (27) are also listed in Table 1. ADLs 13-16 are example test structures to characterize the directionality of DART and EWC transducers formed by 10 cells. These ADLs can be formed by a SPUDT transducer and a bi-directional transducer with regular-width electrodes. In the bi-directional transducer, each period of $\lambda_0$ contain 54 electrodes of width $\lambda_0/8$ to minimize reflections. In general, a distance between a center of a first electrode and a center of a second electrode (e.g., a distance between a ground electrode and an adjacent signal electrode) is greater than a width of each of the electrodes and also less than twice the width. The electrodes can be connected in the sequence of 'ground-ground-signal-signal' to have the same center frequency as the SPUDT. In addition, both transducers may be of the same length in order to have similar bandwidths. In ADLs 13 and 15, the FWD acoustic ports of the SPUDTs are facing the bi-directional transducers. In ADLs 14 and 16, the BWD acoustic ports of the SPUDTs are facing the bi-directional transducers.

The sixteen ADLs listed in Table 1 can be fabricated on a single chip with the fabrication process 1000. The film transfer process can involve two steps. In the first step, an X-cut $LiNbO_3$ wafer can be bonded to a Si carrier wafer (1001). Second, the bonded $LiNbO_3$ layer can be thinned down to a thickness of 800 nm or other appropriate thickness (1003). Next, the 100 nm-thick Au electrodes can be defined with sputter-deposition and lift-off (1005). Then, the release windows can be defined, e.g., through etching (1007). For this purpose, a 1 μm-thick hard mask of $SiO_2$ can be created by plasma-enhanced chemical vapor deposition (PECVD) and can be patterned with fluorine-based reactive ion etching (RIE). The release windows in the $LiNbO_3$ film can then be etched by chlorine-based inductive coupled plasma (ICP)-RIE before the $SiO_2$ is removed with a buffered oxide etch (BOE). To prevent the Au electrodes from being exposed to $XeF_2$ and etched in the device release step, a photoresist (PR) can be spun and patterned to protect the electrodes and leave the release windows exposed (1009). The ADLs can then be released by isotropic $XeF_2$ etching, and the PR removed with acetone (1011).

FIG. 11A are optical top-view images 1101 and 1103 of ADLs 1 and 8 according to one embodiment. The ADLs 1 and 8 can be fabricated using the fabrication method 1000 as described with respect to FIG. 10.

FIG. 11B are optical images 1105 and 1107 of SPUDT ADLs 13 and 14 (Table 1) according to one embodiment. Both ADLs 13 and 14 are designed to test the directionality of the DART SPUDT for SH0 waves in $LiNbO_3$. The S-parameters of all the fabricated devices can be characterized using a network analyzer (e.g., such as a Keysight performance network analyzer PNA-XN5249A or the like) at room temperature. The measured data can then be normalized to a matching complex port impedance in an advanced design software (ADS) to extract the IL over the transmission bands. In implementation, the impedance matching to 50Ω can be done with an inductor-capacitor (LC) matching network with sufficient bandwidth. The ADLs can present bandwidths under 15%. Matching networks with LC circuits can be implemented to cover such bandwidths, given the high $k^2$ of the SH0 waves in $LiNbO_3$ thin films.

Figures 12A, 12B:
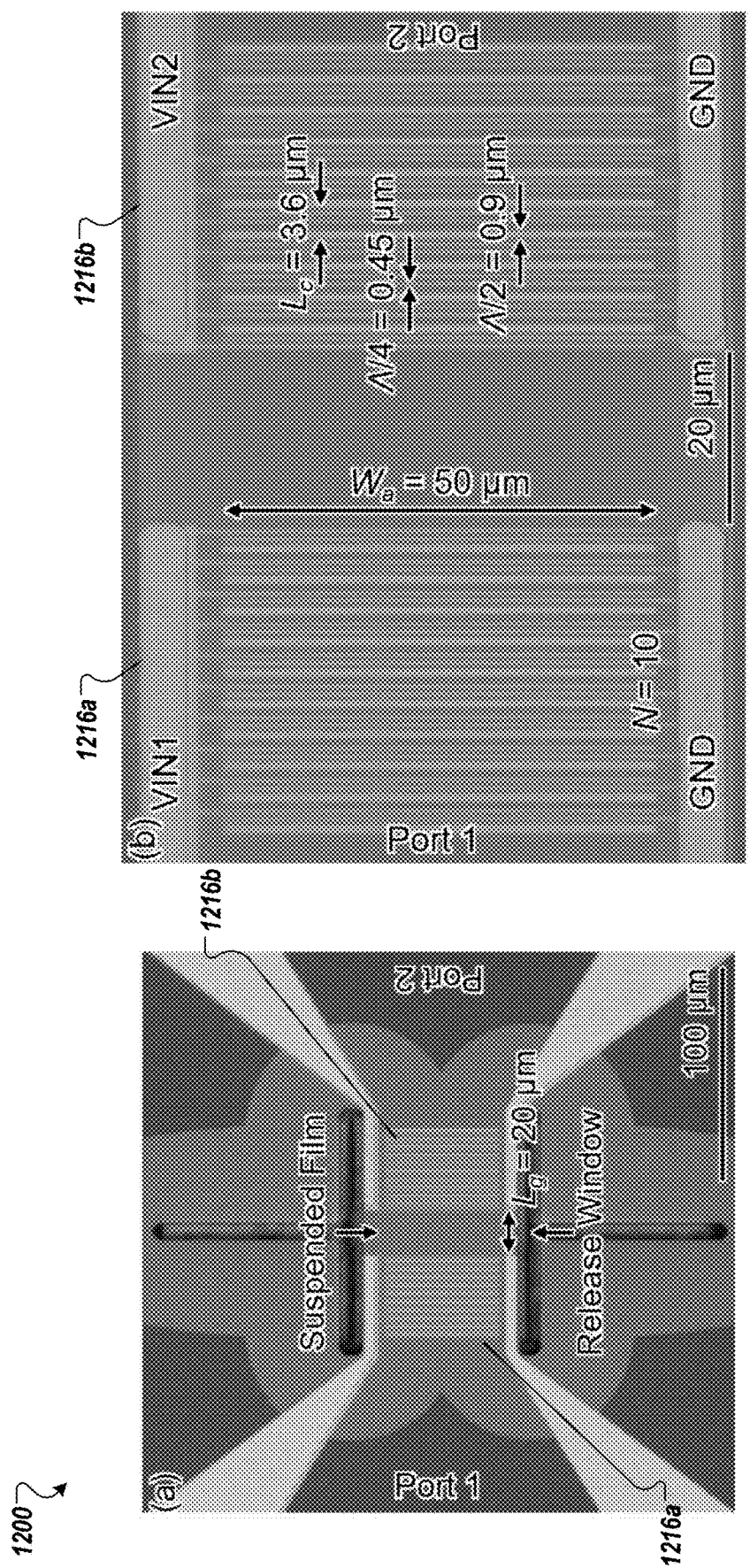
FIG. 12A is an optical image of an ADL with a pair of SPUDTs according to one embodiment.
FIG. 12B is an zoomed-in view of the ADL of FIG. 12A according to one embodiment.

FIG. 12A is an optical image of an ADL 1200 with a pair of SPUDTs 1216a and 1216b according to one embodiment. The ADL 1200 shown in FIG. 12A can be an example, such as the ADL 200b of FIG. 2B.

FIG. 12B is an zoomed-in view of the ADL 1200 of FIG. 12A according to one embodiment. In the depicted embodiment, values for $L_c$ can be 3.6 μm, for quarter wavelength can be 0.45 μm, for half wavelength can be 0.9 μm, and for $W_a$ can be 50 μm. In other embodiments, at least some of these values can differ according to the principles disclosed herein.

The next generation radio access technology, namely the fifth generation (5G) New Radio (NR), may require unprecedented signal processing capabilities. More specifically, the enhanced mobile broadband (eMBB), as one 5G NR usage scenario targeting a thousand-fold increase in the mobile data volume per unit area, is calling for novel wideband signal processing functions at the radio frequency (RF). Acoustic signal processing, where the electromagnetic (EM) signals are converted and processed in the acoustic domain, may be promising for providing chip-scale, low-loss, and wideband capabilities. First, acoustic devices feature miniature sizes because of the significantly shorter acoustic wavelengths (λ) compared to the EM counterparts, desirable for mobile applications with small footprint. Second, various signal processing functions can easily be passively implemented by designing and interconnecting acoustic devices, which does not compete against the analog-to-digital converters (ADC) or digital signal processors (DSP) for the stringent power budget in RF front-ends. Third, the recent demonstrations of low-loss and high electromechanical coupling ($k^2$) piezoelectric platforms may enable devices with lower insertion loss (IL) and wider fractional bandwidth (FBW), thus potentially overcoming the performance bottlenecks that currently hinder acoustic signal processing from eMBB applications.

Among various types of ADLs can have diverse applications ranging from transversal filters and correlators to oscillators, sensors, and amplifiers, alongside the recent prototypes of time domain equalizers and time-varying non-reciprocal systems. In some embodiments, ADLs can be built upon surface acoustic wave (SAW) platforms. Despite their success in applications below 2 GHz, two main drawbacks can hinder the broad adoption of SAW ADLs for eMBB applications. First, their moderate $k^2$ may fundamentally limit the design trades in IL versus FBW. In other words, it can be challenging to achieve wide FBW without inducing substantial IL. Second, due to their slow phase velocity ($v_p$), it may be challenging to scale the operation frequency above 3 GHz for the planned eMBB bands unless narrow electrodes (<300 nm), thin films on costly substrates, or intrinsically high damping modes are adopted.

In one embodiment, an ADL may have low loss and wide bandwidth using the fundamental shear horizontal (SH0) mode and fundamental symmetrical (S0) mode in suspended single crystal $LiNbO_3$ thin films enabled by the thin film integration techniques. Compared with ADLs on other piezoelectric thin films, these demonstrations may feature lower IL and larger FBW due to the simultaneously high $k^2$ and low damping of S0 and SH0 modes in $LiNbO_3$. Nevertheless, it may remain challenging to scale them above 3 GHz without resorting to narrow electrodes and ultra-thin films (<300 nm), which may be undesirable in terms of fabrication complexity and mostly lead to spurious modes that limit the achievable FBW. Therefore, a new piezoelectric platform with simultaneously high $v_p$, large $k^2$, and low-loss is sought after for potential eMBB applications.

In some embodiments, acoustic devices may use the first-order antisymmetric (A1) mode in Z-cut $LiNbO_3$, which may have high electromechanical coupling, $k^2$, and low loss above 4 GHz. Different from SH0 and S0, A1 is higher order in the thickness direction, and thus may significantly enhance $v_p$ in the in-plane dimensions and improve frequency scalability. However, the highly dispersive nature of the A1 mode may present new challenges in designing the ADL. Design principles for S0, SH0, and SAW ADLs may have to be revisited and substantially modified for A1 ADLs. Moreover, the notable cut-off in A1 may confine acoustic waves between the input transducers and may prevent their propagation towards the output port. Such effects may be especially pronounced in the presence of metallic electrodes, and thus have to be analyzed and circumvented for successful implementation of A1 ADLs.

To overcome these hurdles, a comprehensive framework is provided for analyzing the relevant parameters and propagation characteristics of A1 waves in Z-cut LiNbO$_3$ thin films and subsequently implement wideband and high-frequency A1 ADLs. The fabricated ADLs show a minimum IL of 7.94 dB, an FBW of 6%, delays ranging between 15 ns to 109 ns, and the center frequencies between 4.5 GHz and 5.25 GHz.

As described above in FIGS. 2A-2D, which are schematic illustrations of A1 ADLs on a suspended Z-cut LiNbO$_3$ thin film. In some embodiments, the piezoelectric thin film is a Z-cut LiNbO$_3$ thin film 5104 adapted to propagate an acoustic wave in at least one of a first-order antisymmetric (A1) mode, a fundamental shear-horizontal (SH0) mode, a third-order antisymmetric (A3) mode, or a second-order symmetric (S2) mode excited by an electric field oriented in a longitudinal direction along a length of the piezoelectric thin film.

In some embodiments, the piezoelectric thin film may be suspended above the carrier substrate. In other embodiments, the piezoelectric thin film may be disposed on a high acoustic impedance layer interposed between the piezoelectric thin film and the carrier substrate and the high acoustic impedance carrier layer composed of at least one of silicon (Si), sapphire, fused silica, quartz, silicon carbide (SiC), diamond, aluminum nitride (AlN), or aluminum oxide (Al$_2$O$_3$), tungsten, molybdenum, platinum, or combinations thereof. In other embodiments, the piezoelectric thin film may be disposed on a Bragg reflector interposed between the piezoelectric thin film and the carrier substrate and the Bragg reflector may be composed of a plurality of alternating layers including a first layer with a first acoustic impedance (e.g., high acoustic impedance layer) and a second layer with a second acoustic impedance (e.g., low acoustic impedance layer), wherein the second acoustic impedance may be lower than the first acoustic impedance.

In some embodiments, the ADL can include a waveguide inside of which is disposed the piezoelectric thin film, the first IDT, and the second IDT, a first port coupled to the first IDT, and a second port coupled to the second IDT. The first port can be to receive the first electromagnetic signal and, the second port can be to output the second electromagnetic signal.

The ADL may include 30 nm-thick aluminum interdigitated transducers (IDTs) on top of a suspended 490-nm Z-cut LiNbO$_3$ thin film, in one embodiment. In other embodiments, the thin film thickness can be between 30 nm to 100 μm. The thickness of LiNbO$_3$ can be selected for enabling wide-band operation at 5 GHz.

A pair of bi-directional transducers can be placed on opposite ends of the ADL. The transducers may be composed of N pairs of cascaded transducer unit cells. Each cell can have a length of λ, over which situates a pair of transduction electrodes (each λ/4 wide) with separations of λ/4 in between. The in-plane orientation of the device is shown in FIG. 2, with the material's X-axis that may be along the wave propagation direction (e.g., longitudinal direction). Free boundaries, e.g., etch windows, may be in the transverse direction for defining the acoustic waveguide. In operation, the RF signals may be sent to Port 1 and converted into acoustic waves through the piezoelectric transducers. The launched acoustic waves can propagate towards both ends, and therefore can send half of the power towards Port 2. The other half may be lost in the attenuation and scattering into the substrate. Similarly, after traversing through the waveguide with a gap length of L$_g$, only half of the power launched towards Port 2 may be collected, which may cause a minimum IL of 6 dB. Various acoustic signal processing functions can be passively implemented through designing the transducers and the waveguide. The 6-dB IL from the bi-directional transducers can be effectively reduced using unidirectional transducers with smaller feature sizes. An implementation of the first groups A1 ADLs using bi-directional transducers is described by way of illustrative example.

Figures 13A, 13B:
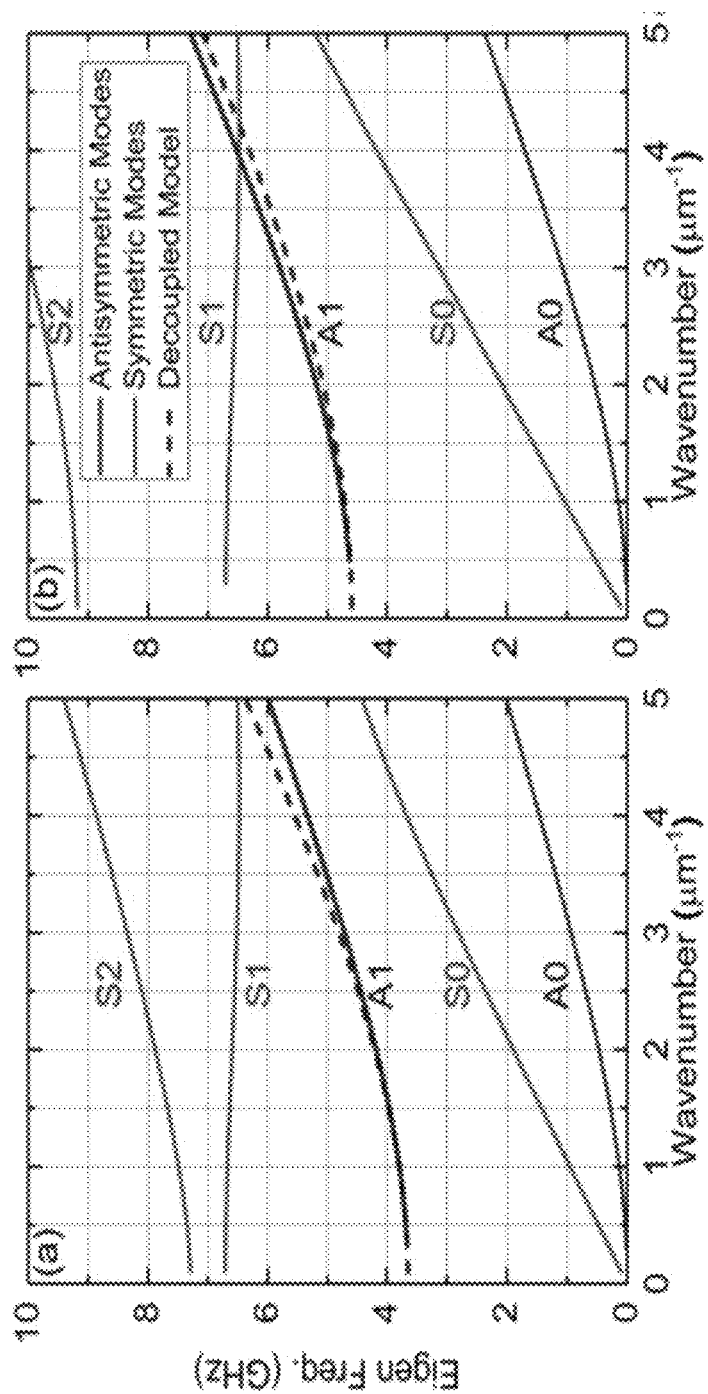
FIGS. 13A-13B are a set of graphs illustrating solutions of Lamb waves in a 490 nm Z-cut LiNbO$_3$ thin film under isotropic and quasi-static approximations for A0, S0, A1, S1, and S2 modes, according to one embodiment.

FIGS. 13A-13B are a set of graphs illustrating solutions of Lamb waves in a 490 nm Z-cut LiNbO$_3$ thin film under isotropic and quasi-static approximations for A0, S0, A1, S1, and S2 modes, according to one embodiment. In particular, FIG. 13A illustrates the solutions under electrically short boundary conditions. FIG. 52B illustrates the solutions under electrically open boundary conditions.

Considering a piece of Z-cut LiNbO$_3$ waveguide (XZ plane) with infinite length in the Y direction, the wave propagation problem may be treated as a two-dimensional (2D) problem. Because of the planar geometry, the transverse resonance method can be used to solve the 2D vibration. In such a method, the modal solutions can be decomposed into the traveling waves along the waveguide direction and the resonant standing waves in the transverse direction. The approach can be shown for both the acoustic and the EM cases. For a lossless and isotropic plate with mechanically free boundary conditions on the top and bottom surfaces, the symmetric and antisymmetric solutions can be analytically expressed using the Rayleigh-Lamb frequency equations:

$$\frac{\tan(k_{ts} \cdot t/2)}{\tan(k_{tl} \cdot t/2)} = -\left(\frac{4\beta^2 k_{ts} k_{tl}}{(k_{ts}^2 - \beta^2)^2}\right)^{\pm 1} \tag{34}$$

where $$k_{tl}^2 = (\omega/v_l)^2 - \beta^2 \tag{35}$$

$$k_{ts}^2 = (\omega/v_s)^2 - \beta^2, \tag{36}$$

and k$_{tl}$ and k$_{ts}$ are the transverse wavenumbers for the longitudinal and shear modes. t is the film thickness, β is the longitudinal wavenumber, and ω is the angular frequency. v$_l$ and v$_s$ are the velocities of the longitudinal and shear modes, respectively. In Eq. (34), the "+" and "−" are used to denote Lamb wave solutions of symmetrical and antisymmetric modes, respectively. Note that Eqs. (34)-(36) may be more complex than those for a rectangular EM waveguide because the longitudinal and shear acoustic waves can co-exist in the waveguide and mode conversion happens at the top and bottom surfaces.

Although solutions for Lamb waves in an isotropic media can be solved using Eqs. (34)-(36), the solutions in anisotropic piezoelectric thin films (e.g., LiNbO$_3$) may be difficult to attain analytically unless certain acoustic modes along particular crystal orientations are studied. Finite element analysis (FEA) is one alternative for solutions. However, it may not provide straightforward insights into the principles of A1 propagation. To this end, two approximations may be introduced for a simplified model. The first one is the isotropic assumption in which the in-plane and out-of-plane stiffness constants are deemed the same for LiNbO$_3$. The second assumption is the quasi-static approximation, in which the electric field is assumed to have zero curl (e.g., the electric field is assumed to be irrotational). Therefore, $v_l$ and $v_s$ in a plate with electrically short boundary conditions on both top and bottom surfaces can be approximated by:

$$v_l \approx \sqrt{c_{11}^E/\rho} \quad (37)$$

$$v_s \approx \sqrt{c_{44}^E/\rho} \quad (38)$$

where $c_{11}^E$ and $c_{44}^E$ are stiffness constants, and $\rho$ is the material density. For single crystal LiNbO$_3$, $c_{11}^E$ is $2.03 \times 10^{11}$ N/m$^2$, $c_{44}^E$ is $$0.60 \times 10^{11} \frac{N}{m^2},$$

and $\rho$ is 4700 kg/m$^3$. By solving Eqs. (34)-(38) for t=490 nm, the estimated Lamb wave dispersion curves are attained and plotted in FIG. 13A for the electrically short case. The A1 mode of interest is the second group of antisymmetric solutions, which may be at higher frequencies than the fundamental antisymmetric mode (A0) mode with the same $\beta$. A1 may exhibit a cut-off frequency, below which A1 waves may not have purely real $\beta$. In other words, only evanescent A1 waves, which attenuate exponentially with distance, may exist below $f_{c\_short}$ in LiNbO$_3$ with the electrically short surface.

Similarly, the dispersion curves in a piezoelectric slab with electrically open boundary conditions can be calculated using the piezoelectrically stiffened elastic constants $c_{ij}'$, as:

$$c_{ij}' = [c_{ijkl}^E + (e_{pij}e_{qkl}n_p n_q)/(\varepsilon_{rs}^s n_r n_s)] n_j n_l \quad (39)$$

where r, j, k, l, p, q are the indices of the Cartesian coordinate system, n is the unit vector, and, e, $\varepsilon^s$ are the piezoelectric and dielectric constants, respectively. Eq. (39) describes that the material stiffening due to the piezoelectric effect can depend on the piezoelectric constants. For LiNbO$_3$, $c_{11}'$ is $2.19 \times 10^{11}$ N/m$^2$, and $c_{44}'$ is $0.95 \times 10^{11}$ N/m$^2$. By replacing the corresponding $c^E$ with c' in Eqs. (37)-(38), Lamb wave dispersion curves are attained and plotted in FIG. 13B for the electrically open case. Likewise, a cut-off frequency $f_{c\_open}$ can be observed. For a given $\beta$, A1 is at higher frequencies compared to the previous case FIG. 13A due to stiffening.

Eqs. (34)-(39) can still be cumbersome for follow-on analysis of A1 ADLs. Therefore, an additional assumption can be introduced to decouple longitudinal and shear waves in A1. The dispersion of A1 can then be approximated by:

$$\omega_2 = (2\pi f_c)^2 + \beta^2 \cdot v_l^2 \text{ or } f^2 = f_c^2 + v_l^2/\lambda^2 \quad (40)$$

$$f_c = v_s/(2t) \quad (41)$$

where f is the frequency, $\lambda$ is the wavelength, and $v_{l\_short}$ and $v_{l\_open}$ are the longitudinal wave velocities of respective cases. For a 490 nm Z-cut LiNbO$_3$ thin film $f_{c\_short}$ is 3.64 GHz, $v_{l\_short}$ is 6572 m/s $f_{c\_open}$ is 4.59 GHz, and $v_{l\_open}$ is 6795 m/s. The dispersion curves are plotted in FIGS. 13A-13B and compared with the results attained without the last assumption. The good agreement indicates that the model is adequate for A1 at small thickness-wavelength ratios (t/$\lambda$).

From Eqs. (40)-(41), it is clear that the film thickness t determines the dispersion of A1. For a 5 GHz center frequency, t can be to be neither too small (450 nm for $f_{c\_open}$ at 5 GHz) to avoid the cut-off, nor too large (670 nm for a $\lambda$ of 1.6 µm at 5 GHz for electrically short) to avert small feature sizes. Thus, 490 nm can be chosen as a trade-off.

Figure 14A:
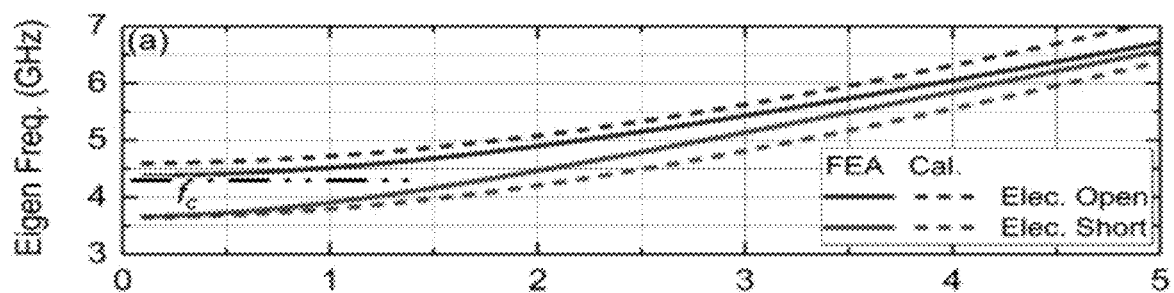
FIGS. 14A-14D are a set of graphs illustrating various characteristics of A1 with different β in a 0.49-μm-thick Z-cut LiNbO$_3$ thin film, obtained from both FEA and the simplified model according to one embodiment.
Figure 14B:
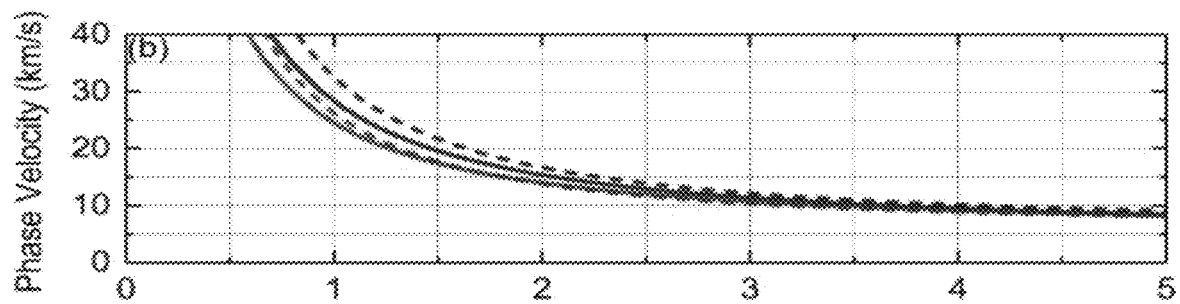
Figure 14C:
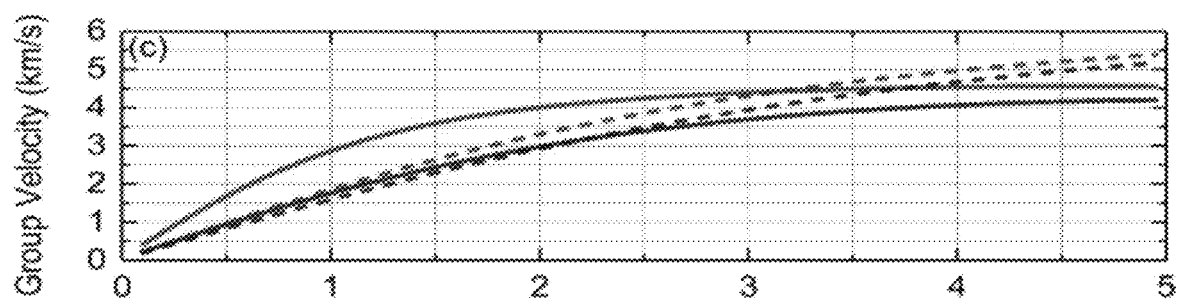
Figure 14D:
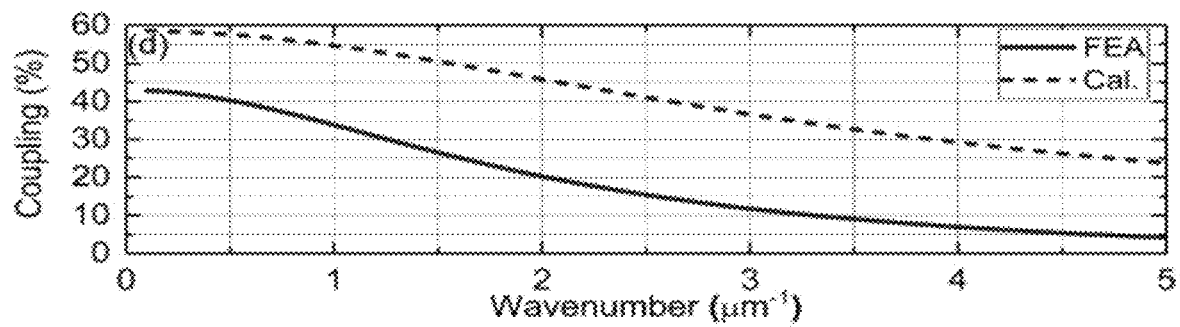

FIGS. 14A-14D are a set of graphs illustrating various characteristics of A1 with different $\beta$ in a 0.49-µm-thick Z-cut LiNbO$_3$ thin film, obtained from both FEA and the simplified model according to one embodiment. FIG. 14A illustrates the eigenfrequency. FIG. 14B illustrates $v_p$ with electrically open and electrically short boundary conditions. FIG. 14C illustrates $v_g$ with electrically open and electrically short boundary conditions. FIG. 14D illustrates k$^2$ at different wavenumbers.

To validate the simplified model and obtain more accurate properties of A1, eigenmode FEA can be set up in COMSOL for a 490 nm Z-cut LiNbO$_3$ thin film section with a width (the +X direction) of $\Lambda$. Periodic boundary conditions can be applied to the XZ and YZ planes in both the electrical and mechanical domains. The top and bottom surfaces (XY planes) can be set to be mechanically free. The electrical boundary conditions are set to be electrically open and short, respectively. The simulated A1 dispersion curves (with different $\beta$) are presented in FIG. 14A. Similar to the analytical model, the cut-off phenomenon is also seen, showing an $f_{c\_short}$ of 3.66 GHz and an $f_{c\_open}$ of 4.37 GHz. The eigenfrequency increases for a larger $\beta$, suggesting that the center frequency ($f_{center}$) of A1 devices can be tuned by changing $\lambda$. More specifically, $f_{center}$ can be tuned from 4.5 to 6.0 GHz by changing from 6 µm to 1.5 µm for the electrically open case. In comparison, the simplified model provides a good estimation of A1 properties without resorting to the time-consuming calculation. Therefore, the model will be used in the herein for analyzing the A1 ADL design.

Moreover, based on the eigenmode analysis, the phase velocity $v_p$ and the group velocity $v_g$ are:

$$v_p = \omega/\beta \approx \sqrt{(2\pi f_c/\beta)^2 + v_l^2} \quad (42)$$

$$v_g = \partial\omega/\partial\beta \approx v_l^2/\sqrt{v_l^2 + (2\pi f_c/\beta)^2} \quad (43)$$

The obtained values are plotted in FIG. 14B and FIG. 14C, respectively. A remarkably high $v_p$ over 8000 m/s is obtained for A1 below 6.5 GHz. A low $v_g$ below 4500 m/s is also observed. Moreover, the mode is highly dispersive, and thus may require a careful design for the targeted operation frequency. $v_p$ and $v_g$ calculated from the simplified model using Eqs. (42)-(43) are also plotted, matching the trend of the simulated values. k$^2$ can then be calculated from $v_p$ by:

$$k^2 = (v_{p\_open}^2 - v_{p\_short}^2)/v_{p\_short}^2 \quad (44)$$

where $v_{p\_open}$ and $v_{p\_short}$ are the phase velocities of respective cases. The dispersion curve of k$^2$ is plotted in FIG. 14D. High k$^2$ over 40% can be observed for A1 waves with a long $\lambda$ (or with operation frequencies close to $f_c$). k$^2$ declines for A1 waves at a higher frequency (or with a larger h/$\lambda$). Nevertheless, k$^2$ larger than 10% is obtained for 5.5 GHz devices ($\lambda$ of 2 µm).

With these characteristics of A1 studied, it is apparent that A1 ADLs may be promising for 5G applications for several reasons. First, a high $v_p$ enables high-frequency devices without resorting to narrow electrodes or thin films. Based on FIGS. 14A-14D, it can be feasible to achieve 5 GHz with a 600 nm feature size on 490 nm-thick Z-cut LiNbO$_3$. Second, the slow $v_g$ of A1 (e.g., 3000 m/s at 5 GHz) enables longer delays over the same length in comparison to alternatives with faster $v_g$ (e.g., S0, or SH0), thus permitting a smaller device footprint. Third, large k$^2$ above 5 GHz can overcome conventionally unforgiving trades between IL and FBW, consequently allowing low-loss and wide-band signal processing functions. For example, up to 30% FBW is accessible without significantly increasing IL at 5.5 GHz ($k^2$ of 15%).

Figure 15A:
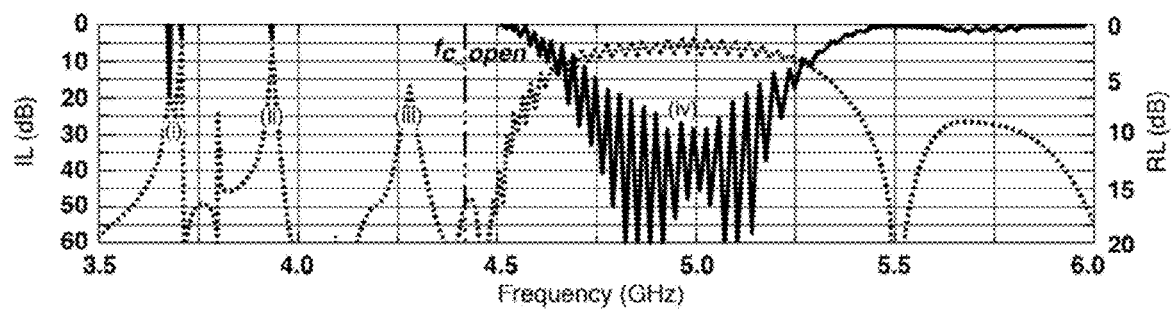
FIG. 15A is a graph illustrating the simulated IL and RL with both ports conjugately matched according to one embodiment.

FIG. 15A is a graph illustrating the simulated IL and RL with both ports conjugately matched according to one embodiment. The evanescent modes in the input transducers are labeled. The typical response of an A1 ADL can be studied using 2D FEA. The 2D FEA may assume that the acoustic waves are plane waves propagating along the X-axis (the longitudinal direction), neglecting the fringe effects near the release windows. The three-dimensional (3D) case will be presented in a subsequent section, emphasizing the in-plane propagation characteristics. Perfectly matched layers (PML) can be applied to the longitudinal ends of the ADL. The simulation assumes lossless conditions in both the electrical and mechanical domains. Note that massless electrodes may be used in the simulation for simplicity, according to an embodiment.

An A1 ADL prototype (cell length=2.4 μm, gap length $L_g$=40 μm, and cell number N=4) can be simulated to showcase its typical frequency domain response. The aperture width of the device (transverse direction, along the Y-axis) can be set as 50 μm. The S-parameters are obtained from the frequency domain FEA and then conjugately matched with 360+j30Ω for both the input and output ports, as shown in 3702, showing a well-defined passband centered around 5 GHz. Such a high operation frequency is as predicted in the eigenmode analysis, validating the choice of 490-nm-thick $LiNbO_3$.

Figure 15B:
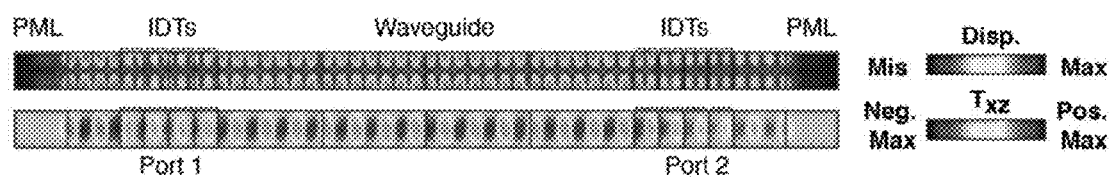
FIG. 15B is a graph illustrating the displacement and $T_{xz}$ stress distribution at the center frequency according to one embodiment.

FIG. 15B is a graph illustrating the displacement and $T_{xz}$ stress distribution at the center frequency according to one embodiment. The displacement mode shape and the stress distribution ($T_{xz}$) at the center frequency are plotted in FIG. 15B. The slight ripples in RL and IL may be caused by triple transit signals (TTS) between the input and output transducers, which are intrinsic to ADLs employing bi-directional transducers.

Different from S0 and SH0 ADLs, the A1 ADL may feature a non-symmetric passband, which is apparent from the side lobes. The non-symmetry may be caused by the cut-off of A1 mode (cut-off frequency of the $LiNbO_3$ thin film with electrically open surfaces, $f_{c\_open}$ labeled in FIG. 15). A1 waves at frequencies below $f_{c\_open}$ may be evanescent. Thus, the amplitude may decay during the propagation towards the output transducers. Below $f_{c\_open}$, the section with the input transducer may be equivalent to an A1 mode resonator. The acoustic impedance difference caused by different electrical boundary conditions may act as reflective boundaries. The resonant modes below $f_{c\_open}$ are marked with (i)-(iii) in the frequency response, as shown in graph FIG. 15A.

Figure 15C:
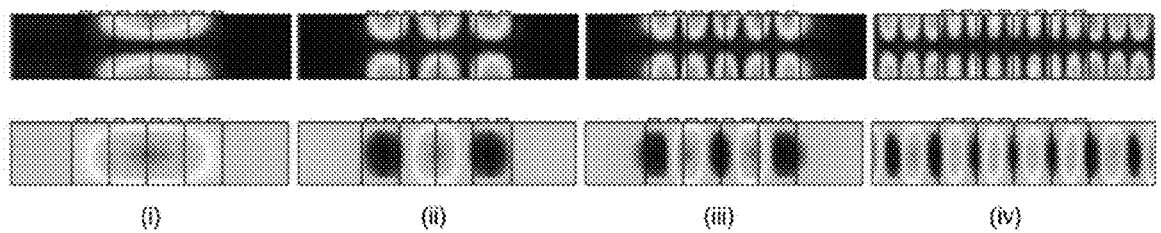
FIG. 15C is a graph illustrating the displacement mode shapes and stress distributions in the input transducers at the marked frequencies according to one embodiment.

FIG. 15C is a graph illustrating the displacement mode shapes and stress distributions in the input transducers at the marked frequencies according to one embodiment. Only odd longitudinal-order A1 resonances may be built up in the input transducer because the charge generated from even-order longitudinal overtones are canceled in a 4-cell transducer. At odd mode resonances, a small portion of the energy build-up in the input transducers may leak to the output port through evanescent coupling. Therefore, resonances in IL and RL are also seen at these frequencies. These modes may only be prominent in the simulation because the structure is set as lossless. The frequency range above $f_{c\_open}$ may be used to demonstrate A1 ADLs.

Figure 16A:
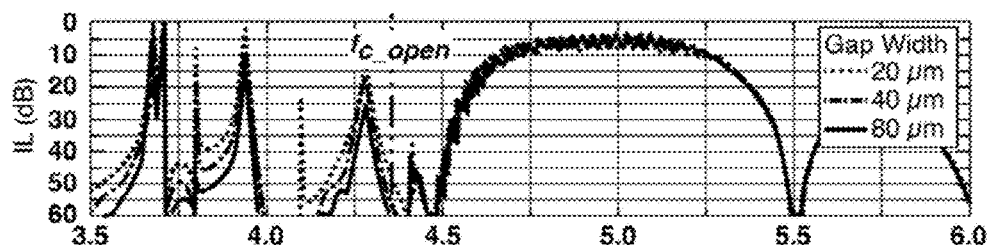
FIGS. 16A-16D are a set of graphs illustrating simulated IL, RL, group delays, and the extracted group velocities of A1 ADLs with different gap lengths according to one embodiment.
Figure 16B:
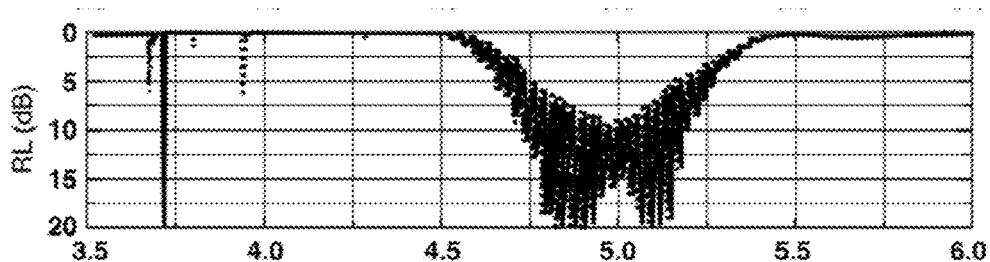
Figure 16C:
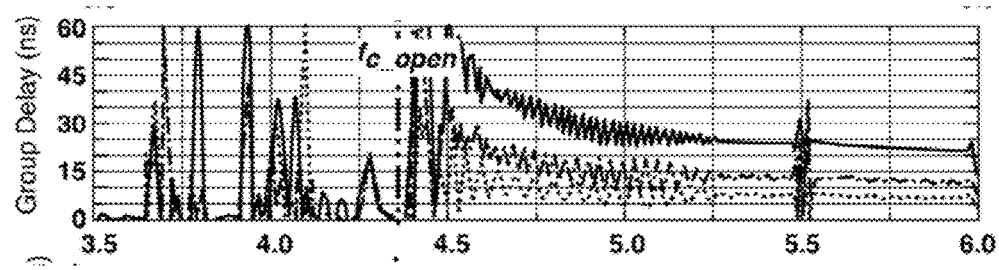
Figure 16D:
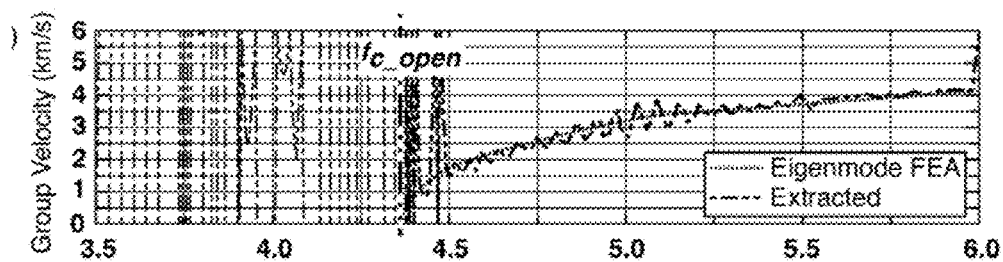

FIGS. 16A-16D are a set of graphs illustrating simulated IL, RL, group delays, and the extracted group velocities of A1 ADLs with different gap lengths according to one embodiment. In particular, FIGS. 16A-16D are a series of graphs illustrating simulated IL in FIG. 16A, RL in FIG. 16B, and group delay in FIG. 16C of A1 ADLs with different gap lengths (where gap lengths may determine group delays) as well as extracted group velocity in FIG. 16D, according to one embodiment. Different devices have the same cell number N of 4, the same cell length Λ of 2.4 μm, but different gap length $L_g$, of 20, 40, and 80 μm. FIG. 16D is the extracted group velocity in comparison with that directly obtained from the eigenmode simulation. The dependence of the three main ADL specifications, namely the group delay (δ), center frequency ($f_{center}$), and FBW, on the device dimensions are investigated. The impact of $L_g$ on the obtained δ is first studied. FEA simulated IL is shown in FIG. 16A, RL in FIG. 16B, and δ in FIG. 16C of ADLs with $L_g$ of 20, 40, and 80 μm, with ports matched to 360+j30Ω. The results underline three insights. First, δ increases in a highly dispersive fashion for devices with longer gaps. $v_g$ at each frequency can be extracted e.g., using least square fitting. The extracted $v_g$ is compared with that obtained from eigenmode simulations, showing good agreement as shown in FIG. 16D. Such a dispersive delay can be advantageous for chirp compressors in some embodiments. If a constant delay is required, Λ of different cells in both transducers may be inversely chirped to compensate for the dispersion in $v_g$. Second, the periodicity of the ripples in the S-parameters is inversely proportional to the gap length, similar to that in S0. Thus the ripples may be caused by the reflections between transducers, which may form a weak resonant structure. Last, the transmission of the modes below the cut-off frequency $f_{c\_open}$ decreases for longer devices. This verifies the evanescent nature of these modes, as suggested the simplified model.

Figure 17A:
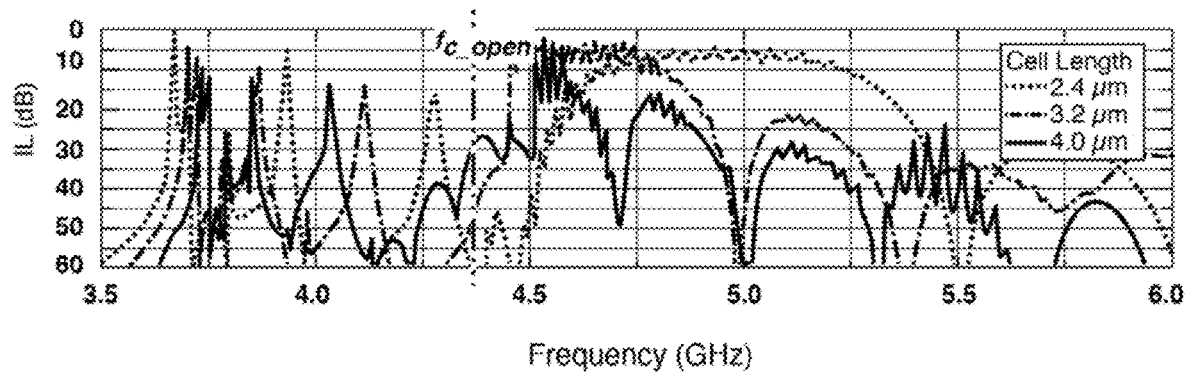
FIGS. 17A-17C are a set of graphs illustrating the simulated IL, RL, and group delay of A1 ADLs with different center frequencies according to one embodiment.
Figure 17B:
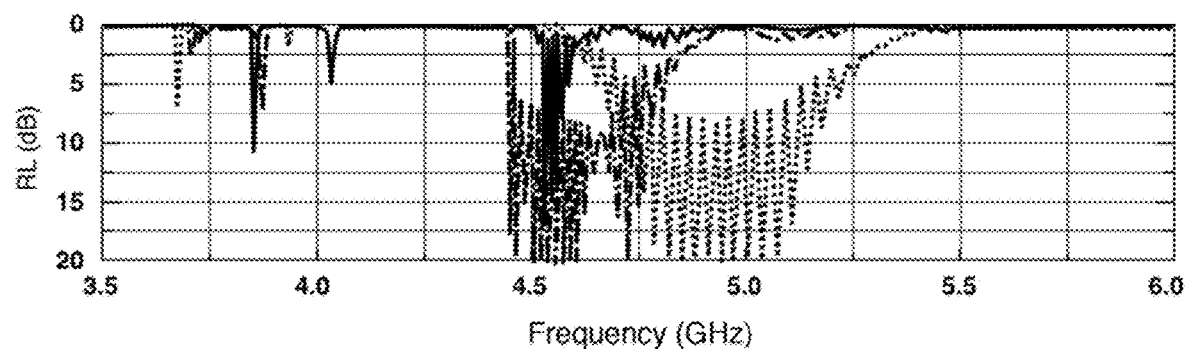
Figure 17C:
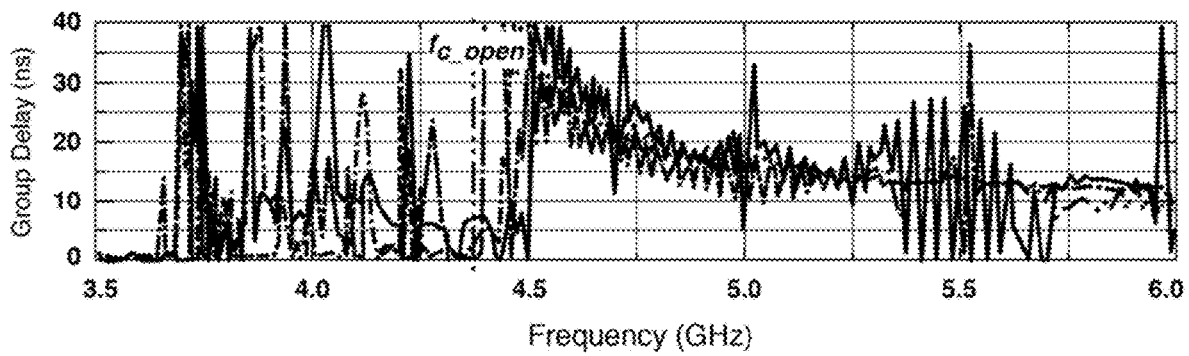

FIGS. 17A-17C are a set of graphs illustrating the simulated IL, RL, and group delay of A1 ADLs with different center frequencies according to one embodiment. Different devices have the same cell number N of 4, and the same gap length $L_g$ of 40 μm, but different cell length λ of, 2.4, 3.2, and 4.0 μm. The effects of Λ on the center frequency $f_{center}$ are then investigated. $f_{center}$ is the frequency at which most RF energy is converted into the EM domain. FEA simulated IL, RL, and δ ADLs with different Λ of 2.4, 3.2, and 4.0 μm are shown in FIG. 17. The ports are matched to 360+j30Ω, 300-j60Ω, and 400-j80Ω, respectively. The most apparent difference lies in $f_{center}$ and the passband shape. The effects can be explained using the Berlincourt equation. At $f_{center}$, the acoustic wavelength matches the transducer cell length. Therefore, the equation for solving $f_{center}$ is:

$$f_{center} \cdot L_{open}/v_{p\_open} + f_{center} \cdot L_{short}/v_{p\_short} = 1 \qquad (45)$$

where $L_{open}$ and $L_{short}$ are the lengths of the parts without and with electrodes in a cell. $v_{p\_open}$ and $v_{p\_short}$ are the phase velocities in that area with and without electrodes, which can be related to $f_{center}$ by a variation of Eq. (34):

$$v_{p\_open} = v_{l\_open}/\sqrt{1-(f_{c\_open}/f)^2} \qquad (46)$$

$$v_{p\_short} = v_{l\_short}/\sqrt{1-(f_{c\_short}/f)^2}. \qquad (47)$$

Figure 18:
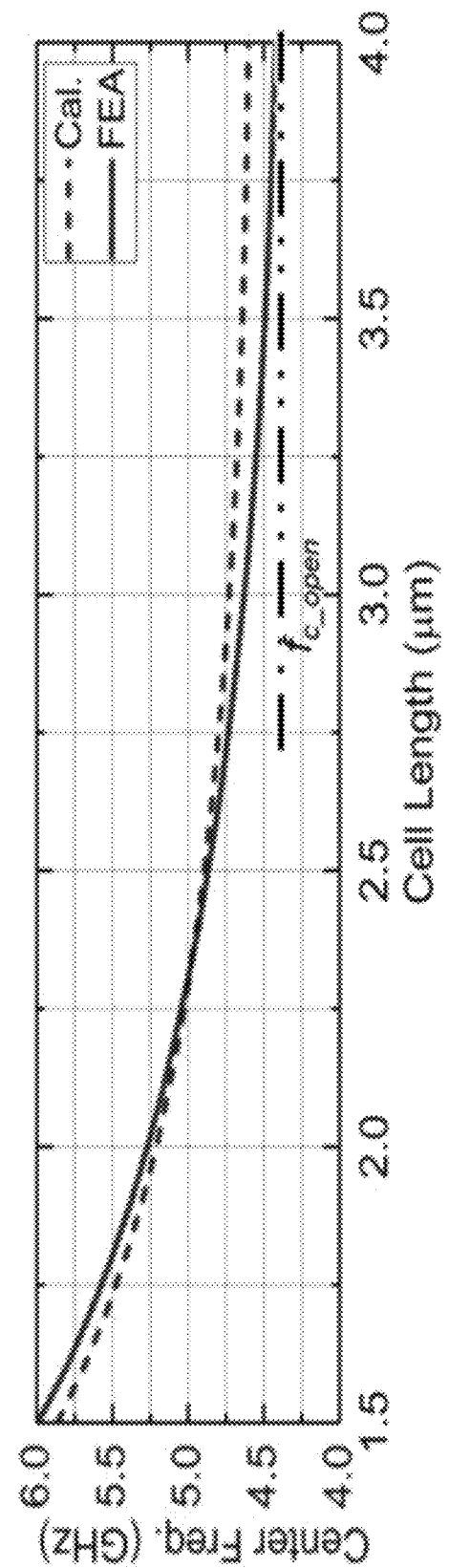
FIG. 18 is a graph illustrating the dependency of $f_{center}$ on $\lambda$, according to one embodiment.

FIG. 18 is a graph illustrating the dependency of $f_{center}$ on λ according to one embodiment. Based on $f_c$ and $v_l$, $f_{center}$ for a 50% duty cycled transducer with λ between 1.5 and 4.0 μm is shown in FIG. 18. $f_{center}$ keeps decreasing for an ADL with a larger Λ. However, as $f_{center}$ gets closer to $f_{c\_open}$, the passband is truncated and distorted, leading to a reduction of FBW. To validate the simplified model, FEA is used to validate the case. 4 pairs of transducers are simulated in the frequency domain. $f_{center}$ and the wavelength are plotted in FIG. 18. The simplified model agrees with the simulation well. In addition to the change in the passband, longer λ may also lower the frequencies of the non-propagating modes within the input transducers due to the longer resonant cavity.

Figure 19A:
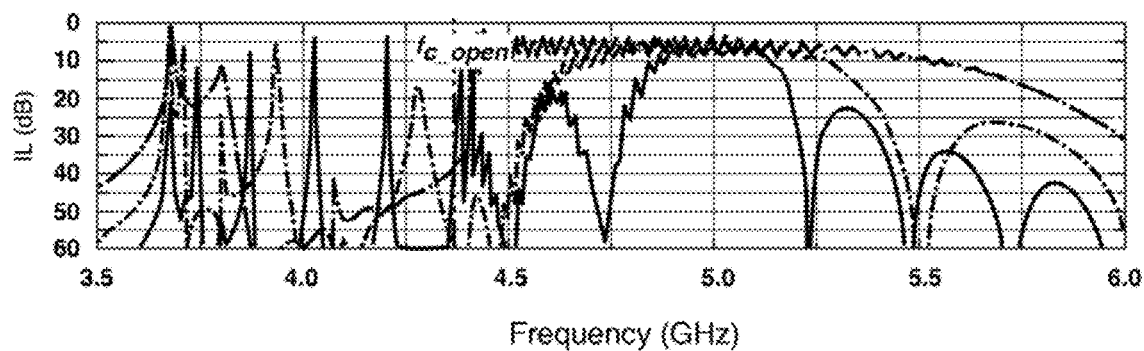
FIGS. 19A-19C are a set of graphs illustrating the simulated IL, RL, and group delay of A1 ADLs with different bandwidth according to one embodiment.
Figure 19B:
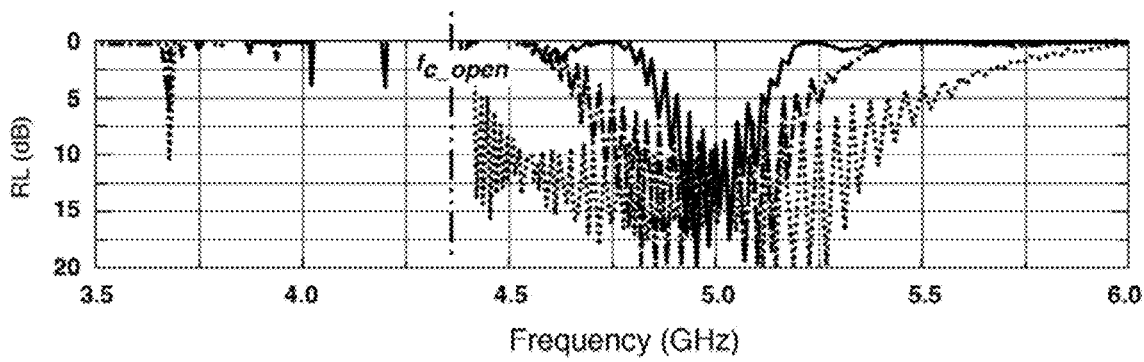
Figure 19C:
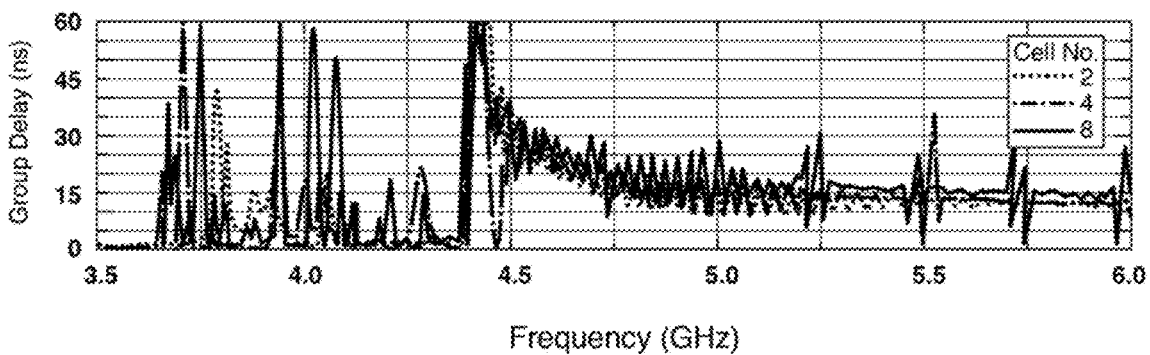

FIGS. 19A-19C are a set of graphs illustrating the simulated IL, RL, and group delay of A1 ADLs with different bandwidth according to one embodiment. In particular FIG. 19A-19C is a series of graphs illustrating the simulated IL in FIG. 19A, RL in FIG. 19B, and group delay in FIG. 19C of A1 ADLs with different bandwidth, according to one embodiment. Different devices have the same cell length, 2.4 μm, and the same gap length $L_g$ of 40 μm, but different cell number N of 2, 4, and 8. The effects of N on FBW can be studied. FEA results of ADLs with different N of 2, 4, and 8 are shown in FIG. 58, with ports conjugately matched to 800+j910Ω, 360+j30Ω, 112-j80Ω respectively. The FBW of ADLs is roughly inversely proportional to the number of cells, as explained by the transfer function of the transducer pair. However, because of the cut-off phenomenon, the passband gradually distorts near $f_{c\_open}$. Therefore, $f_{center}$ and the FBW requirements should be considered before designing A1 ADLs.

The current discussions focus on ideal A1 ADLs without considering the mass loading of the electrodes. Besides, the actual aperture width and possible skewed propagation of A1 in a 3D structure may not be captured by the adopted 2D simulations. The electrical loading in transducers is also ignored in some cases. All these factors should be considered.

Figure 20A:
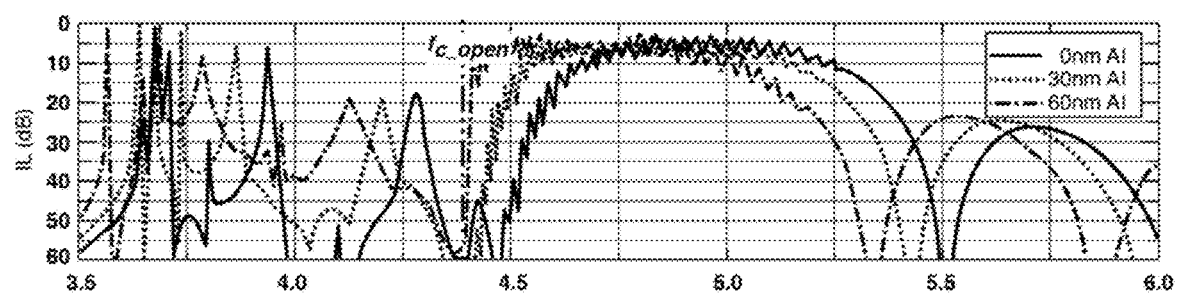
FIGS. 20A-20B are a set of graphs illustrating the simulated IL and group delay of A1 ADLs with aluminum electrodes of 0, 30, and 60 nm in thickness according to one embodiment.
Figure 20B:
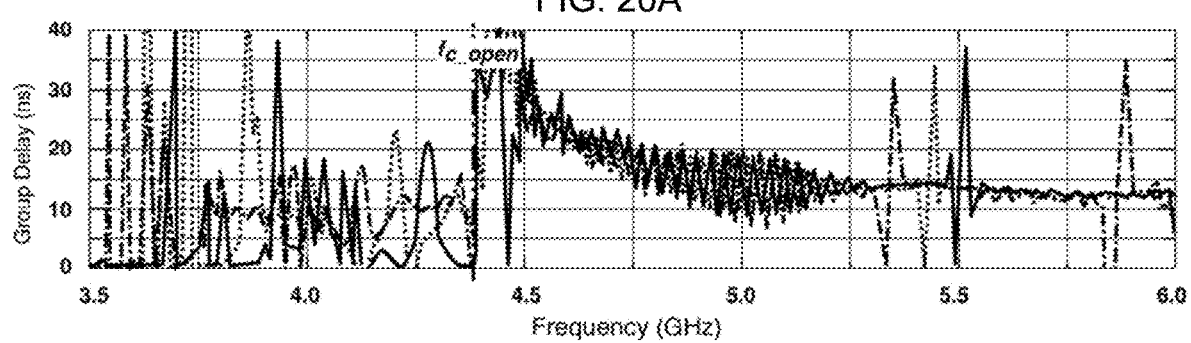

FIGS. 20A-20B are a set of graphs illustrating the simulated IL and group delay of A1 ADLs with aluminum electrodes of 0, 30, and 60 nm in thickness according to one embodiment. In this subsection, show the simulated results of an ADL using electrodes of different thicknesses and different metal are shown. Different devices studied herein have the same cell length of λ of 2.4 μm, gap length $L_g$ o 40 μm, and cell number N of 4. As seen in FIG. 20A-20B, the thickness of the electrode layer affects the performance. The S parameters for devices with electrodes of 0, 30, and 60 nm A1 are conjugately matched with 360+j30Ω, 225+j130Ω, and 145+j220Ω respectively. The drifting of $f_{center}$ to lower frequencies and slightly larger ripples are observed for ADLs with thicker metal.

Figure 21A:
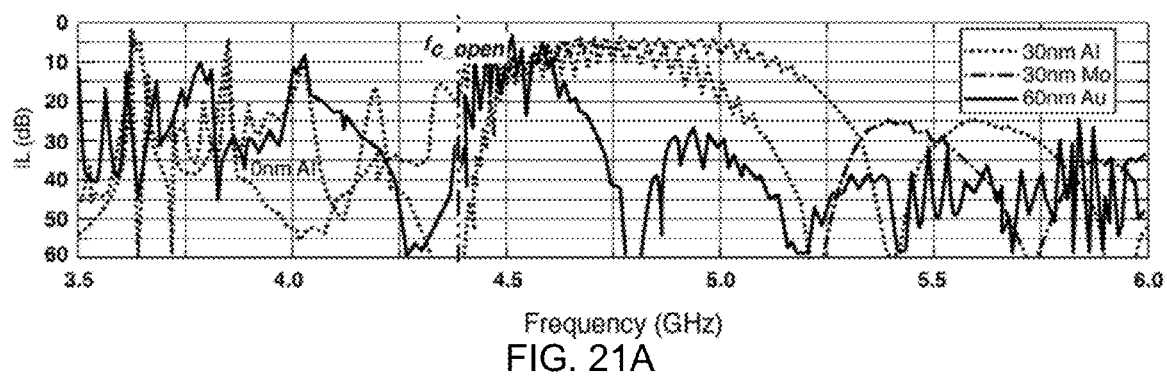
FIGS. 21A-21B are a set of graphs illustrating the simulated IL and group delay of A1 ADLs with 30 nm electrodes using different types of metals according to one embodiment.
Figure 21B:
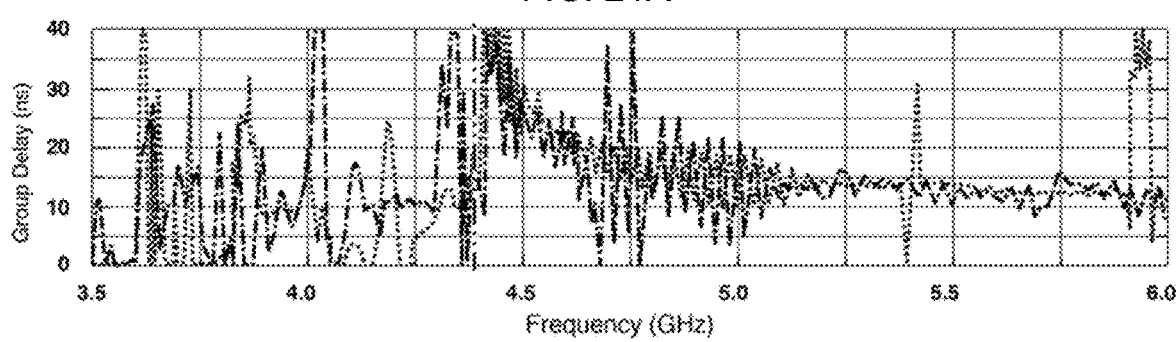

FIGS. 21A-21B are a set of graphs illustrating the simulated IL and group delay of A1 ADLs with 30 nm electrodes using different types of metals according to one embodiment. In particular, FIGS. 21A-21B are a series of graphs illustrating the simulated IL in FIG. 21A and group delay in FIG. 21B of A1 ADLs with 30 nm electrodes using different types of metals, according to one embodiment. The influence of different types of metal (Al, Mo, and Au) with the same electrode thickness (30 nm) on the ADL performance is shown. The results are matched with 225+j130Ω, 105+j215Ω, and 87+j45Ω, respectively. The same trend in thicker electrodes can be observed for heavier metals.

Figure 22A:
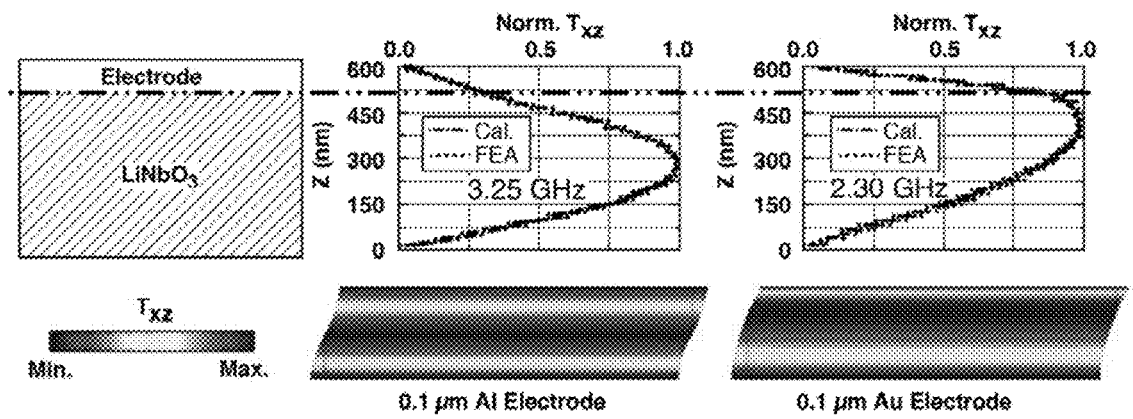
FIG. 22A is a set of graphs illustrating the stress ($T_{xz}$) distribution of A1 at $f_{c\_short}$ in film stacks with 490 nm $LiNbO_3$ and 100 nm metal on the top according to one embodiment.

FIG. 22A is a set of graphs illustrating the stress ($T_{xz}$) distribution of A1 at $f_{c\_short}$ in film stacks with 490 nm LiNbO$_3$ and 100 nm metal on the top according to one embodiment. The calculated stress distribution and that obtained from FEA are presented. To better design electrodes for A1 ADLs, the lower $f_{center}$ caused by the mass loading is first discussed. As presented in Eqs. (45)-(47), $f_{center}$ is determined by the $v_l$ and $f_c$ in the parts with and without electrodes. For devices with different electrodes, both $f_{c\_short}$ and $v_{l\_short}$ vary.

Figure 22B:
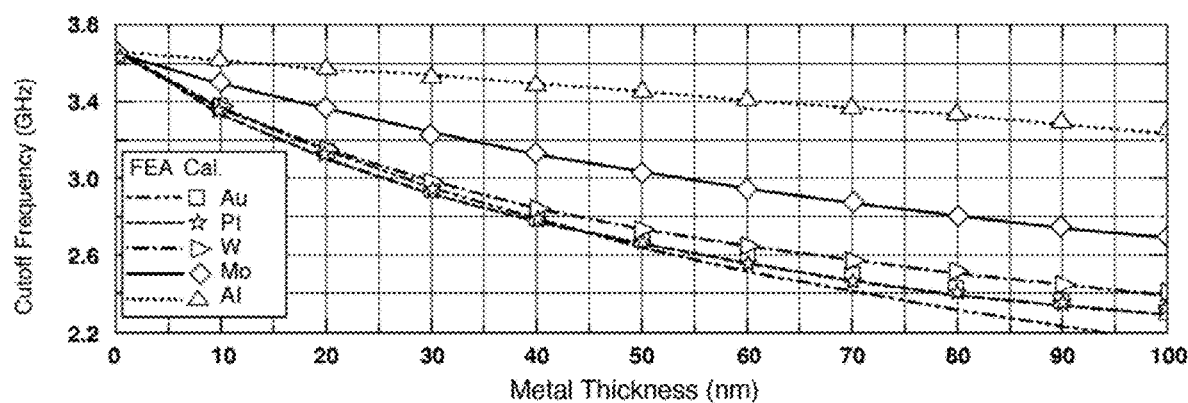
FIG. 22B is a graph illustrating the calculated and simulated $f_{c\_short}$ for 490 nm $LiNbO_3$ and metal on the top according to one embodiment.

FIG. 22B is a graph illustrating the calculated and simulated $f_{c\_short}$ for 490 nm LiNbO$_3$ and metal on the top according to one embodiment. First $f_{c\_short}$ of different film stacks can be obtained analytically by solving the stress distribution ($T_{xz}$) in the film stack, as shown in FIG. 22A. At $f_{c\_short}$, $T_{xz}$ is uniform in the longitudinal direction. Given that the stress vanishes on the top and bottom surfaces with the mechanically free boundary conditions, the stress distribution can be described in the thickness direction (e.g., the z-direction) as:

$$T_{XZ}(z) = T_{LN} \cdot \sin(2\pi f_{c\_short}/v_{s\_LN} \cdot z), \text{ when } 0 \le z < t \quad (48a)$$

$$T_{XZ}(z) = T_{met} \cdot \sin\left[\frac{2\pi f_{c\_short}}{v_{s\_met}} \cdot (t+b-z)\right] \text{ when } t \le z \le t+b \quad (48b)$$

where $T_{LN}$ and $T_{met}$ are the stress amplitudes, and $v_{s\_LN}$ and $v_{s\_met}$ are the shear wave velocities in LiNbO$_3$ and the electrode respectively. The t and b are the thickness of LiNbO$_3$ and the electrode, respectively. Using the boundary conditions at the interface, namely the stress continuity and velocity continuity, then:

$$\frac{\tan(2\pi f_{c\_short}/v_{s\_met} \cdot b)}{\tan(2\pi f_{c\_short}/v_{s\_LN} \cdot t)} = -\frac{\rho_{LN} \cdot v_{s\_LN}}{\rho_{met} \cdot v_{s\_met}} \quad (49)$$

where $\rho_{LN}$ and $\rho_{met}$ are the densities of respective materials. $f_{c\_short}$ and the normalized stress distribution in the film can be obtained from Eqs. (48a) and (48b) as well as Eq. (49). The solutions for both cases are plotted, showing that the metal layer changes the stress distribution and consequently lowers $f_{c\_short}$. In the Au case, nearly half of the stress variance can be in Au due to the significantly slower shear wave velocity in the metal layer. In contrast, the impact may be smaller in the A1 case because of a faster shear wave velocity in A1. The mass loading effects caused by different metals are then calculated and shown in FIG. 22B. Thicker electrodes and metals with slower $v_{s\_met}$ lead to a larger difference. Eigenmode FEA, FIG. 22, also shows agreement with the analytical model.

Figure 23A:
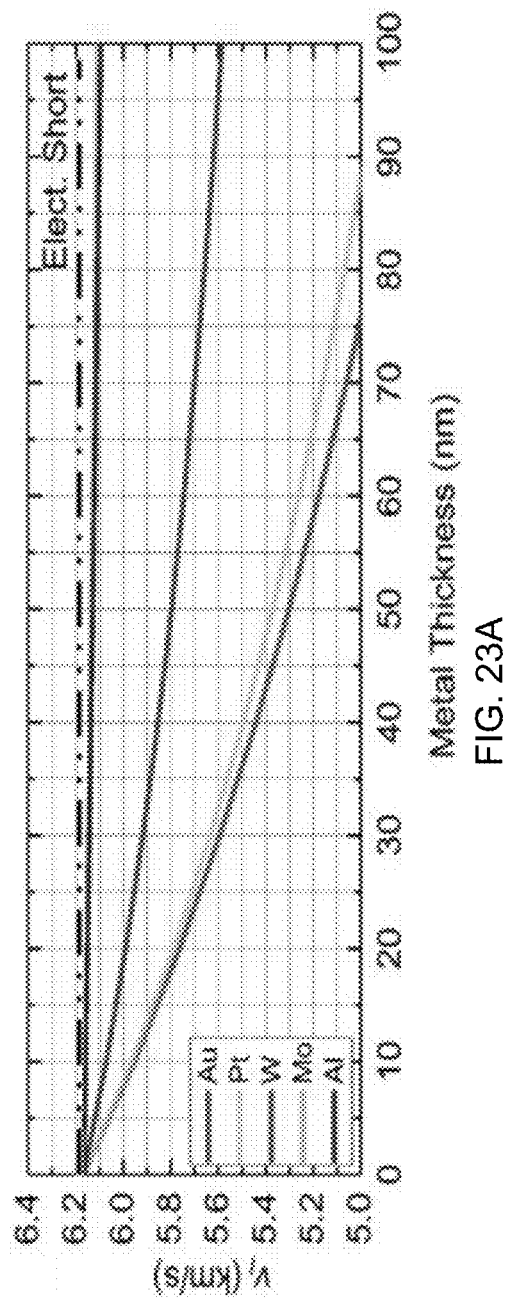
FIGS. 23A-23B are a set of graphs illustrating the simulated $v_{l\_short}$ in film stacks with 490 nm $LiNbO_3$ and different types of electrode on the top and the calculated $f_{center}$ for transducers with different types of electrodes according to one embodiment.
Figure 23B:
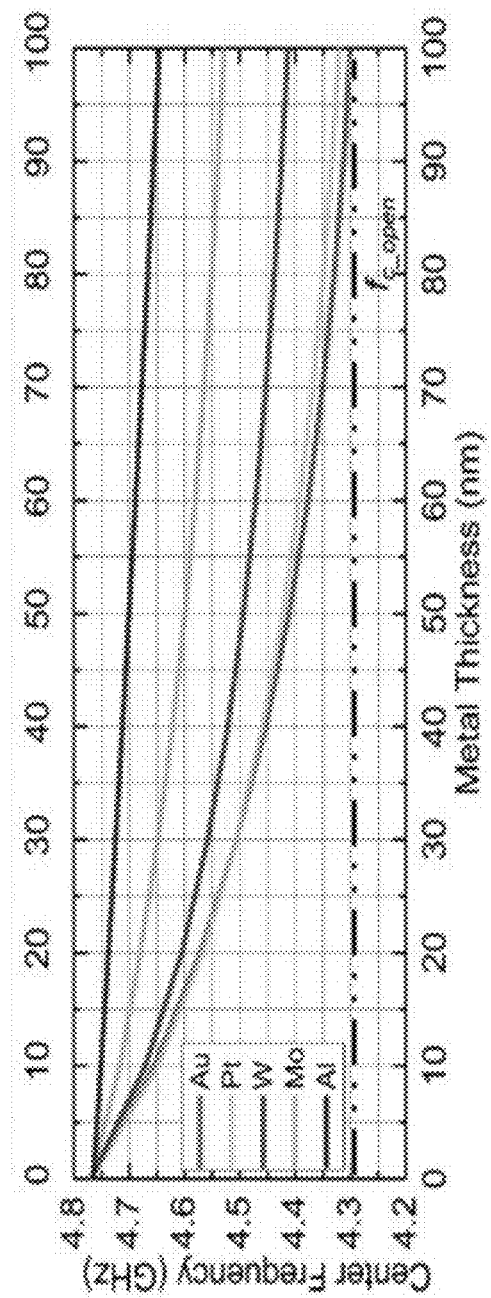

FIGS. 23A-23B are a set of graphs illustrating the simulated $v_{l\_short}$ in film stacks with 490 nm LiNbO$_3$ and different types of electrode on the top and the calculated f center for transducers with different types of electrodes according to one embodiment. The $v_{l\_short}$ of different film stacks can be solved through FEA. Although analytically solving a composite structure is possible through simplifications, FEA is used here for higher accuracy, and the results are shown in FIG. 23A. 100 nm A1 leads to 1.1% velocity change, while 100 nm Au leads to 22.7% velocity change. Thicker or heavier electrodes may lead to more significant phase velocity decrease.

With the dependence of $f_{c\_short}$ and $v_{l\_short}$ on the electrode thickness studied, the impact of the mass loading on $f_{center}$ is calculated using the model in Eqs. (45)-(47) and plotted in FIG. 23B for a 50% duty cycle transducer with of 2.4 μm. Because both parameters may decrease with thicker or heavier metal (e.g., Au), $f_{center}$ decreases, compared to the massless case. As a result, the passband may distort as it shifts to lower frequencies and gets truncated by the cut-off (e.g., as illustrated in FIGS. 20-21). To build A1 ADLs at similar frequencies using thicker or heavy electrodes, transducers with a smaller Λ should be implemented, which may require a smaller feature size. Therefore, thin electrodes with fast wave velocities may be preferable for achieving well-defined passbands without decreasing the feature size of IDTs.

Figure 24A:
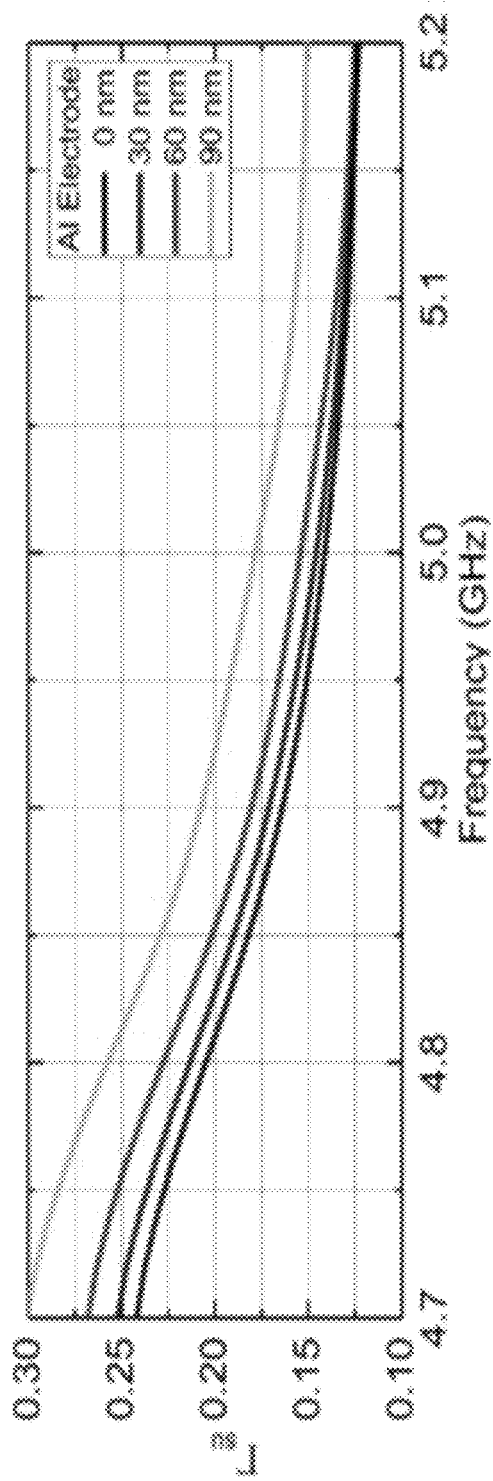
FIGS. 24A-24B are a set of graphs illustrating the simulated $\Gamma_{su}$ at the interface between the parts with and without electrodes and a comparison of the $\Gamma_{su}$ caused by different metal electrodes for A1 waves in the acoustic waveguide at 4.95 GHz according to one embodiment.
Figure 24B:
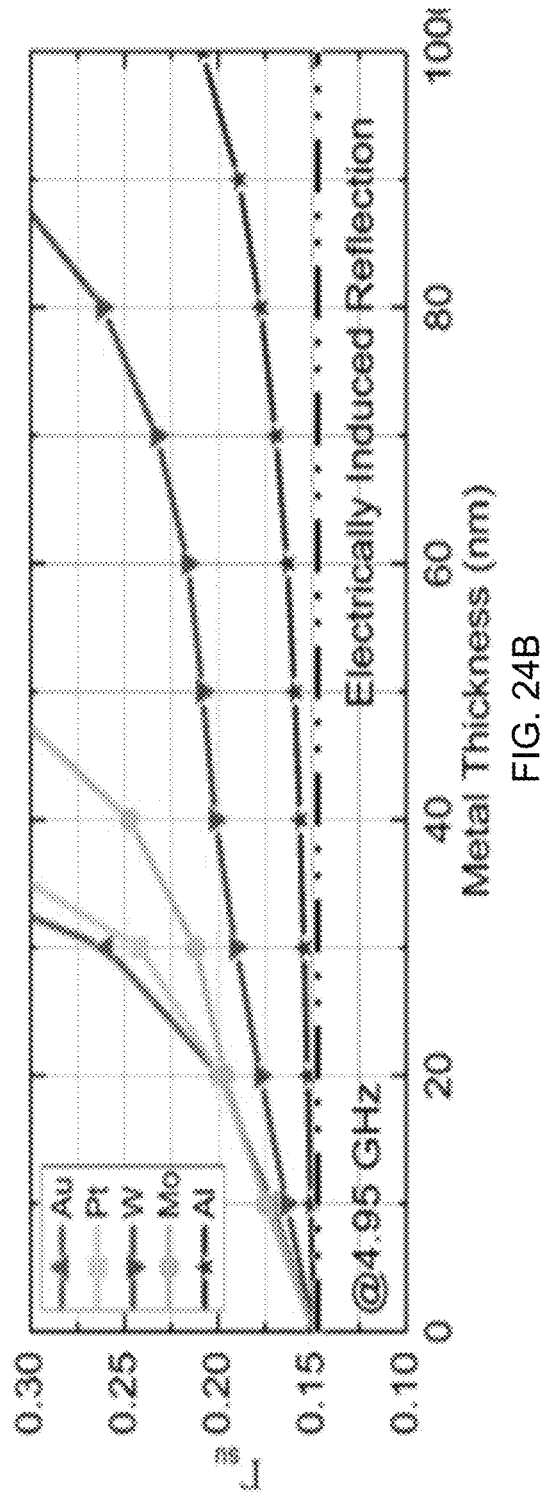

FIGS. 24A-24B are a set of graphs illustrating the simulated $\Gamma_{su}$ at the interface between the parts with and without electrodes and a comparison of the $\Gamma_{su}$ caused by different metal electrodes for A1 waves in the acoustic waveguide at 4.95 GHz according to one embodiment. An effect of more severe mass loading is the larger ripples in IL and group delay. These are caused by more significant internal reflections at the edge of the electrodes. The edge reflections can be of two origins, namely the electrically induced $\Gamma_e$ and the mechanically induced $\Gamma_m$ reflections. While $\Gamma_e$ does not change with electrode thickness, $\Gamma_m$ is larger for thicker metals. To study the influence quantitatively, the reflection generated at the interface between the parts with and without electrodes, namely the step-up reflection coefficient, $\Gamma_{su}$, is studied using a simulation. A slab of $LiNbO_3$ partially covered with metal is modeled in 2D with PMLs on the longitudinal ends for absorbing the reflected waves. A1 waves are excited mechanically in the area without electrodes and propagate towards the interface. The ratio between the reflected stress and the incident stress ($T_{xz}$) is used to calculate $\Gamma_{su}$. $\Gamma_{su}$ for A1 electrodes of different thicknesses is plotted in FIG. 24A. First, $\Gamma_e$ shows lower values at higher frequencies, which is consistent with the lower $k^2$ at these frequencies (FIG. 53). Second, larger $\Gamma_{su}$ is observed for thicker electrodes due to the larger mechanically induced reflections. The larger reflections subsequently induce larger in-band ripples, which may be more severe near $f_{c\_short}$.

Similarly, heavier material leads to larger reflections as shown in FIG. 24B. Thus, a lighter electrode material such as A1 may be preferred to reduce $\Gamma_{su}$ for less pronounced in-band ripples. Note that, the internal reflections can be further suppressed by split electrode designs at the cost of smaller feature size. Thinner electrodes with faster phase velocities may be preferable in maintaining high-frequency and wide-band performance. However, if the electrodes are too thin, the series resistance may load the performance electrically. In one embodiment, 30 nm A1 electrode may be chosen as a calculated trade-off.

Figure 25A:
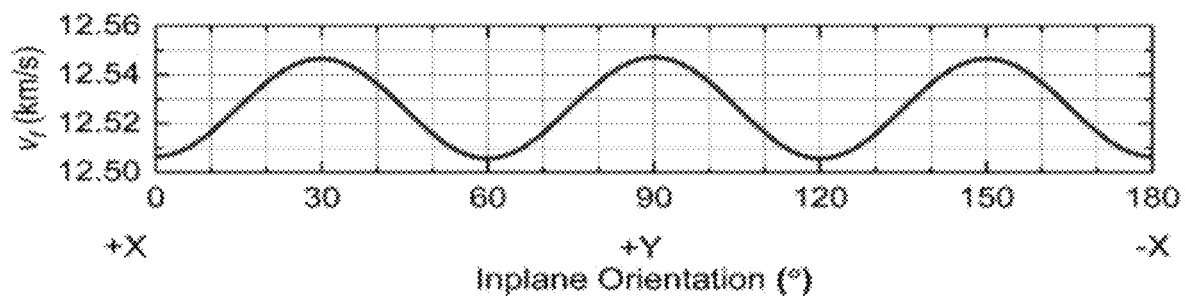
FIGS. 25A-25D are a set of graphs illustrating the simulated A1 characteristics at different in-plane orientations in a 0.49 µm-thick Z-cut $LiNbO_3$ thin film according to one embodiment.
Figure 25B:
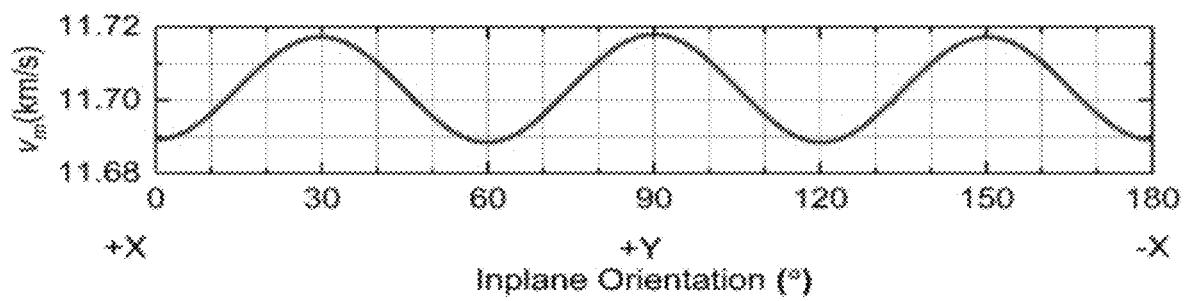
Figure 25C:
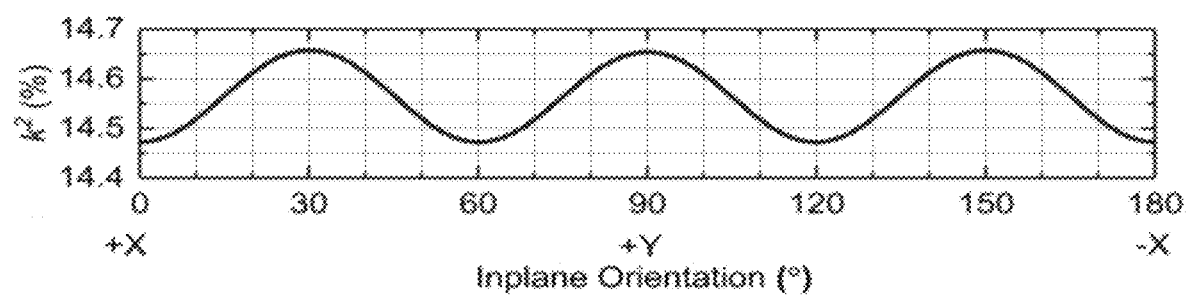
Figure 25D:
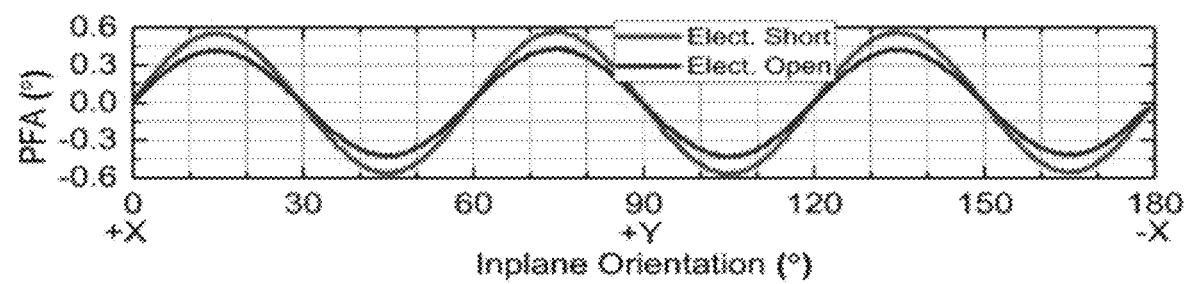

FIGS. 25A-25D are a set of graphs illustrating the simulated A1 characteristics at different in-plane orientations in a 0.49 µm-thick Z-cut $LiNbO_3$ thin film according to one embodiment. FIG. 25A illustrates the simulated $v_p$ under electrically open boundary conditions. FIG. 25B illustrates the simulated $v_p$ under electrically short boundary conditions. FIG. 25C illustrates the electromechanical coupling $k^2$. FIG. 25D illustrates the power flow angle. The previous analysis assumes A1 ADLs placed along +X, e.g., as in FIGS. 2A-2D. In the discussion relating to FIGS. 25A-25D, the effect of in-plane orientation on A1 transduction, propagation, and wideband performance will be considered.

A1 characteristics at different in-plane orientations in a Z-cut $LiNbO_3$ thin film are first investigated. 3D FEA can be used to identify the eigenfrequencies of A1 at different orientations, using a 2.4 µm by 50 µm by 0.49 µm Z-cut $LiNbO_3$ plate. Periodic boundary conditions can be applied to the longitudinal edges. Mechanically free boundary conditions can be applied to the top and bottom surfaces. The phase velocities for both electrically open case ($v_f$) and short case ($v_m$) can be obtained, respectively. As seen in FIG. 25A and FIG. 25B, both velocities have little variation pertaining to the in-plane orientation. $v_f$ is around 12.52 km/s, and $v_m$ is around 11.70 km/s. A periodicity of 60° is observed in the variation, matching the in-plane angular periodicity of Z-cut $LiNbO_3$. $k^2$ is calculated with Eq. (44) and is plotted in FIG. 25C showing a value (around 14.5%) in agreement with the calculations described with respect to FIG. 24. From FIGS. 25A-25D, A1 transduction in Z-cut $LiNbO_3$ appears to not vary significantly with the in-plane orientation.

Second, the propagation characteristics of A1 can be studied. So far, the analysis assumes that the wavefront propagates in alignment with the energy transportation direction. However, this may only be true when the power flow angle (PFA) is zero. The PFA is defined as the in-plane angle between the direction of $v_g$ and $v_p$, pointing from $v_g$ to $v_p$, which is mostly non-zero for waves in anisotropic materials. A large PFA could cause the generated wave propagating of the direction towards the output transducer. Although the free boundaries in the transverse direction would help to confine the energy, IL degradation is still expected as waves scatter into the bus line area where no IDTs are present to collect the acoustic energy. The PFA for A1 waves in Z-cut $LiNbO_3$ is studied through the slowness curve approach and plotted in FIG. 25D for both the electrically open and short cases. Small PFAs can be seen across the YZ plane. A PFA of 0° is seen along +X. A maximum of +0.6° along 5° to +X and a minimum of −0.6° along 45° to +X can be observed. The PFA may show a similar periodic dependence on orientation as $v_f$, $v_m$ and $k^2$.

Figure 26A:
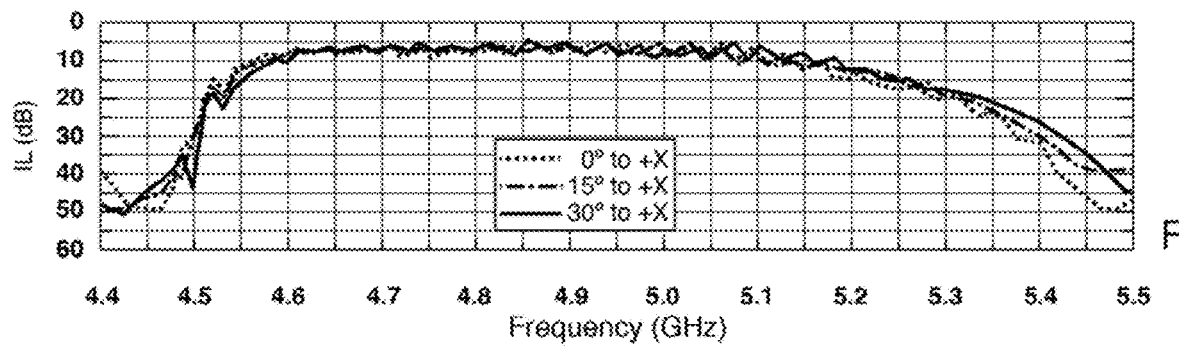
FIGS. 26A-26C are a set of graphs illustrating the simulated effects of the in-plane orientation on ADL performance according to one embodiment.
Figure 26B:
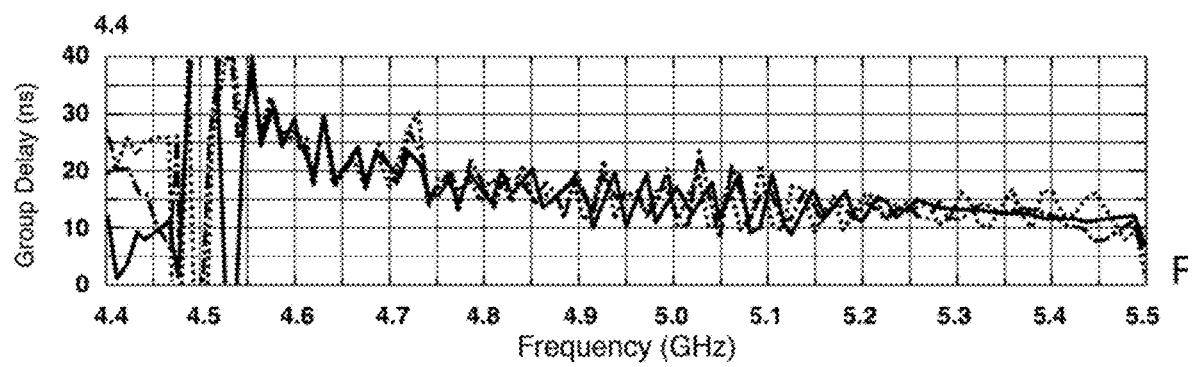
Figure 26C:
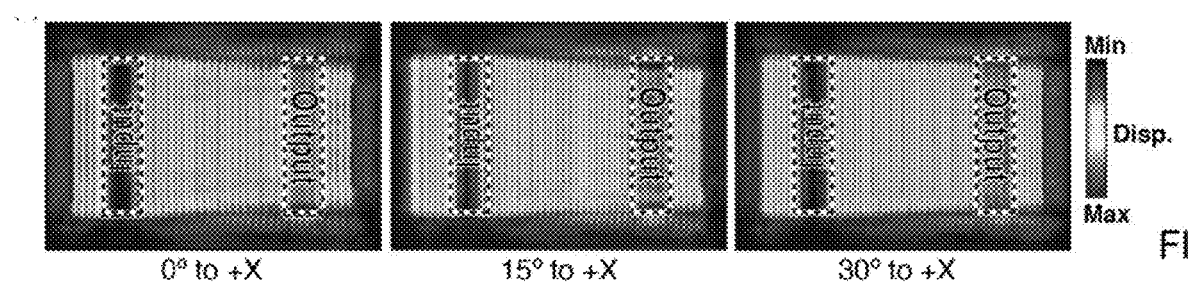

FIGS. 26A-26C are a set of graphs illustrating the simulated effects of the in-plane orientation on ADL performance according to one embodiment. FIG. 26A illustrates IL of ADLs at different in-plane orientations. FIG. 26B illustrates the group delay of ADLs at different in-plane orientations. FIG. 26C illustrates the vibration mode shape of A1 in the passband (top view).

To explore the effects of a small PFA, 3D FEA can be set up with a cell length Λ of 2.4 µm, a gap length $L_g$ of 40 µm, and a cell number N of 4. The aperture width is 50 µm, and the total device width is 74 µm. PMLs can be set on the longitudinal ends, while the free boundaries are set on the transverse sides. The simulated S parameters are shown in FIG. 26A and FIG. 26B with ports conjugately matched to 210+j140Ω, showing a minor difference between devices oriented at different angles. The displacement mode shape presented in FIG. 26C shows that most energy propagates along the longitudinal direction. Compared with ADLs using other modes with significant PFAs, A1 in Z-cut $LiNbO_3$ may allow more tolerance for angular misalignment due to its small PFAs.

Figure 27A:
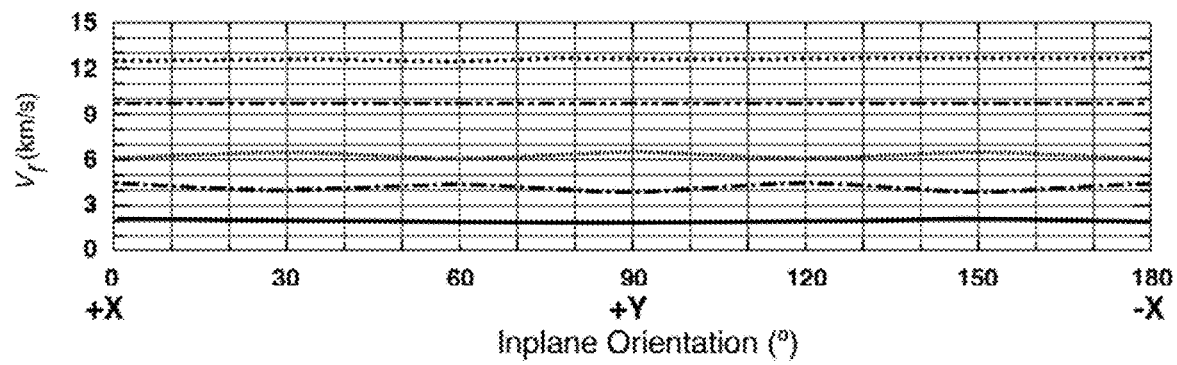
FIGS. 27A-27C are a set of graphs illustrating the simulated characteristics of major modes at different in-plane orientations in a 0.49-µm-thick Z-cut $LiNbO_3$ thin film, including $v_f$, $k^2$, and displacement mode shapes of different modes according to one embodiment.
Figure 27B:
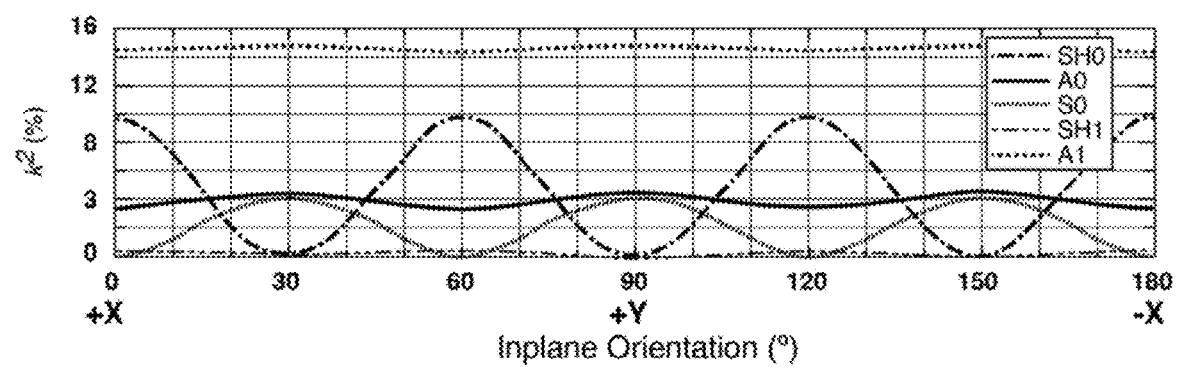
Figure 27C:
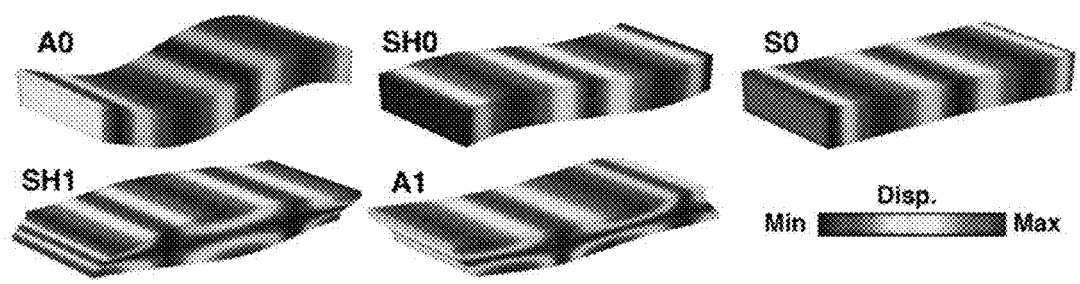

FIGS. 27A-27C are a set of graphs illustrating the simulated characteristics of major modes at different in-plane orientations in a 0.49-µm-thick Z-cut $LiNbO_3$ thin film, including $v_f$, $k^2$, and displacement mode shapes of different modes according to one embodiment. Other modes at different angles are studied. $v_f$ and $k^2$ of the major modes in the 2.4 µm by 50 µm, by 0.49 µm, Z-cut $LiNbO_3$ plate are simulated using the same method as that for A1 and shown in FIG. 27A and FIG. 27B respectively. The results are plotted along with the displacement mode shapes which are plotted in FIG. 27C. The following modes: SH0, S0, and A0 can be effectively excited in Z-cut LN with moderate $k^2$ at certain orientations.

Figure 28A:
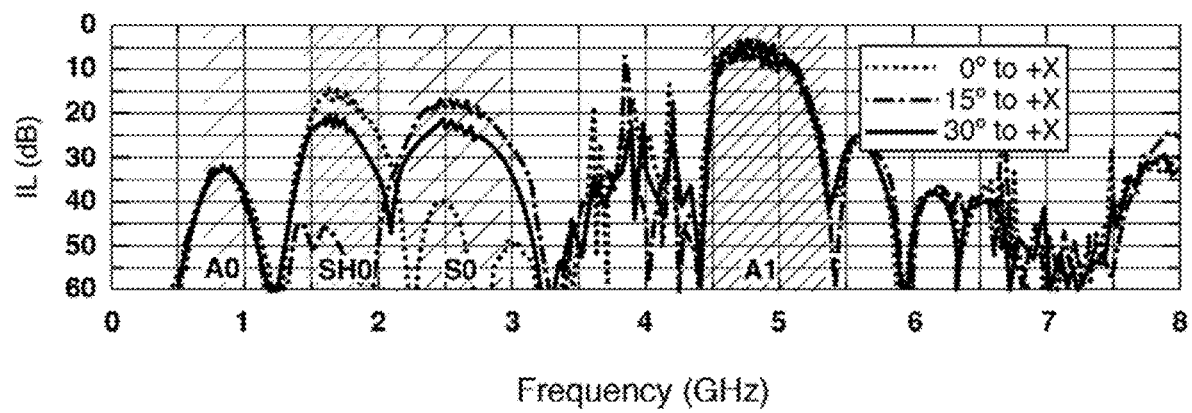
FIGS. 28A-28C are a set of graphs illustrating the simulated wideband IL, RL, and group delay of A1 ADLs at different in-plane orientations according to one embodiment.
Figure 28B:
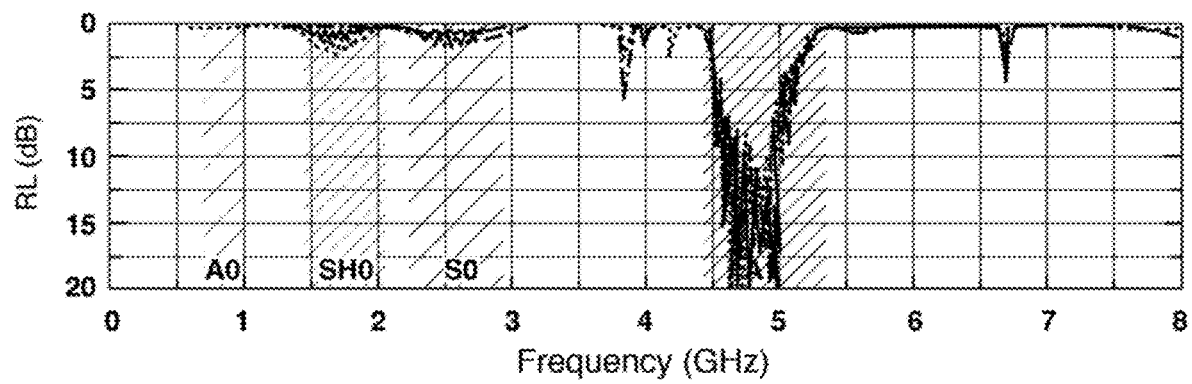
Figure 28C:
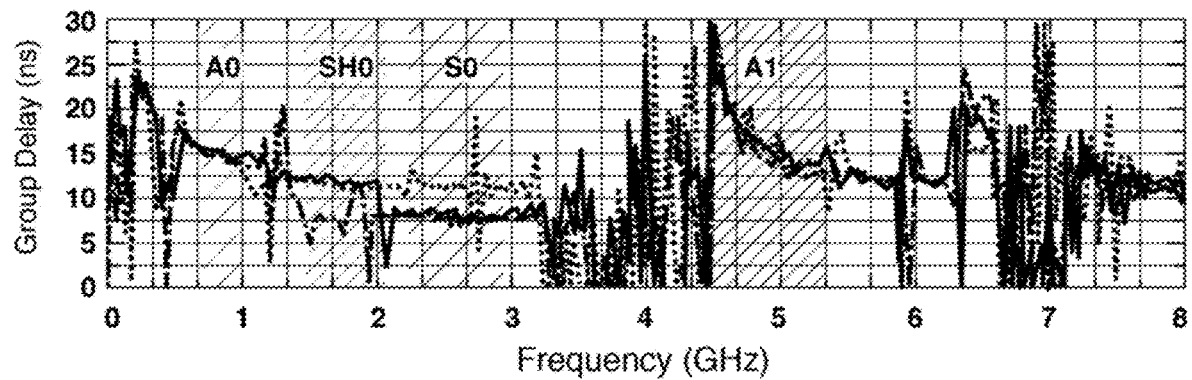

FIGS. 28A-28C are a set of graphs illustrating the simulated wideband IL, RL, and group delay of A1 ADLs at different in-plane orientations according to one embodiment. The IL is plotted in FIG. 28A, the RL is plotted in FIG. 28B, and the group delay is plotted in FIG. 28C. The simulated wide-band performance for ADLs placed along 0°, 15°, and 30° to +X is also shown. It can be observed that the S0 mode is not excited at 0° to +X, while SH0 is not excited at 30° to +X. The frequency spacings between passbands mark the difference in $v_p$, while the difference in δ proves the difference in $v_g$ or different modes. Other than the non-propagating modes below $f_{c\_open}$, a clean spectrum can be observed for A1.

Based on the analysis above on the A1 transduction, propagation, and its wideband performance, it can be concluded that the in-plane orientation may not affect the performance significantly. Consequently, the X-axis may be used as the longitudinal direction for device implementation in this embodiment.

Figure 29A:
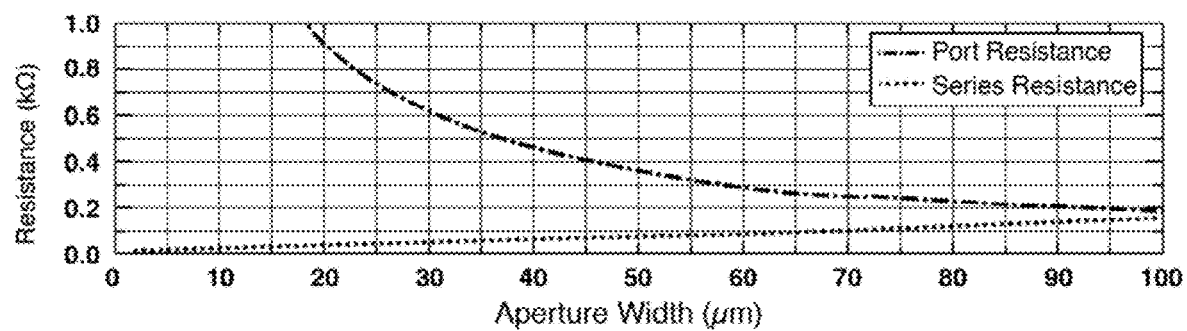
FIGS. 29A-29C are a set of graphs illustrating the simulated effects of the aperture width on port resistance and series resistance, IL, and RL of A1 ADLs according to one embodiment.
Figure 29B:
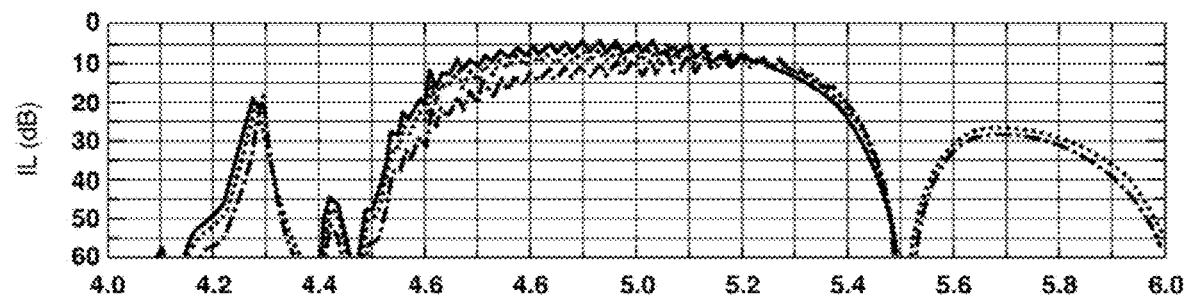
Figure 29C:
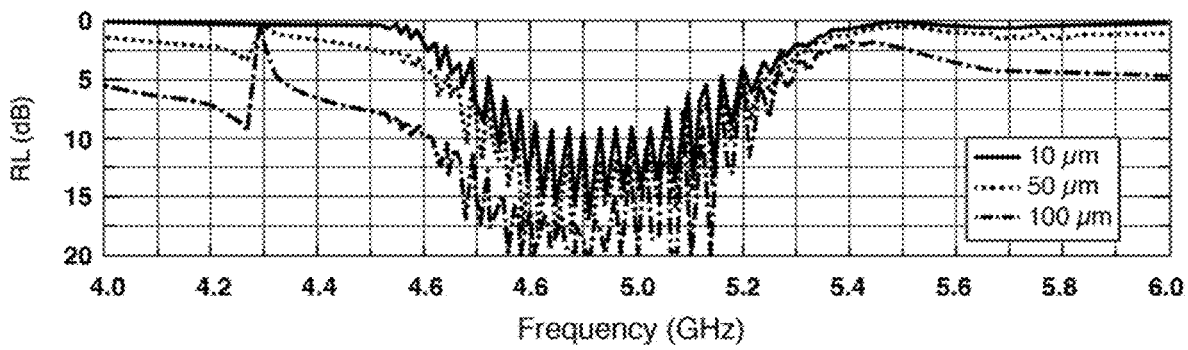

FIGS. 29A-29C are a set of graphs illustrating the simulated effects of the aperture width on port resistance and series resistance, IL, and RL of A1 ADLs according to one embodiment. FIG. 29A illustrates the simulated port resistance and series resistance of an A1 ADL with different aperture widths. FIG. 29B illustrates the simulated IL of an A1 ADL with different aperture widths. FIG. 29C illustrates the simulated RL of an A1 ADL with different aperture widths.

The series resistance in the IDTs can cause significant performance degradation in a wide device aperture. With a wider aperture (or longer IDTs), the series resistance caused by the electrical loading increases, while the radiation resistance of the ADL decreases. Consequently, the electrical loading effects are more prominent. To study electrical loading quantitatively, $R_s$ can be calculated as:

$$R_{ele} = (2\rho_s \cdot L)/(3t \cdot W) \quad (50)$$

$$R_s = 2R_{ele}/N \quad (51)$$

where $R_{ele}$ is the resistance in a single IDT. $\rho_s$ is the electrical resistivity. L, t, and W are the IDT length, thickness, and width, respectively. $R_s$ is the series resistance of a transducer, and N is the cell number. For a device with a λ of 0.2.4 μm, N of 4, and 30 nm Al electrodes, the real part of the port impedance (port resistance) and the series resistance can be calculated for different aperture width, as shown in FIG. 29A. In the calculation, $\rho_s$ is set as 3 times of the bulk value (2.65×10$^{-8}$ Ω/m), based on that measured from the in-house fabrication tests. $R_{port}$ is inversely proportional to L, while $R_s$ is proportional to L. The electrical loading is significant for devices wider than 50 μm. The simulated S parameters of ADLs with 10, 50, and 100 μm are shown in FIG. 29C, with the port impedance conjugately matched to 1580+j260Ω, 420+j55Ω, and 295+j28Ω respectively. A decrease in IL and an increase in RL may be the results of the electrical loading. The impact is more clear on the lower frequency side of the passband because k$^2$ of A1 is slightly larger at lower frequencies. The same $R_s$ can be more substantial in comparison to the radiation resistance at those frequencies. Another consequence is that although the port reactance is roughly inversely proportional to L, the port resistance is not inversely proportional to L due to the electrical loading. However, it may not beneficial to implement devices with excessively small apertures because of the wave diffraction caused by the fringe effect. Therefore, the aperture width is set as 50 μm as a trade-off. In one embodiment, the A1 ADLs are implemented along the X-axis direction using 30 nm of Al electrode and an aperture width of 50 μm.

Figure 30D:
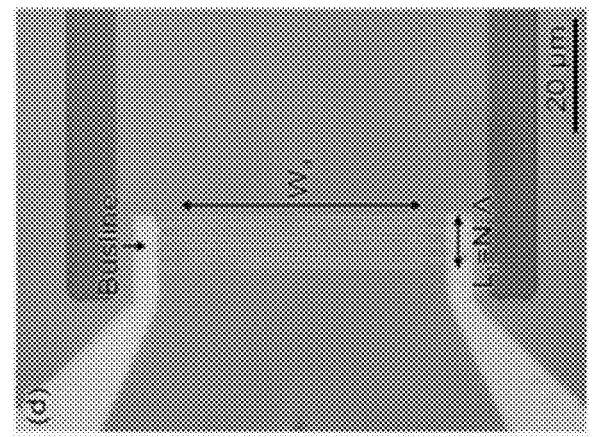
FIGS. 30A-30D are optical microscope images of the fabricated ADLs according to one embodiment.
Figure 30A:
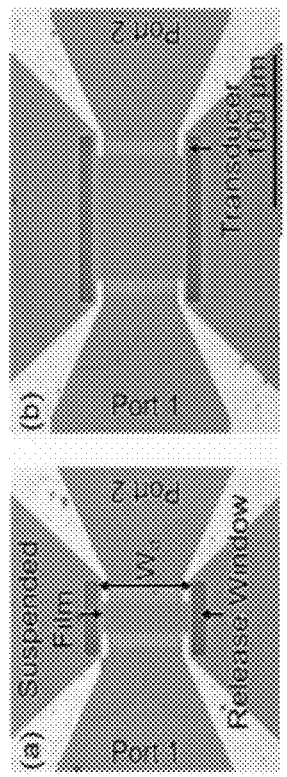
Figure 30B:
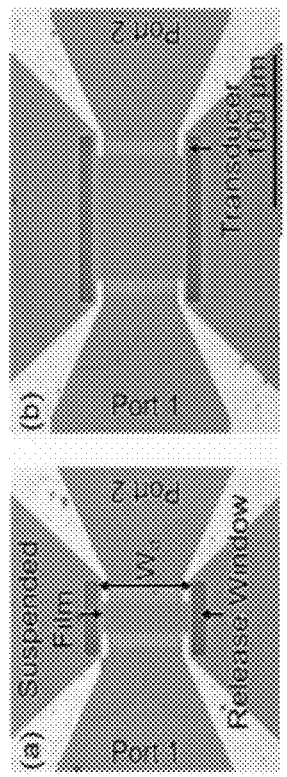
Figure 30C:
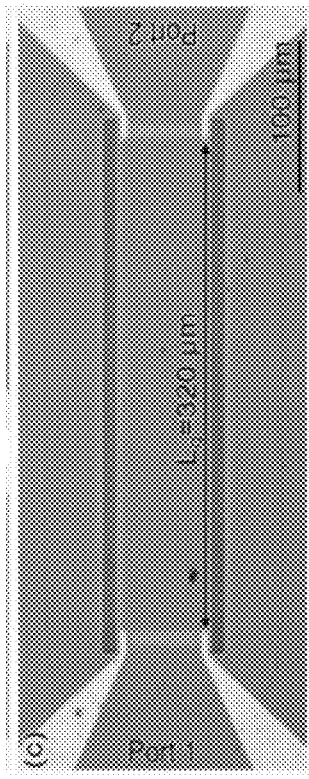

FIGS. 30A-30D are optical microscope images of the fabricated ADLs according to one embodiment. FIG. 30A illustrates a zoomed-out-image of an A1 ADL with $L_g$ of 20 μm. FIG. 30B illustrates a zoomed-out-image of an A1 ADL with $L_g$ of 80 μm. FIG. 30C illustrates a zoomed-out-image of an A1 ADL with $L_g$ of 160 μm. FIG. 30D illustrates a zoomed-in image of a transducer with 4 cells. The relevant parameters are shown in Table 2.

TABLE 2

| Sym. | Parameter | Value | Sym. | Parameter | Value |
|---|---|---|---|---|---|
| Λ | Cell length (μm) | 2.0-3.2 | $W_s$ | Aperture width (μm) | 50 |
| N | Number of cells | 2-4 | $W_d$ | Device width (μm) | 74 |
| $L_g$ | Gap Length (μm) | 20-320 | $L_T$ | Transducer length (μm) | 4.8-14.4 |
| $T_{LN}$ | LiNbO3 thickness (nm) | 490 | $T_{AL}$ | Aluminum thickness (nm) | 30 |

A 490 nm Z-cut LiNbO$_3$ thin film on a 4-inch Si wafer may be provided by NGK Insulators, Ltd. for the fabrication. The optical images of the fabricated ADLs are shown in FIGS. 30A-30D. The relevant design parameters, namely, $L_g$, and N are labeled, and their typical values are presented in Table 2.

Five groups of A1 ADLs are designed for the implementation of 5-GHz broadband delays (Table 3 below). ADLs in group A have the same transducer design (λ and N but different $L_g$, for showcasing the operation principles of A1 ADLs and identifying the relevant propagation parameters. Their wideband performance will also be presented to validate the design. Groups B, C, and D may include ADLs with different cell length for showing ADL performance at different frequencies and also present the highly dispersive characteristics of A1. Group E includes ADLs with a different number of cells from Group A to show the dependence of BW on N. The broadband performance can also be used to extract $v_g$ and PL.

TABLE 3

KEY PARAMETERS OF THE FABRICATED DEVICES

| Index | Cell Length (μm) | Gap Length (μm) | No. of Cells | Sim. (FIG.) | Meas. (FIG.) | Comments |
|---|---|---|---|---|---|---|
| Group A | 2.4 | 20-320 | 4 | 5, 17 | 20-21 | Gap length & Wideband |
| Group B | 3.2 | 20-320 | 4 | 6 | 22 | Cell length & Gap length |
| Group C | 2.8 | 20-160 | 4 | 6 | 23 | Cell length & Gap length |
| Group D | 2.0 | 20-320 | 4 | 6 | 24 | Cell length & Gap length |
| Group E | 2.4 | 20-320 | 2 | 8 | 25 | Cell number, $v_g$, and PL |

Figure 31A:
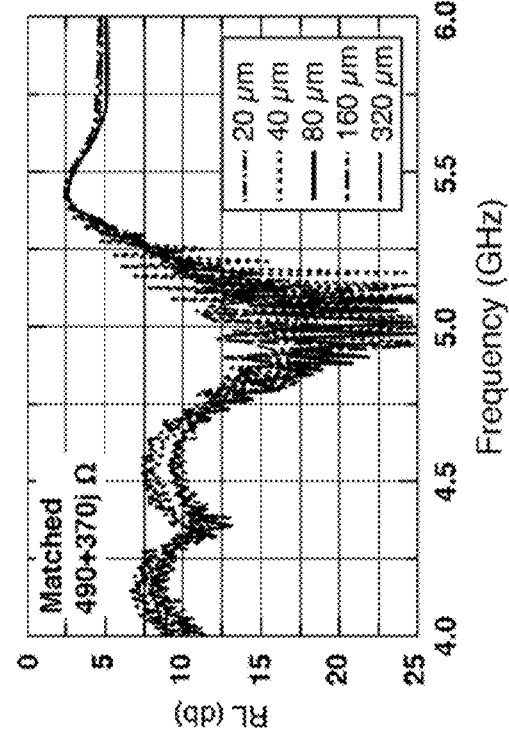
FIGS. 31A-31D are a set of graphs illustrating the measured S-parameters of the A1 ADLs in Group A (N=4, $\lambda$=2.4 µm) with identical transducers but different $L_g$(20-320 µm) according to one embodiment.
Figure 31B:
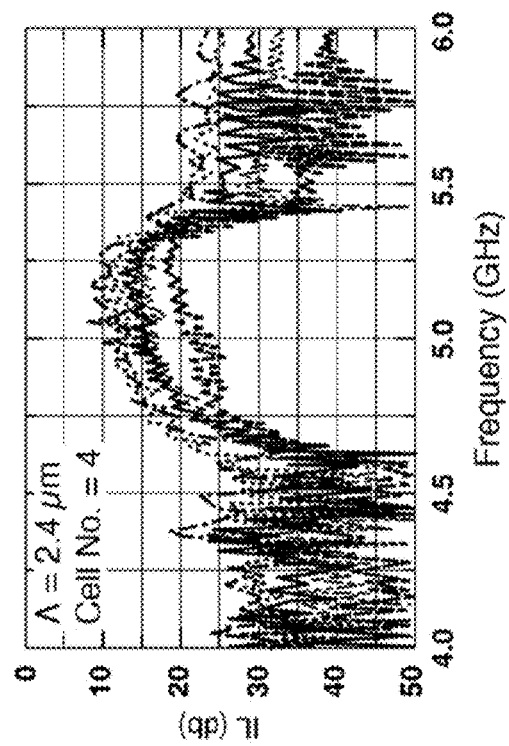
Figure 31C:
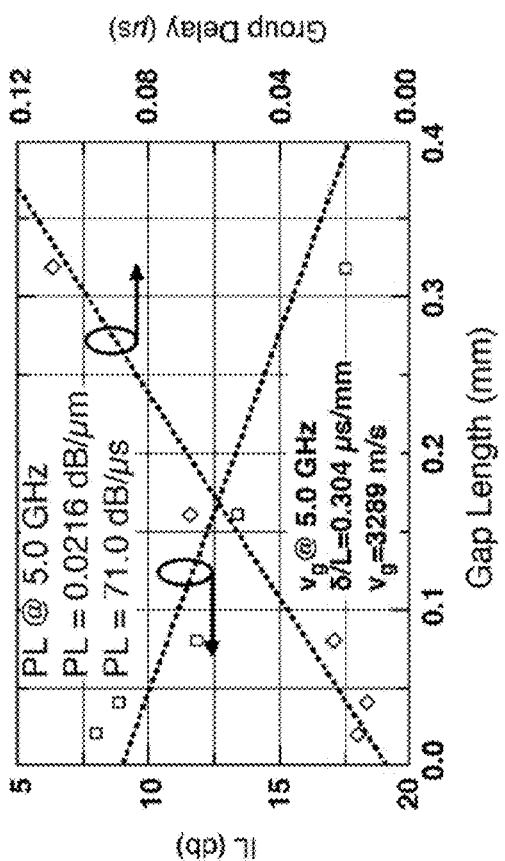
Figure 31D:
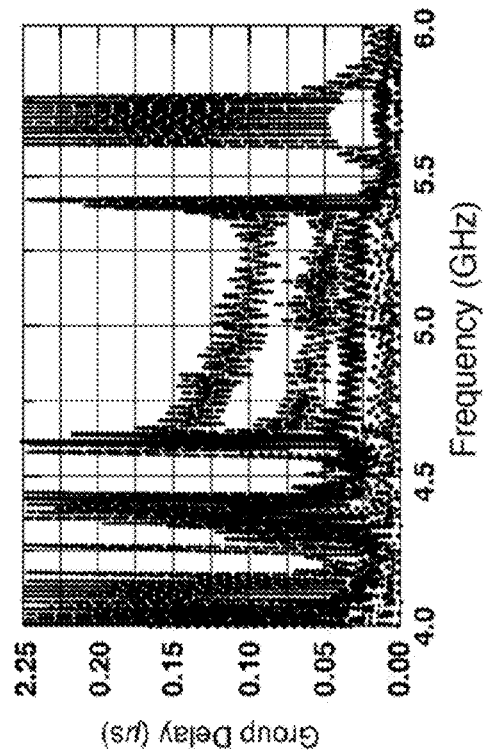

FIGS. 31A-31D are a set of graphs illustrating the measured S parameters of the A1 ADLs in Group A (N=4, λ=2.4 μm) with identical transducers but different $L_g$ (20-320 μm) according to one embodiment. FIG. 31A illustrates the IL, FIG. 31B illustrates the RL, and FIG. 31C illustrates the group delay responses. FIG. 31D illustrates the extracted propagation loss (71 dB/μs), and group velocity (3289 m/s) of A1 at 5.0 GHz. The fabricated ADLs were first measured with a vector network analyzer (VNA) at the −10 dBm power level in air, and then conjugately matched using ADS. ADLs in Group A (N=4, =2.4 µm, $L_g$=20-320 µm) are designed for showcasing A1 ADL operation and demonstrating long delays. The measured IL and RL are shown in FIG. 31A and FIG. 31B with the ports conjugately matched. The ADLs show a passband centered at 5.0 GHz. A minimum IL of 7.94 dB and an FBW around 6% have been achieved for the ADL with a 20 µm gap length. Delays between 15 ns to 109 ns are measured. An increase in IL is observed for longer ADLs, which is caused by the PL of A1 in the $LiNbO_3$ waveguide. Larger transmission can be observed out of the passband band for shorter devices, which is likely caused by the capacitive feedthrough between the bus lines and the probing pads. Ripples caused by the multi-reflection between ports and the internal reflections in the transducers can be seen in the passband. Larger RL out of the passband is observed, due to the series resistance in the electrodes. The non-propagating modes can be observed below the cut-off frequency in FIG. 31A, but they are significantly damped by PL as seen in FIG. 31B. Dispersive group delays are observed for different devices, showing longer delays near the cut-off frequency. A1 propagation characteristics are extracted from the dataset, showing a PL of 71 dB/µs (or 0.0216 dB/µm), and $v_g$ of 3289 m/s 5.0 GHz.

Figure 32A:
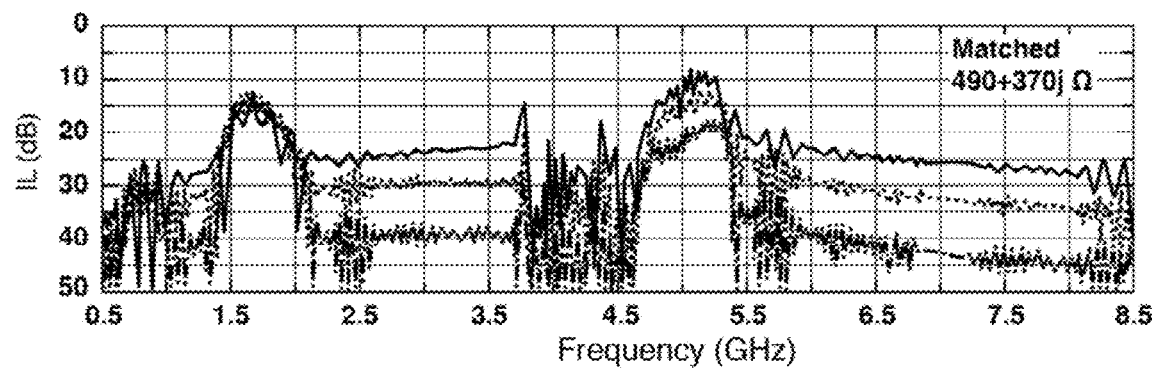
FIGS. 32A-32C are a set of graphs illustrating the measured wideband performance of the devices in Group A according to one embodiment.
Figure 32B:
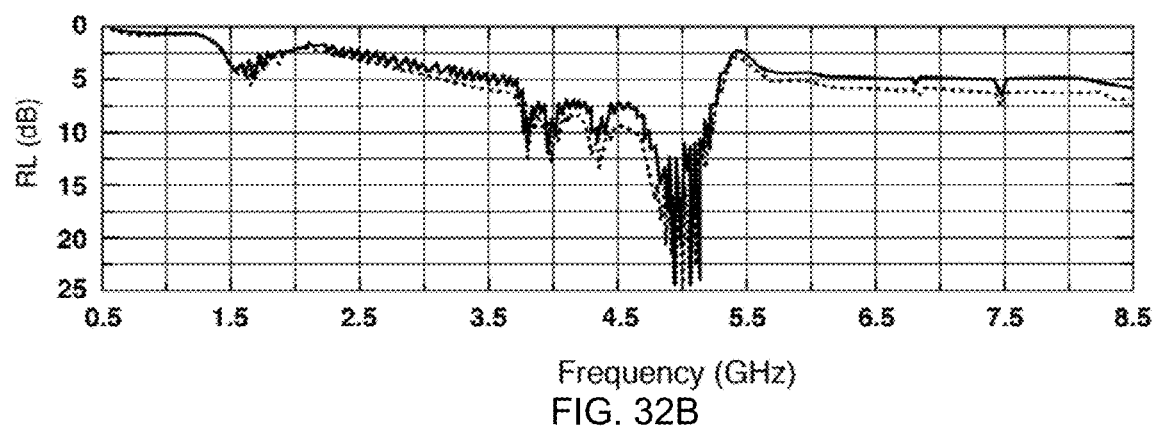
Figure 32C:
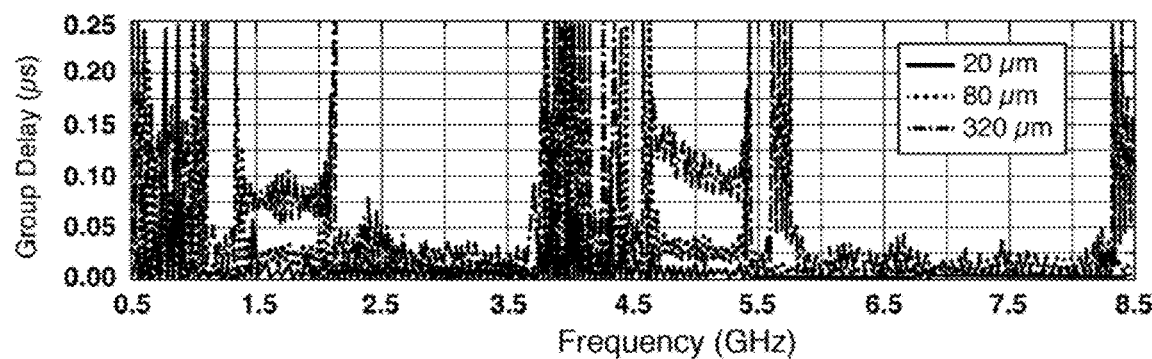

FIGS. 32A-32C are a set of graphs illustrating the measured wideband performance of the devices in Group A according to one embodiment. FIG. 32A illustrates the IL, FIG. 32B illustrates the RL, and FIG. 32C illustrates the group delay. The wideband performance of A1 ADLs is also presented. The cut-off can be identified below the $f_{c\_open}$ around 4.4 GHz where the onset of larger IL occurs. Three out-of-band (OOB) resonances are present at 3.7 GHz, 3.9 GHz, and 4.3 GHz, as predicted in FIG. 54. An A0 passband at 0.8 GHz and an SH0 passband at 1.6 GHz are also measured, consistent with simulations in FIG. 28. Different group delays are observed in the A1 and SH0 passbands as A1 is slower than SH0 in this frequency range. This validates that A1 features low $v_g$ and high $v_v$ simultaneously, promising compact device sizes while maintaining large feature sizes at 5 GHz.

Figure 33A:
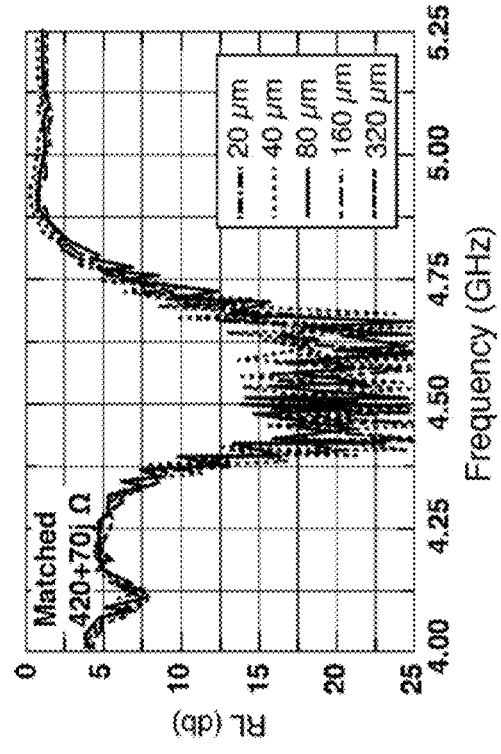
FIGS. 33A-33D are a set of graphs illustrating the measured S-parameters of the A1 ADLs in Group B (N=4, $\lambda$=3.2 µm) with identical transducers but different $L_g$(20-320 µm) according to one embodiment.
Figure 33B:
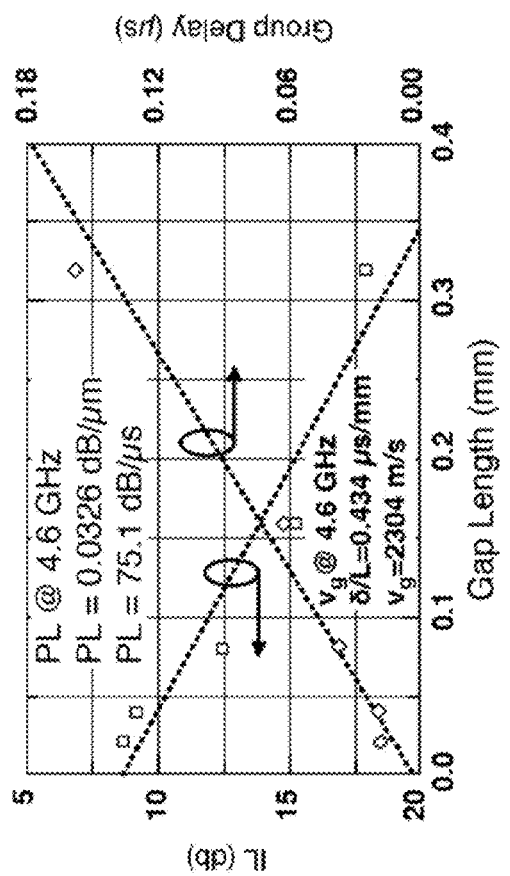
Figure 33C:
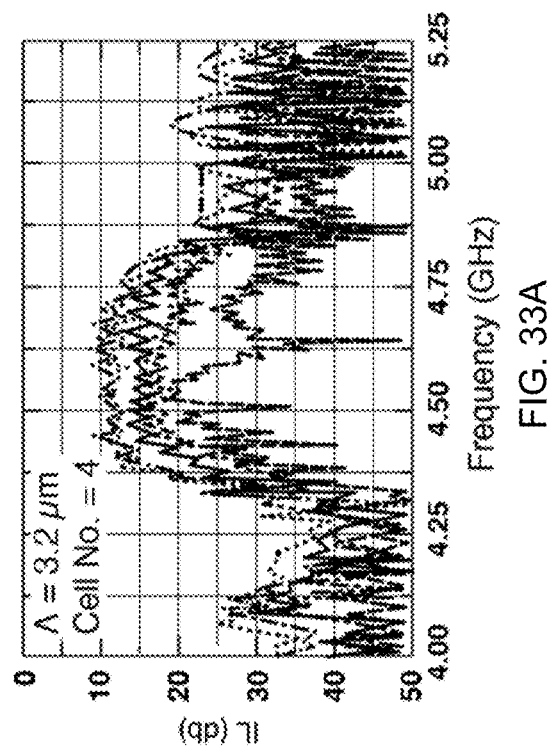
Figure 33D:
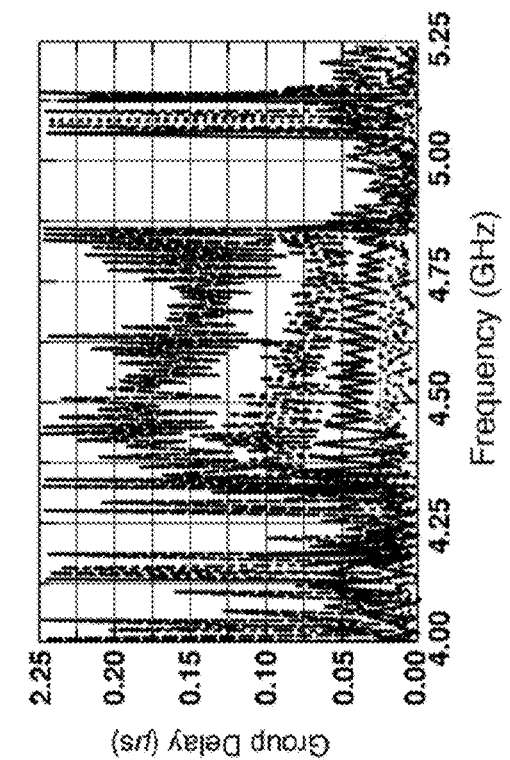

FIGS. 33A-33D are a set of graphs illustrating the measured S parameters of the A1 ADLs in Group B (N=4, λ=3.2 µm) with identical transducers but different $L_g$(20-320 µm) according to one embodiment. FIG. 33A illustrates the IL, FIG. 33B illustrates the RL, and FIG. 33C illustrates the group delay responses. FIG. 33D illustrates the extracted propagation loss (75.1 dB/µs), and group velocity (2304 m/s) of A1 at 4.6 GHz. ADLs in Group B (λ=3.2 µm), Group C (λ=2.8 µm), and Group D (λ=2.0 µm) are designed for investigating the impact of the cell length on the center frequency. In each group, devices with gap length between 20 and 320 µm are implemented. Devices are measured at −10 dBm in air and conjugately matched. For devices in Group B, a minimum IL of 8.71 dB and a center frequency of 4.6 GHz are obtained. The extracted PL is 75.1 dB/µs (or 0.0326 dB/µm), and $v_g$ of 2304 m/s for A1 at 4.6 GHz.

Figure 34A:
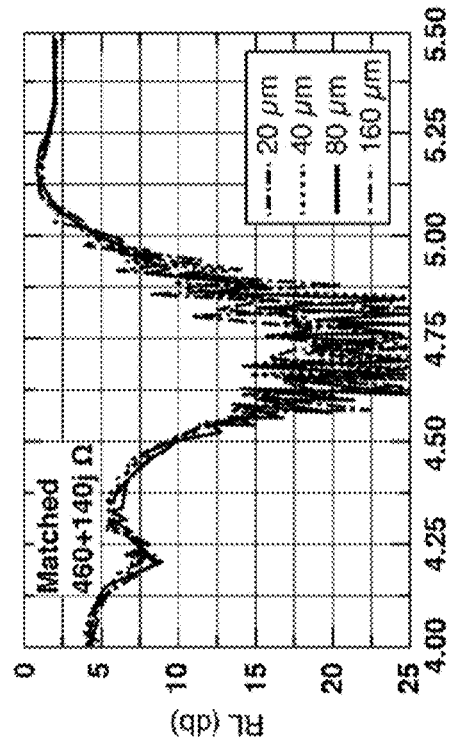
FIGS. 34A-34D are a set of graphs illustrating the measured S-parameters of the A1 ADLs in Group C (N=4, $\lambda$=2.8 µm) with identical transducers but different $L_g$ (20-160 µm) according to one embodiment.
Figure 34B:
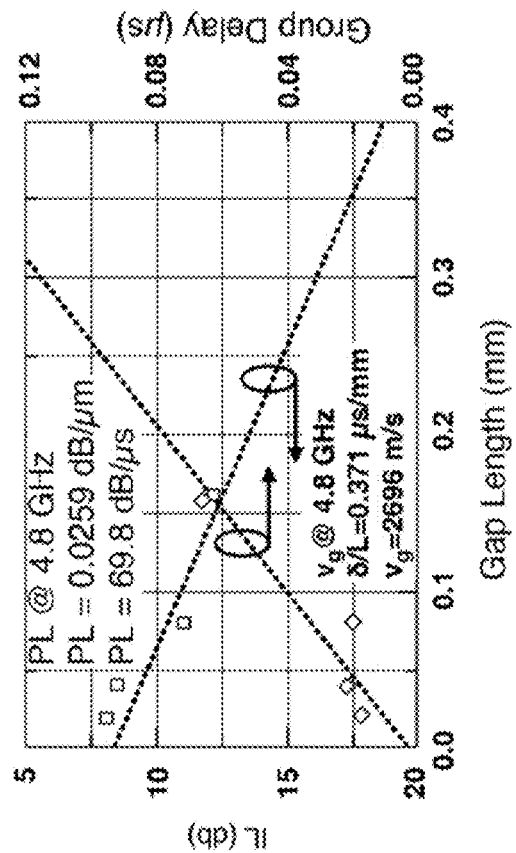
Figure 34C:
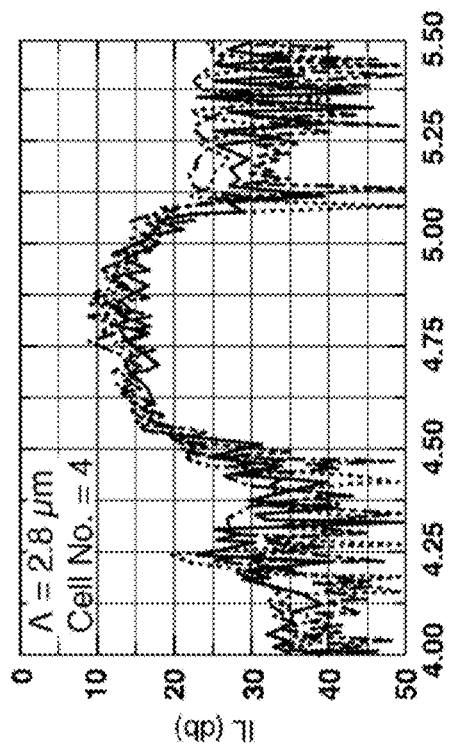
Figure 34D:
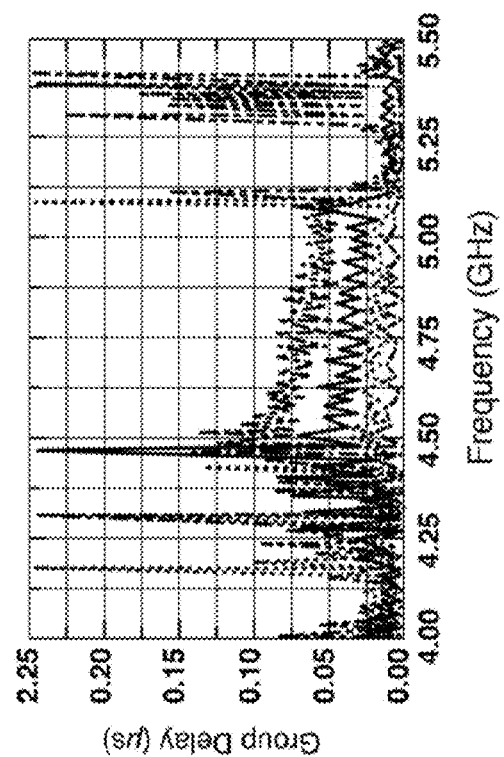

FIGS. 34A-34D are a set of graphs illustrating the measured S-parameters of the A1 ADLs in Group C (N=4, λ=2.8 µm) with identical transducers but different $L_g$ (20-160 µm) according to one embodiment. FIG. 34A illustrates the IL, FIG. 34B illustrates the RL, and FIG. 34C illustrates the group delay responses. FIG. 34D illustrates the extracted propagation loss (69.8 dB/µs), and group velocity (2696 m/s) of A1 at 4.8 GHz. For devices in Group C, a minimum IL of 8.04 dB and a center frequency of 4.8 GHz are obtained. The extracted PL is 69.8 dB/µs (or 0.0259 dB/µm), and $v_g$ of 2696 m/s for A1 at 4.8 GHz.

Figure 35A:
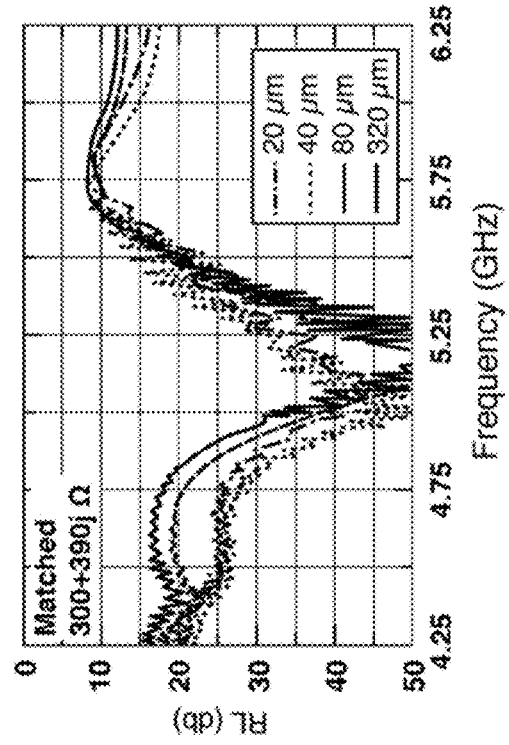
FIGS. 35A-35D are a set of graphs illustrating the measured S-parameters of the A1 ADLs in Group D (N=4, $\lambda$=2.0 µm) with identical transducers but different $L_g$(20-320 µm) according to one embodiment.
Figure 35B:
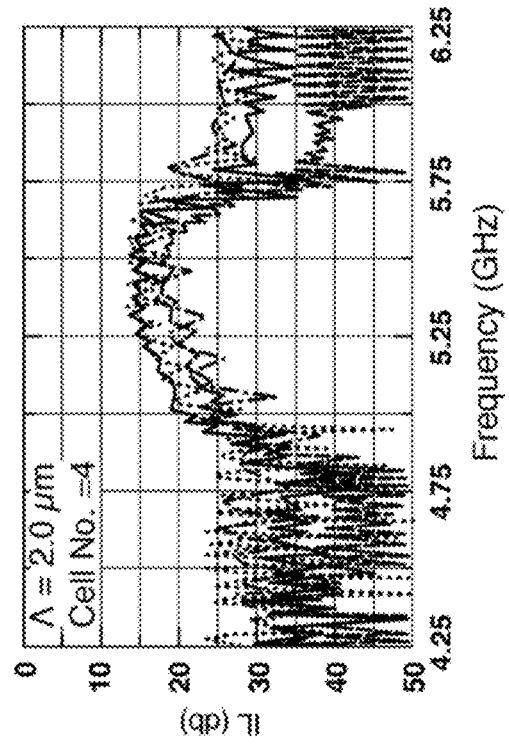
Figure 35C:
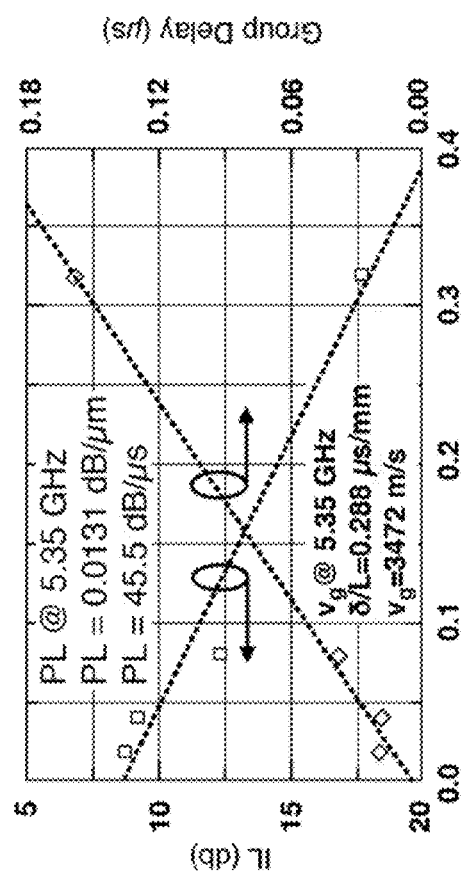
Figure 35D:
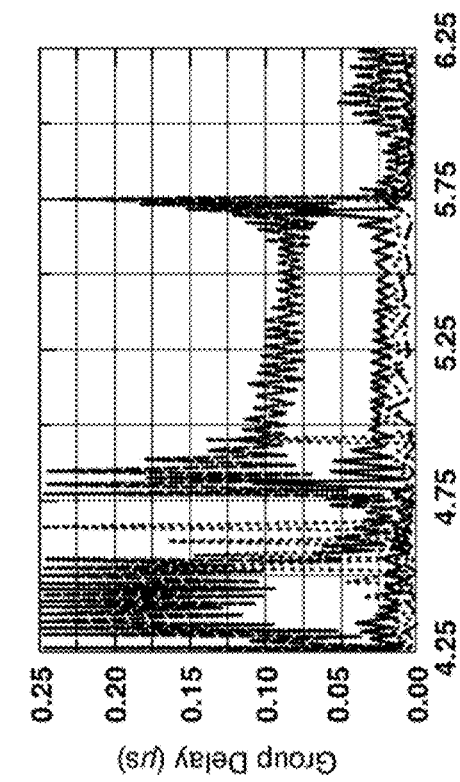

FIGS. 35A-35D are a set of graphs illustrating the measured S-parameters of the A1 ADLs in Group D (N=4, λ=2.0 µm) with identical transducers but different $L_g$(20-320 µm) according to one embodiment. FIG. 35A illustrates the IL, FIG. 35B illustrates the RL, and FIG. 35C illustrates the group delay responses. FIG. 35D illustrates the extracted propagation loss (45.5 dB/µs), and group velocity (3472 m/s) of A1 at 5.35 GHz. For devices in Group D a minimum IL of 8.71 dB and a center frequency of 5.35 GHz are measured. The extracted PL is 45.5 dB/µs (or 0.0131 dB/µm), and $v_g$ of 3472 m/s for A1 at 5.35 GHz.

Comparing the performance between ADLs from different groups, devices with larger cell lengths have lower center frequencies. However, unlike S0 and SH0, the A1 center frequency does not scale inversely to the cell length due to the dispersive nature of A1. Moreover, higher frequency devices tend to have flatter group delays in the passband, which are consistent with FIG. 24.

Figure 36A:
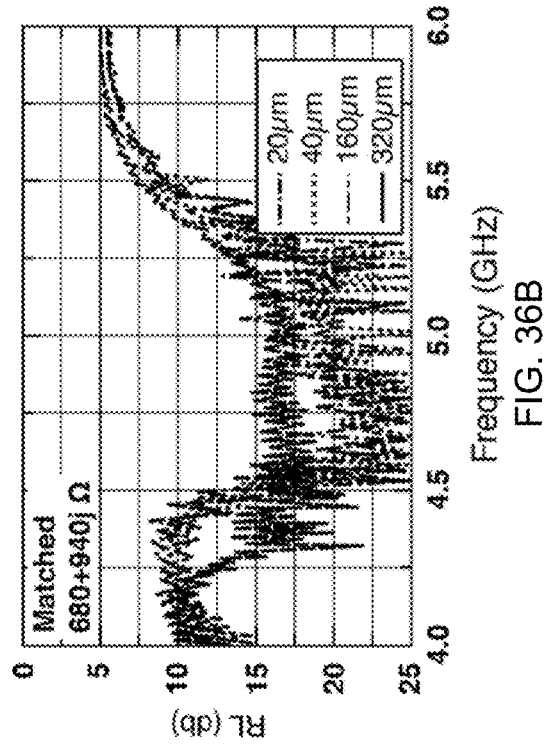
FIGS. 36A-36D are a set of graphs illustrating the measured S-parameters of the ADLs in Group E (N=2, $\lambda$t=2.4 µm) with identical transducers but different $L_g$ (20-320 µm) according to one embodiment.
Figure 36B:
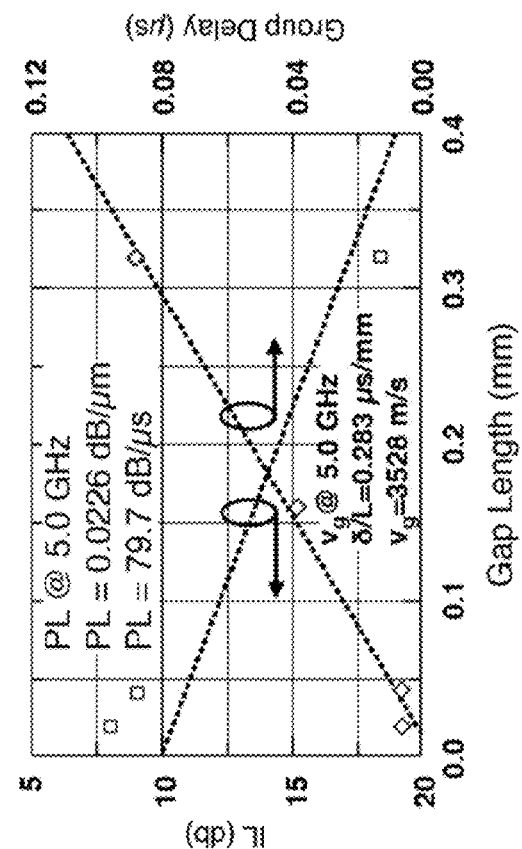
Figure 36C:
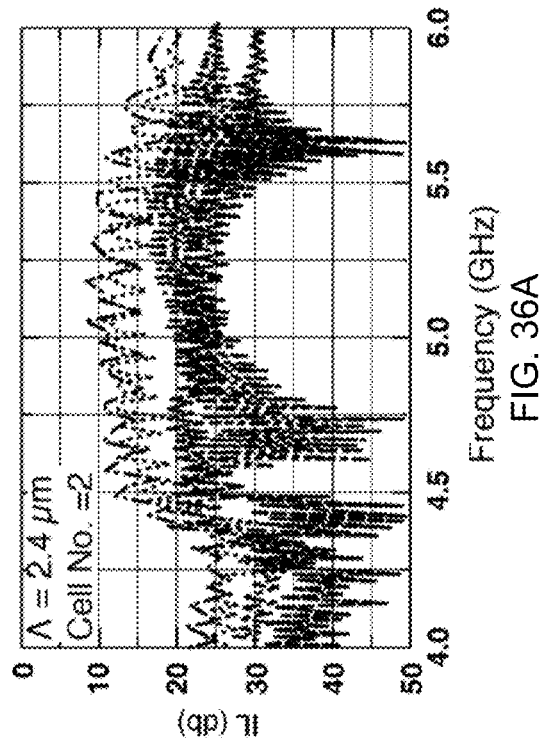
Figure 36D:
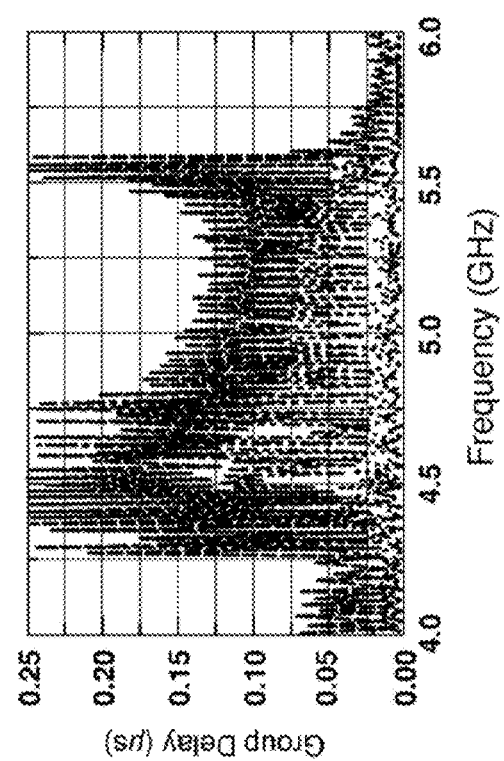

FIGS. 36A-36D are a set of graphs illustrating the measured S-parameters of the ADLs in Group E (N=2, λ=2.4 µm) with identical transducers but different $L_g$ (20-320 µm) according to one embodiment. FIG. 36A illustrates the IL, FIG. 36B illustrates the RL, and FIG. 36C illustrates the group delay responses. FIG. 36D illustrates the extracted propagation loss (79.7 dB/µs), and group velocity (3528 m/s) at 5 Hz. ADLs in Group E (N=2, =2.4 µm, $L_g$=20-320 µm) are designed for investigating the impact of cell numbers on the bandwidth via comparison with Group A. The passband is not symmetrical with larger IL shown below $f_{c\_open}$ due to the cut-off. For devices in Group D, a minimum IL of 7.94 dB and a center frequency of 5.0 GHz are obtained (FIG. 34). The extracted PL is 79.73 dB/µs (or 0.0226 dB/µm), and $v_g$ is 3528 m/s at 4.8 GHz. The data in Group D will be used to extract the wideband PL and $v_g$ for A1 ADLs.

Figure 37A:
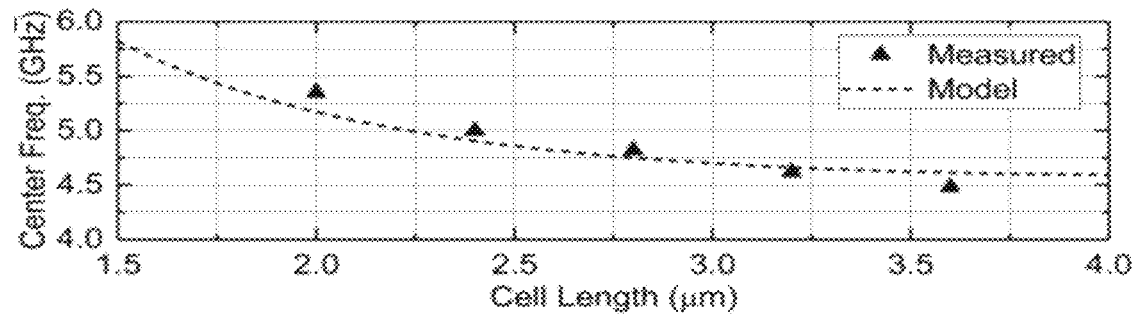
FIGS. 37A-37C are a set of graphs illustrating extracted parameters of an A1 ADLs according to one embodiment.
Figure 37B:
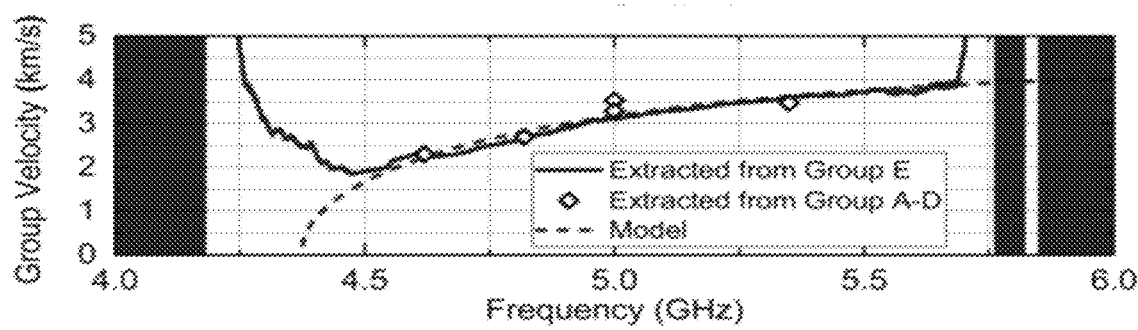
Figure 37C:
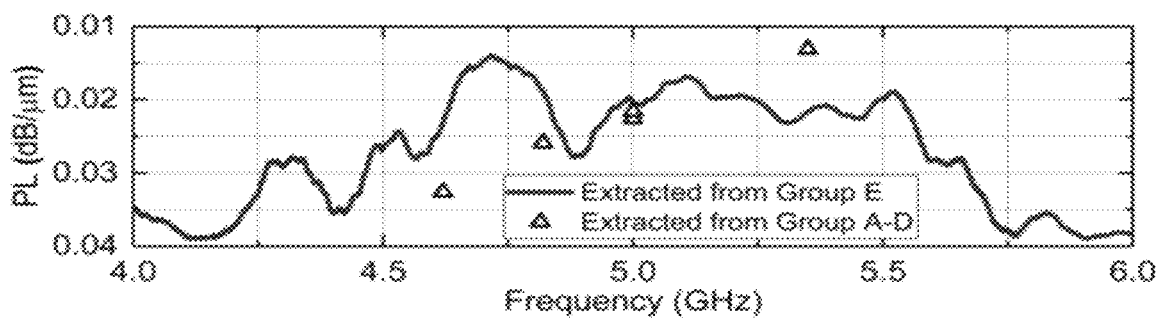

FIGS. 37A-37C are a set of graphs illustrating extracted parameters of A1 ADLs according to one embodiment. FIG. 37A illustrates the center frequencies of different devices in comparison to the calculated values. FIG. 37B illustrates the wideband group delay extracted from Groups A-E in comparison with FEA. FIG. 37C illustrates the extracted PL from Groups A-E. The extracted propagation parameters of different ADLs are presented in Table 4 below, and plotted in FIG. 37D.

TABLE 4

EXTRACTED A1 MODE PROPAGATION CHARACTERISTICS

| | | Group Velocity | | PL | |
|---|---|---|---|---|---|
| Index | $f_{center}$ (GHz) | $v_g$ (m/s) | Delay/ length (µs/mm) | PL/ length (dB/µm) | PL/ delay (dB/µs) |
| Group A | 5.0 | 3289 | 0.304 | 0.0216 | 71.0 |
| Group B | 4.6 | 2304 | 0.434 | 0.0326 | 75.1 |
| Group C | 4.8 | 2696 | 0.371 | 0.0259 | 69.8 |
| Group D | 5.35 | 3472 | 0.288 | 0.0131 | 45.5 |
| Group E | 5.0 | 3528 | 0.283 | 0.0226 | 79.7 |

First, the center frequencies $f_{center}$ of different groups are plotted in FIG. 37A, and compared to that calculated using the approach described in reference to FIG. 23. A good agreement is obtained between the measurement and the model, with the slight difference likely caused by the approximations in the model. Second, the extracted group velocity is presented in FIG. 37B. The values obtained from the center frequencies of different groups are plotted using the scattered points. The wideband performance obtained from Group E is also extracted using least square fitting at each frequency point in FIG. 37C. The FEA results (FIGS. 24A-24D) are also plotted in the FIG. 37C, showing great agreement with measured data. The extracted group velocity validates the cut-off. Finally, PL at different frequencies is plotted in FIG. 36C. Similarly, PL from different groups and the wideband PL from Group E are plotted. Interestingly, smaller PL per distance is observed at higher frequencies. This may be investigated in future studies where the passband ripples are suppressed through unidirectional transducers. In further embodiments, lower IL devices with less pronounced ripples in the passband can be expected.

FIGS. 38A-38C are a set of graphs illustrating extracted parameters of an A1 ADL with SPUDTs according to one embodiment. For example, the ADL of interest depicted by FIGS. 38A-38C can be an example of the ADL 200b of FIG. 2B and/or the ADL depicted in FIGS. 12A-12B. In particular, FIG. 38A is a graph of the IL as a function of frequency, FIG. 38B is a graph of the group delay as a function of frequency, and FIG. 39C is a graph of the S-Parameters as a function of frequency.

Figure 39:
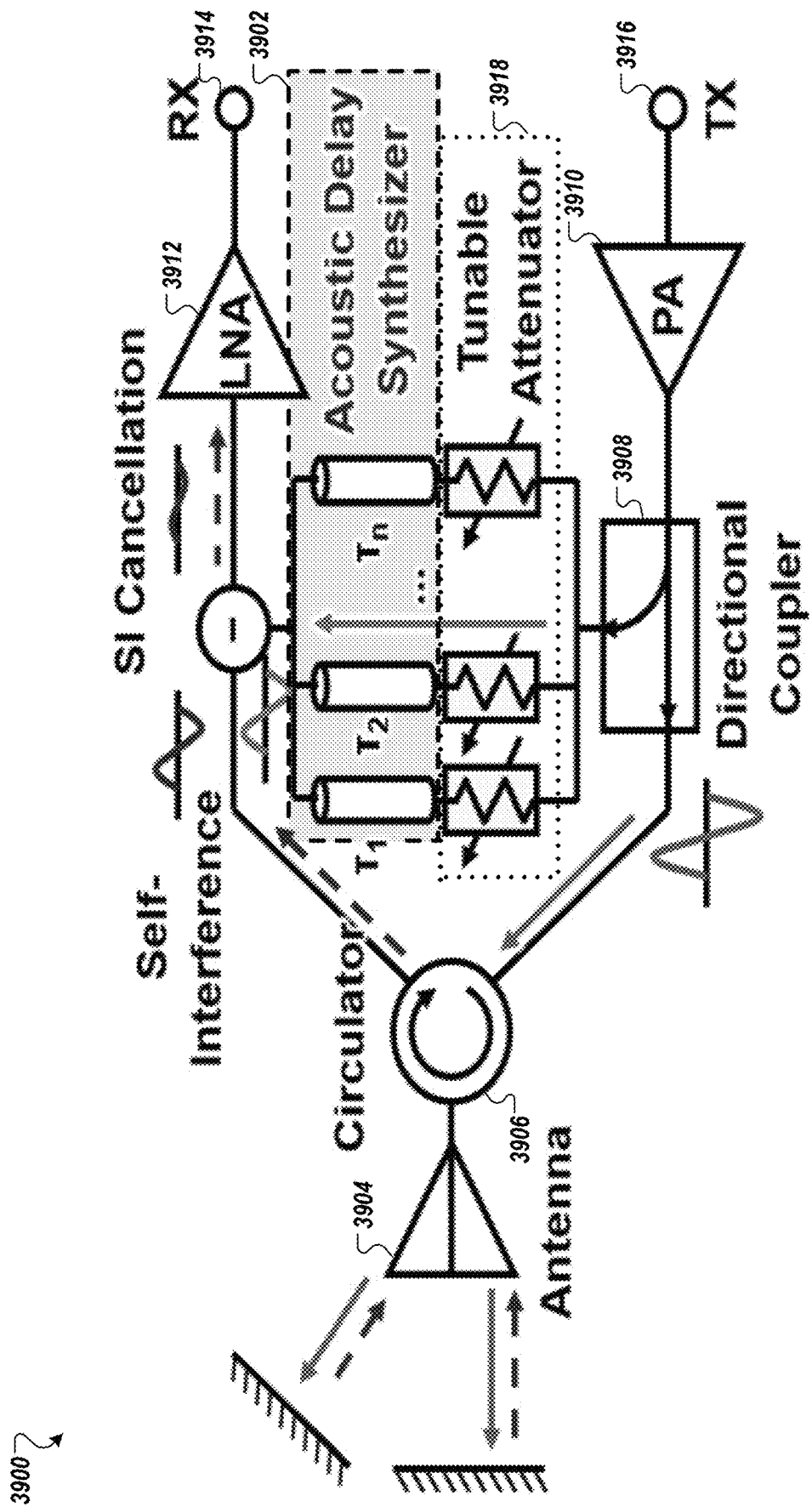
FIG. 39 is a schematic diagram of a full-duplex transceiver with an acoustic delay synthesizer to attain self-interference cancellation (SIC) according to one embodiment.

FIG. 39 is a schematic diagram of a full-duplex transceiver 3900 with an acoustic delay synthesizer 3902 to attain self-interference cancellation (SIC) according to one embodiment. In some embodiments, the full-duplex transceiver 3900 may include an antenna 3904, a circulator 3906, a directional coupler 3908, a power amplifier (PA) 3910, a low noise amplifier (LNA) 3912, a receiver 3914, a transmitter 3916, a tunable attenuator 3918, and the acoustic delay synthesizer 3902. In some embodiments, the acoustic delay synthesizer 3905 may include at least one acoustic delay line (ADL), as disclosed in the various embodiments herein.

ADLs can be useful in implementing full-duplex radios, such as the full-duplex transceiver 3900. One potential challenge for implementing full-duplex radios can include self-interference (SI). Due to the absence of frequency- or time-domain multiplexing, SI can occur when high-power transmitted signals are reflected from antenna packaging or obstacles in the ambiance, and inadvertently received by a highly sensitive receiver, typically after a 0.01-1 μs delay. To reduce the SI, e.g., attain SI cancellation (SIC), one approach can be to provide wideband time-domain equalization using true-time delays.

In such a method, a fraction of the transmitted signal is sent into a time-domain equalizer that emulates the channel transfer function of the SI before it is combined with the SI to render cancellation through destructive interference. To accommodate the dynamic in-field conditions, such a system is typically required to provide reconfigurable delays and tunable attenuations. The challenge with such a method is that, although chip-scale tunable attenuation is attainable, miniature delay synthesis over a sufficiently wide bandwidth (BW) and a necessary delay range remains inaccessible. The unavailability of wide-range delay synthesis originates from the fact that the electromagnetic (EM) delay lines in the existing prototypes can hardly provide delays of more than 1 ns on chip-scale due to the fast group velocities of EM waves in state-of-the-art slow-wave waveguide-related structures. Therefore, EM-based delay synthesis is inadequate for enabling full-duplex in urban environments with dense reflectors (e.g., moving vehicles and buildings). Moreover, the dynamic range of EM-based SIC is also limited.

The minimum insertion loss (IL) in the cancellation path is required to be no larger than that in the free space. However, the intrinsically high propagation loss (PL) in the EM delay lines leads to high IL. Moreover, the additional IL from the directional coupler strengthens the requirement of IL, which is challenging for the EM delay lines.

In some embodiments, the full-duplex transceiver 3900 can also be referred to as a full-duplex radio. A full-duplex radio can transmit and receive signals in the same frequency band simultaneously. The full-duplex transceiver 3900 includes transmit (TX) chain circuitry and receive (RX) chain circuitry. The TX chain circuitry includes at least the directional coupler 3908, the PA 3910, and the transmitter 3916. The RX chain circuitry includes at least the LNA 3912 and the receiver 3914. The TX chain circuitry transmits a first RF signal in a first frequency range via the antenna 3904. The RX chain circuitry receives a second RF signal in the first frequency range via the antenna 3904. The TX chain circuitry can further include the directional coupler 3908, which directs a portion of the first RF signal (e.g., that is transmitted) to the RX chain circuitry. The acoustic delay synthesizer 3902 includes a set of ADLs and is coupled between the TX chain circuitry and the RX chain circuitry in order to provide a signal delay. In other words, the acoustic delay synthesizer 3902 provides a delay to the portion of the first RF signal to the RX chain circuitry such that the first RF signal experiences the signal delay and destructively interferes with a reflected portion of the first RF signal.

As described above, in an ADL, radio frequency (RF) signals are first converted into the acoustic domain by transducers on one end of the ADL via piezoelectricity. The signals can then propagate as acoustic waves and experience the designed delay before they are turned back into electrical signals by transducers on the other end. In some embodiments, RF ADLs may be realized using surface acoustic waves (SAW) technologies due to their compact sizes and easy fabrication processes. ADLs can be used to enable time delays, filtering, and correlation for improving the signal-to-noise ratios in radar front ends. ADLs can also be used for various sensing applications and the construction of nonreciprocal networks. SAW ADLs may not provide sufficiently low IL and wide BW simultaneously for self-interference cancelation (SIC) applications even when custom-designed unidirectional transducers are adopted. Such a performance limit can arise from the intrinsic tradeoff between the IL and fractional BW (FBW), which can be fundamentally imposed by the attainable reflectivity of the distributed reflectors and the maximum electromechanical coupling ($k^2$) of the SAW modes. In addition, the transducer-induced SAW scattering into the substrate may further exacerbate the PL of the SAW and the tradeoff between IL and delay. To work toward an acoustic delay synthesizer, the fundamental performance bounds may be considerably lifted by resorting to a new piezoelectric platform with higher coupling, larger available reflectivity, and better-confined wave-guiding at the same time, as will be described in the following embodiments and in more detail with reference to the various figures.

In some embodiments, longitudinally vibrating modes in thin-film lithium niobate ($LiNbO_3$), namely, the fundamental shear horizontal (SH0) mode and fundamental symmetrical (S0) mode, can be utilized in ADL structures for their simultaneously large $k^2$ and low loss. The large coupling can be harnessed to widen the BW of ADLs, while the confined waveguide within a suspended $LiNbO_3$ thin film can lower PL and thus also lower IL. Moreover, reflectors on a suspended thin film can provide more substantial reflections in comparison to the same type of reflectors on a SAW structure, which can further improve the tradeoff between IL and BW.

Such longitudinally vibrating modes can be used for the acoustic delay synthesizer 3902 of the full-duplex transceiver 3900. The acoustic delay synthesizer includes a set of ADLs. Each of the ADLs can include Z-cut $LiNbO_3$ piezoelectric thin film, a first IDT, and a second IDT. The piezoelectric thin film is located above a carrier substrate. The piezoelectric thin film is adapted to propagate an acoustic wave in at least one of a first mode excited by an electric field oriented in a longitudinal direction along a length of the piezoelectric thin film or a second mode excited by the electric field oriented at least partially in a thickness direction of the piezoelectric thin film. The first IDT is disposed on a first end of the piezoelectric thin film and converts a first electromagnetic signal, which is traveling in the longitudinal direction, into the acoustic wave. The second IDT is disposed on a second end of the piezoelectric thin film. There is a gap between the second IDT and the first IDT. The second IDT converts the acoustic wave into a second electromagnetic signal. In some embodiments, the first mode can be one of an S0 mode, an Si mode, or an SH0 mode and the second mode can include one of a fundamental symmetric (S0) mode, a first-order symmetric (Si) mode, or a higher-order Lamb-wave mode.

In summary, A1 ADLs at 5 GHz in $LiNbO_3$ thin films may offer the fast phase velocity, significant coupling coefficient, and low-loss of A1. In some embodiments, the demonstrated ADLs significantly surpass the state of the art with similar feature sizes in center frequency. The propagation characteristics of A1 in $LiNbO_3$ are analyzed and modeled with FEA before the designs of A1 ADLs are studied and composed. The implemented ADLs at 5 GHz show a minimum insertion loss of 7.94 dB and a fractional bandwidth of 6%. The design variations show delays ranging between 15 ns to 109 ns and the center frequencies between 4.5 GHz and 5.25 GHz. From these measured devices, the propagation characteristics of A1 are extracted and shown matching the analysis. In further embodiments, the A1 ADLs can lead to wide-band and high-frequency signal processing functions for 5G applications.

Figure 40:
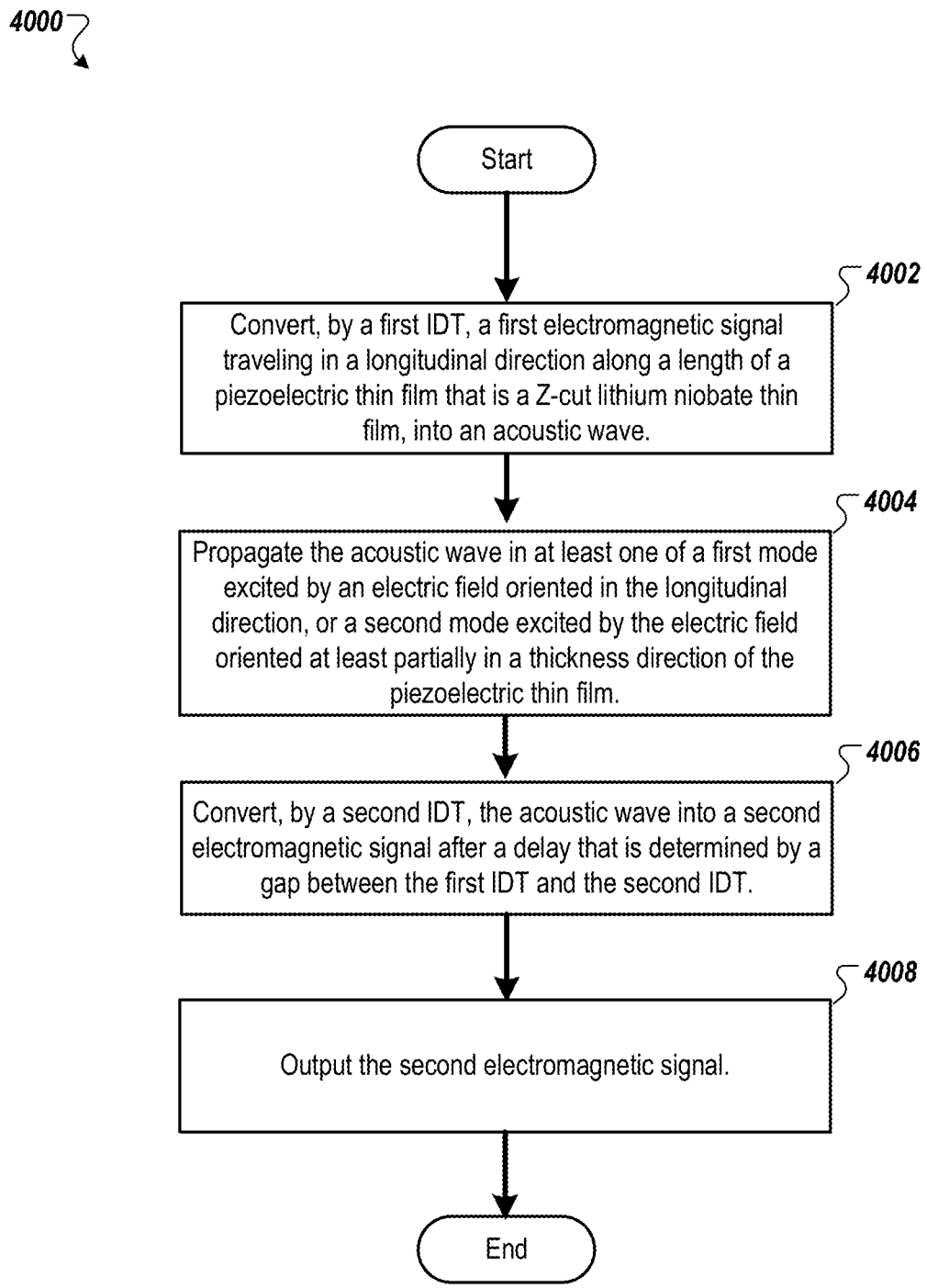
FIG. 40 is a flow diagram of a method of the operation of an ADL according to one embodiment.

FIG. 40 is a flow diagram of a method 4000 of the operation of an ADL according to one embodiment. In one embodiment, the method 4000 is performed by processing logic coupled to or included within an ADL, such as the ADL 4000 described herein. In one embodiment, the ADL can be a Z-cut lithium niobate thin film.

Referring to FIG. 40, at operation 4002, the method 4000 includes converting, by a first interdigitated transducer (IDT) disposed on a first end of a piezoelectric thin film, a first electromagnetic signal traveling in a longitudinal direction along a length of the piezoelectric thin film into an acoustic wave. The piezoelectric thin film is a Z-cut lithium niobate ($LiNbO_3$) thin film located above a carrier substrate. At operation 4004, the method 4000 includes propagating the acoustic wave in at least one of: a first mode excited by an electric field oriented in the longitudinal direction; or a second mode excited by the electric field oriented at least partially in a thickness direction of the piezoelectric thin film. At operation 4006, the method 4000 includes converting, by a second IDT disposed on a second end of the piezoelectric thin film, the acoustic wave into a second electromagnetic signal after a delay determined by a gap between the first IDT and the second IDT. At operation 4008, the method 4000 includes outputting the second electromagnetic signal.

In further embodiments, the first mode is one of a first-order antisymmetric (A1) mode, a fundamental shear-horizontal (SH0) mode, a third-order antisymmetric (A3) mode, or a second-order symmetric (S2) mode. The second mode can include one of a fundamental symmetric (S0) mode, a first-order symmetric (S1) mode, or a higher-order Lamb-wave mode. In still further embodiments, a voltage potential can be applied across a signal line coupled to the first IDT to generate the electric field.

The words "example" or "exemplary" are used herein to mean serving as an example, instance, or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims may generally be construed to mean "one or more" unless specified otherwise or clear from context to be directed to a singular form. Moreover, use of the term "an implementation" or "one implementation" or "an embodiment" or "one embodiment" or the like throughout is not intended to mean the same implementation or implementation unless described as such. One or more implementations or embodiments described herein may be combined in a particular implementation or embodiment. The terms "first," "second," "third," "fourth," etc. as used herein are meant as labels to distinguish among different elements and may not necessarily have an ordinal meaning according to their numerical designation.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:
1. An apparatus comprising:
a piezoelectric thin film located above a carrier substrate, wherein the piezoelectric thin film is a Z-cut lithium niobate ($LiNbO_3$) thin film adapted to propagate an acoustic wave in at least one of:
a first mode excited by an electric field oriented in a longitudinal direction along a length of the piezoelectric thin film; or
a second mode excited by the electric field oriented at least partially in a thickness direction of the piezoelectric thin film;
a first interdigitated transducer (IDT) disposed on a first end of the piezoelectric thin film, the first IDT to convert a first electromagnetic signal, traveling in the longitudinal direction, into the acoustic wave; and
a second IDT disposed on a second end of the piezoelectric thin film with a gap between the second IDT and the first IDT, the second IDT to convert the acoustic wave into a second electromagnetic signal, and the gap to determine a time delay of the acoustic wave before output of the second electromagnetic signal, wherein the first IDT and the second IDT are bi-directional transducers.

2. The apparatus of claim 1, wherein the first mode is one of a first-order antisymmetric (A1) mode, a fundamental shear-horizontal (SH0) mode, a third-order antisymmetric (A3) mode, or a second-order symmetric (S2) mode.

3. The apparatus of claim 1, wherein the second mode is one of a fundamental symmetric (S0) mode, a first-order symmetric (S1) mode, or a higher-order Lamb-wave mode.

4. The apparatus of claim 1, wherein the piezoelectric thin film is suspended above the carrier substrate.

5. The apparatus of claim 1, wherein the piezoelectric thin film is disposed on a high acoustic impedance layer interposed between the piezoelectric thin film and the carrier substrate, the high acoustic impedance layer comprising at least one of silicon (Si), sapphire, fused silica, quartz, silicon carbide (SiC), diamond, aluminum nitride (AlN), or aluminum oxide ($Al_2O_3$), tungsten, molybdenum, platinum, or combinations thereof.

6. The apparatus of claim 1, wherein the piezoelectric thin film is disposed on a combination of a plurality of high acoustic impedance layers and a plurality of low acoustic impedance layers interposed between the piezoelectric thin film and the carrier substrate.

7. The apparatus of claim 6, wherein respective ones of the plurality of the low acoustic impedance layers are alternately disposed on respective ones of the plurality of high acoustic impedance layers.

8. The apparatus of claim 1, further comprising:
a waveguide inside of which is disposed the piezoelectric thin film, the first IDT, and the second IDT;
a first port coupled to the first IDT, the first port to receive the first electromagnetic signal; and
a second port coupled to the second IDT, the second port to output the second electromagnetic signal.

9. The apparatus of claim 8, wherein the first IDT comprises at least a transducer unit cell comprising:
a ground line coupled to the first port;
a first transduction electrode coupled to the ground line of the first port;
a signal line coupled to the first port;
a second transduction electrode coupled to the signal line; and
a floating top electrode disposed between the ground line and the signal line, the floating top electrode being an embedded acoustic reflector.

10. The apparatus of claim 9, wherein the first transduction electrode and the second transduction electrode have a first width and the floating top electrode has a second width, wherein the second width is between 65 percent and 120 percent greater than the first width.

11. The apparatus of claim 10, wherein a distance between a center of the first transduction electrode and a center of the second transduction electrode is greater than the width and less than twice the width.

12. A full-duplex radio comprising:
an antenna to transmit a first radio frequency (RF) signal in a first frequency range and receive a second RF signal at the first frequency range;
transmit (TX) chain circuitry coupled to the antenna;
receive (RX) chain circuitry coupled to the antenna, wherein the RX chain circuitry receives the second RF signal and a reflected portion of the first RF signal;
a directional coupler in the TX chain circuitry, the directional coupler to direct a portion of the first RF signal to the RX chain circuitry; and a plurality of acoustic delay lines (ADLs) coupled between the TX chain circuitry and the RX chain circuitry to provide a signal delay, wherein the portion of the first RF signal experiences the signal delay and destructively interferes with the reflected portion of the first RF signal, an insertion loss of the plurality of ADLs is no larger than that of free space, and wherein each ADL of the plurality of ADLs comprises:
a piezoelectric thin film located above a carrier substrate, wherein the piezoelectric thin film is a Z-cut lithium Niobate ($LiNbO_3$) thin film adapted to propagate an acoustic wave;
a first interdigitated transducer (IDT) disposed on a first end of the piezoelectric thin film, the first IDT to convert a first electromagnetic signal, traveling in a longitudinal direction along a length of the piezoelectric thin film, into the acoustic wave; and
a second IDT disposed on a second end of the piezoelectric thin film with a gap between the second IDT and the first IDT, the second IDT to convert the acoustic wave into a second electromagnetic signal, and the gap to determine a time delay of the acoustic wave before output of the second electromagnetic signal.

13. The full-duplex radio of claim 12, further comprising:
a waveguide inside of which is disposed the piezoelectric thin film, the first IDT, and the second IDT;
a first port coupled to the first IDT, the first port to receive the first electromagnetic signal; and
a second port coupled to the second IDT, the second port to output the second electromagnetic signal.

14. The full-duplex radio of claim 13, wherein the first IDT comprises at least a transducer unit cell comprising:
a ground line coupled to the first port;
a first transduction electrode coupled to the ground line of the first port;
a signal line coupled to the first port; and
a second transduction electrode coupled to the signal line.

15. The full-duplex radio of claim 12, wherein the acoustic wave is propagated in at least one of:
a first mode excited by an electric field oriented in a longitudinal direction along a length of the piezoelectric thin film; or
a second mode excited by the electric field oriented at least partially in a thickness direction of the piezoelectric thin film.

16. The full-duplex radio of claim 15, wherein the first mode is one of a first-order antisymmetric (A1) mode, a fundamental shear-horizontal (SH0) mode, a third-order antisymmetric (A3) mode, or a second-order symmetric (S2) mode.

17. The full-duplex radio of claim 15, wherein the second mode is one of a fundamental symmetric (S0) mode, a first-order symmetric (S1) mode, or a higher-order Lamb-wave mode.

18. A method comprising:
converting, by a first interdigitated transducer (IDT) disposed on a first end of a piezoelectric thin film, a first electromagnetic signal traveling in a longitudinal direction along a length of the piezoelectric thin film into an acoustic wave, wherein the piezoelectric thin film is a Z-cut lithium niobate ($LiNbO_3$) thin film located above a carrier substrate;
propagating the acoustic wave in at least one of:
a first mode excited by an electric field oriented in the longitudinal direction; or a second mode excited by the electric field oriented at least partially in a thickness direction of the piezoelectric thin film;

converting, by a second IDT disposed on a second end of the piezoelectric thin film, the acoustic wave into a second electromagnetic signal after a delay determined by a gap between the first IDT and the second IDT, wherein the first IDT and the second IDT are bi-directional transducers; and outputting the second electromagnetic signal.

19. The method of claim 18, wherein the first mode is one of a first-order antisymmetric (A1) mode, a fundamental shear-horizontal (SH0) mode, a third-order antisymmetric (A3) mode, or a second-order symmetric (S2) mode.

20. The method of claim 18, wherein the second mode is one of a fundamental symmetric (S0) mode, a first-order symmetric (S1) mode, or a higher-order Lamb-wave mode.

21. The method of claim 18, further comprising applying a voltage potential across a signal line coupled to the first IDT to generate the electric field.

\* \* \* \* \*